(12) United States Patent
Naito

(10) Patent No.: US 11,031,471 B2
(45) Date of Patent: Jun. 8, 2021

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/846,434

(22) Filed: Apr. 13, 2020

(65) Prior Publication Data

US 2020/0243650 A1 Jul. 30, 2020

Related U.S. Application Data

(63) Continuation of application No. 15/719,597, filed on Sep. 29, 2017, now Pat. No. 10,636,877.

(30) Foreign Application Priority Data

Oct. 17, 2016 (JP) ................................. 2016-203423
Dec. 16, 2016 (JP) ................................. 2016-244925
(Continued)

(51) Int. Cl.
*H01L 29/739* (2006.01)
*H01L 29/10* (2006.01)
(Continued)

(52) U.S. Cl.
CPC ...... *H01L 29/1095* (2013.01); *H01L 27/0664* (2013.01); *H01L 29/0619* (2013.01);
(Continued)

(58) Field of Classification Search
CPC ............... H01L 29/1095; H01L 29/404; H01L 29/4238; H01L 29/42368; H01L 29/0834;
(Continued)

(56) References Cited

U.S. PATENT DOCUMENTS 7,049,657 B2* 5/2006 Matsuda ............. H01L 29/7813
257/333
8,614,478 B2* 12/2013 Mauder ................. H01L 29/407
257/328
(Continued)

FOREIGN PATENT DOCUMENTS

JP 2002353456 A 12/2002
JP 2016157934 A 9/2016
(Continued)

OTHER PUBLICATIONS

U.S. Appl. No. 15/719,597, filed Sep. 29, 2017, to Tatsuya Naito.

*Primary Examiner* — David Vu

(57) ABSTRACT

A semiconductor device is provided, including: a first conductivity-type drift region formed in the semiconductor substrate; a second conductivity-type base region formed between the upper surface of the semiconductor substrate and the drift region; a first conductivity-type accumulation region formed between the drift region and the base region and having a higher doping concentration than the drift region; and a dummy trench portion formed to penetrate the base region from the upper surface of the semiconductor substrate, wherein at least one of the accumulation region and the dummy trench portion has a suppressing structure that suppresses formation of a second conductivity-type inversion layer in a first conductivity-type region adjacent to the dummy trench portion.

14 Claims, 41 Drawing Sheets

(30) Foreign Application Priority Data

May 19, 2017 (JP) ................................. 2017-099415
Aug. 9, 2017 (JP) ................................. 2017-154283

(51) Int. Cl.
| | | |
|---|---|---|
| *H01L 27/06* | (2006.01) | |
| *H01L 29/06* | (2006.01) | |
| *H01L 29/40* | (2006.01) | |
| *H01L 29/423* | (2006.01) | |
| *H01L 29/08* | (2006.01) | |
| *H01L 29/78* | (2006.01) | |
| *H01L 27/07* | (2006.01) | |

(52) U.S. Cl.
CPC ...... *H01L 29/0649* (2013.01); *H01L 29/0653* (2013.01); *H01L 29/0834* (2013.01); *H01L 29/0878* (2013.01); *H01L 29/0886* (2013.01); *H01L 29/404* (2013.01); *H01L 29/407* (2013.01); *H01L 29/4238* (2013.01); *H01L 29/42368* (2013.01); *H01L 29/7397* (2013.01); *H01L 29/7811* (2013.01); *H01L 29/7813* (2013.01); *H01L 27/0727* (2013.01); *H01L 29/063* (2013.01); *H01L 29/7804* (2013.01)

(58) Field of Classification Search
CPC ............. H01L 29/0619; H01L 29/7813; H01L 29/0653; H01L 29/0878; H01L 29/7811; H01L 29/0886; H01L 29/7397; H01L 27/0664; H01L 29/0649; H01L 29/407; H01L 27/0727; H01L 29/063; H01L 29/7804

See application file for complete search history.

(56) References Cited

U.S. PATENT DOCUMENTS

| | | | |
|---|---|---|---|
| 8,659,065 B2 * | 2/2014 | Sumitomo | ........ H01L 29/66348 257/302 |
| 10,103,255 B2 | 10/2018 | Sumitomo | |
| 10,355,082 B2 | 7/2019 | Kudo | |
| 2002/0179976 A1 | 12/2002 | Takahashi | |
| 2008/0012040 A1 | 1/2008 | Saito et al. | |
| 2009/0020852 A1 | 1/2009 | Harada | |
| 2009/0283797 A1 | 11/2009 | Takahashi | |
| 2013/0037853 A1 | 2/2013 | Onozawa | |

FOREIGN PATENT DOCUMENTS

| | | |
|---|---|---|
| WO | 2005109521 A1 | 11/2005 |
| WO | 2011111500 A1 | 9/2011 |

* cited by examiner

SEMICONDUCTOR DEVICE

CROSS-REFERENCE TO RELATED APPLICATIONS

This application is a continuation of U.S. patent application Ser. No. 15/719,597, filed on Sep. 29, 2017, which claims priority to Japanese Patent Applications NO. 2016-203423 filed on Oct. 17, 2016, NO. 2016-244925 filed on Dec. 16, 2016, NO. 2017-099415 filed on May 19, 2017 and NO. 2017-154283 filed on Aug. 9, 2017, each of which is hereby incorporated by reference in its entirety.

BACKGROUND

1. Technical Field

The present invention relates to a semiconductor device.

2. Related Art

Semiconductor devices including an IGBT (Insulated Gate Bipolar Transistor) and the like are known (see Patent Document 1, for example). A dummy trench may be provided in the semiconductor device.

Patent Document 1: WO2005/109521

When the semiconductor device is turned on, a P-type inversion layer may be formed in an N-type region in the vicinity of the bottom portion of the dummy trench. If the P-type inversion layer is formed, a turn-on loss increases.

SUMMARY

In a first aspect of the present invention, a semiconductor device including a semiconductor substrate is provided. The semiconductor device may include a first conductivity-type drift region formed in the semiconductor substrate. The semiconductor device may include a second conductivity-type base region formed between an upper surface of the semiconductor substrate and the drift region in the semiconductor substrate. The semiconductor device may include a first conductivity-type accumulation region formed between the drift region and the base region in the semiconductor substrate and having a higher doping concentration than the drift region. The semiconductor device may include a dummy trench portion formed to penetrate the base region from the upper surface of the semiconductor substrate in the semiconductor substrate. At least one of the accumulation region and the dummy trench portion may have a suppressing structure that suppresses formation of a second conductivity-type inversion layer in a first conductivity-type region adjacent to the dummy trench portion.

The semiconductor device may further include a gate trench portion formed to penetrate the base region and the accumulation region from the upper surface of the semiconductor substrate to the drift region in the semiconductor substrate. The gate trench portion may include a gate insulating film formed on an inner wall of a trench. The gate trench portion may include a gate conductive portion covered by the gate insulating film. The dummy trench portion may include a dummy trench insulating film formed on the inner wall of a trench and having a greater thickness than the gate insulating film. The dummy trench portion may include a dummy conductive portion covered by the dummy trench insulating film.

A film thickness of the dummy trench insulating film may be two or more times greater than a film thickness of the gate insulating film. The dummy trench insulating film of the dummy trench portion may have a uniform film thickness.

The trench of the dummy trench portion may be filled with an insulative material. A lower end of the dummy trench portion may be positioned above a lower end of the accumulation region.

The semiconductor device may include a gate trench portion formed to penetrate the base region and the accumulation region to a deeper position than the dummy trench portion in the semiconductor substrate. The dummy trench portion may include a dummy trench insulating film formed on an inner wall of a trench. The dummy trench portion may include a dummy conductive portion covered by the dummy trench insulating film. A doping concentration distribution in the accumulation region may have a peak in a depth direction of the semiconductor substrate. The peak of the doping concentration distribution in the accumulation region may be positioned between a lower end of the dummy conductive portion and a lower end of the dummy trench insulating film in the depth direction of the semiconductor substrate. A lower end of the accumulation region may be positioned between the lower end of the dummy conductive portion and the lower end of the dummy trench insulating film in the depth direction of the semiconductor substrate.

The dummy trench insulating film may have a thickness which is greater at a bottom portion of the dummy trench portion than at a sidewall of the dummy trench portion. The dummy trench portion may include a dummy trench insulating film formed on an inner wall of a trench. The dummy trench portion may include a dummy conductive portion covered by the dummy trench insulating film. The dummy trench insulating film may have a thickness which is greater at a bottom portion of the dummy trench portion than at a sidewall of the dummy trench portion. A lower end of the dummy trench insulating film at a bottom portion of the dummy trench portion may be positioned below the accumulation region.

A lower end of the dummy conductive portion may be positioned below an upper end of the accumulation region. In the accumulation region, an integrated concentration obtained by integrating, in a depth direction of the semiconductor substrate, a doping concentration in a dummy trench-adjacent region adjacent to the dummy trench portion may be higher than an integrated concentration obtained by integrating, in the depth direction of the semiconductor substrate, a doping concentration in a gate trench-adjacent region adjacent to the gate trench portion.

In the accumulation region, the dummy trench-adjacent region may be formed to a deeper position than the gate trench-adjacent region. A doping concentration distribution, in the depth direction of the semiconductor substrate, of the dummy trench-adjacent region of the accumulation region may have a first peak and a second peak, wherein the second peak is positioned deeper than the first peak and has a higher doping concentration than the first peak.

In the accumulation region, a peak of doping concentration in the dummy trench-adjacent region may be higher than a peak of doping concentration in the gate trench-adjacent region. The accumulation region formed between two dummy trench portions has the integrated concentration, which may be lower in a central region at a center of the two dummy trench portions than in a dummy trench-adjacent region adjacent to the dummy trench portion.

The semiconductor device may include a transistor section formed in the semiconductor substrate and including one or more dummy trench portions, a diode section formed in the semiconductor substrate and including one or more dummy trench portions, and a boundary section formed between the transistor section and the diode section in the semiconductor substrate and including one or more dummy trench portions. In a mesa portion sandwiched between the dummy trench portions in the boundary section, a second conductivity-type high concentration region having a higher doping concentration than the base region may be formed at the upper surface of the semiconductor substrate.

The accumulation region may not be formed in at least a partial region of the mesa portion at the boundary section. The accumulation region may be formed in an entirety of the mesa portion at the boundary section.

In the mesa portion at the boundary section, an integrated concentration obtained by integrating, in a depth direction of the semiconductor substrate, a first conductivity-type doping concentration in a region adjacent to the dummy trench portion closer to the transistor section may be higher than an integrated concentration obtained by integrating, in the depth direction, a first conductivity-type doping concentration in a central region of the mesa portion.

In the mesa portion at the boundary section, an integrated concentration obtained by integrating, in a depth direction of the semiconductor substrate, a first conductivity-type doping concentration in a region adjacent to the dummy trench portion closer to the diode section may be higher than an integrated concentration obtained by integrating, in the depth direction, a first conductivity-type doping concentration in a central region of the mesa portion.

The semiconductor device may include a gate trench portion formed to penetrate the base region and the accumulation region from the upper surface of the semiconductor substrate to the drift region in the semiconductor substrate. The semiconductor device may include a mesa portion provided to be sandwiched between the gate trench portion and the dummy trench portion inside the semiconductor substrate and in which the base region is positioned. The base region positioned in at least some mesa portions of mesa portions sandwiched between the gate trench portion and the dummy trench portion may not be connected to the emitter electrode.

The semiconductor device may include a first gate trench portion and a second gate trench portion formed to penetrate the base region and the accumulation region from the upper surface of the semiconductor substrate to the drift region in the semiconductor substrate. Each of the first gate trench portion, the second gate trench portion and the dummy trench portion may include two extending portions provided to extend in parallel with a predetermined direction in the upper surface of the semiconductor substrate, and an edge portion connecting edges of the two extending portions. The dummy trench portion may be positioned inside the first gate trench portion in the upper surface of the semiconductor substrate. The second gate trench portion may be positioned inside the dummy trench portion in the upper surface of the semiconductor substrate.

The semiconductor device may further include a gate trench portion formed to penetrate the base region and the accumulation region from the upper surface of the semiconductor substrate to the drift region in the semiconductor substrate and a mesa portion sandwiched between at least one of the dummy trench portion and the gate trench portion. The accumulation region may include a first accumulation region provided below the base region and a second accumulation region provided between the first accumulation region and the drift region.

At least one of the dummy trench portion and the gate trench portion may include a trench thin-film portion having, inside an inner wall of a trench, an insulating film having a predetermined film thickness and a conductive portion covered by the insulating film and a trench thick-film portion having, inside an inner wall of a trench, an insulating film having a greater thickness than the film thickness of the insulating film of the trench thin-film portion.

The conductive portion may be provided in the trench thin-film portion but not be provided in the trench thick-film portion.

The conductive portion may be provided in both of the trench thin-film portion and the trench thick-film portion. The conductive portion of may have a width, in an array direction of trenches, which is greater in the trench thin-film portion than in the trench thick-film portion.

The conductive portion may have a uniform width in an array direction of trenches and be provided in both of the trench thin-film portion and the trench thick-film portion. At least one of the dummy trench portion and the gate trench portion may have a width, in the array direction, which is smaller in the trench thin-film portion than in the trench thick-film portion.

The trench thick-film portion may be provided at a deeper position than the base region.

The accumulation region may further include a third accumulation region provided between the first accumulation region and the second accumulation region.

In a second aspect of the present invention a semiconductor device including a semiconductor substrate is provided. The semiconductor device may include a first conductivity-type drift region formed in the semiconductor substrate. The semiconductor device may include a second conductivity-type base region formed between an upper surface of the semiconductor substrate and the drift region in the semiconductor substrate. The semiconductor device may include a first conductivity-type accumulation region formed between the drift region and the base region in the semiconductor substrate and having a higher doping concentration than the drift region. The semiconductor device may include a gate trench portion formed to penetrate the base region and the accumulation region from the upper surface of the semiconductor substrate to the drift region in the semiconductor substrate. The semiconductor device may include a dummy trench portion formed to penetrate the base region from the upper surface of the semiconductor substrate in the semiconductor substrate. The semiconductor device may include an emitter electrode provided above the upper surface of the semiconductor substrate. The semiconductor device may include a mesa portion provided to be sandwiched between the gate trench portion and the dummy trench portion inside the semiconductor substrate and in which the base region is positioned. The base region positioned in at least some mesa portions of mesa portions sandwiched between the gate trench portion and the dummy trench portion may not be connected to the emitter electrode.

In a third aspect of the present invention, a semiconductor device including a semiconductor substrate is provided. The semiconductor device may include a first conductivity-type drift region formed in the semiconductor substrate. The semiconductor device may include a second conductivity-type base region formed between an upper surface of the semiconductor substrate and the drift region in the semiconductor substrate. The semiconductor device may include a first conductivity-type accumulation region formed between the drift region and the base region in the semiconductor substrate and having a higher doping concentration than the drift region. The semiconductor device may include a first gate trench portion and a second gate trench portion formed to penetrate the base region and the accumulation region from the upper surface of the semiconductor substrate to the drift region in the semiconductor substrate. The semiconductor device may include a dummy trench portion formed to penetrate the base region from the upper surface of the semiconductor substrate in the semiconductor substrate. The dummy trench portion may be positioned inside the first gate trench portion in the upper surface of the semiconductor substrate. The second gate trench portion may be positioned inside the dummy trench portion in the upper surface of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In this specification, one side in a direction parallel to the depth direction of a semiconductor substrate is referred to as an "upper" side, and the other side is referred to as a "lower" side. One of two principal surfaces of a substrate, layer or another member is referred to as an upper surface, and the other is referred to as a lower surface. The "upper" and "lower" directions are not limited to the gravitational direction. In this specification, technical matters may be described using orthogonal coordinate axes of X-axis, Y-axis and Z-axis. The Z-axis is defined to be along the depth direction of the semiconductor substrate.

Although the terms "emitter" and "collector" are used in this specification, the semiconductor device is not limited to an IGBT. The scope of the terms "emitter" and "collector"

in this specification may also include the terms "source" and "drain" for transistors such as a MOSFET.

Although examples are shown in which a first conductivity-type is N-type and a second conductivity-type is P-type in each example embodiment, the first conductivity-type may be P-type and the second conductivity-type may be N-type. In this case, conductivity types of a substrate, layer, region or the like in each example embodiment will each be of opposite polarization.

Figure 1:
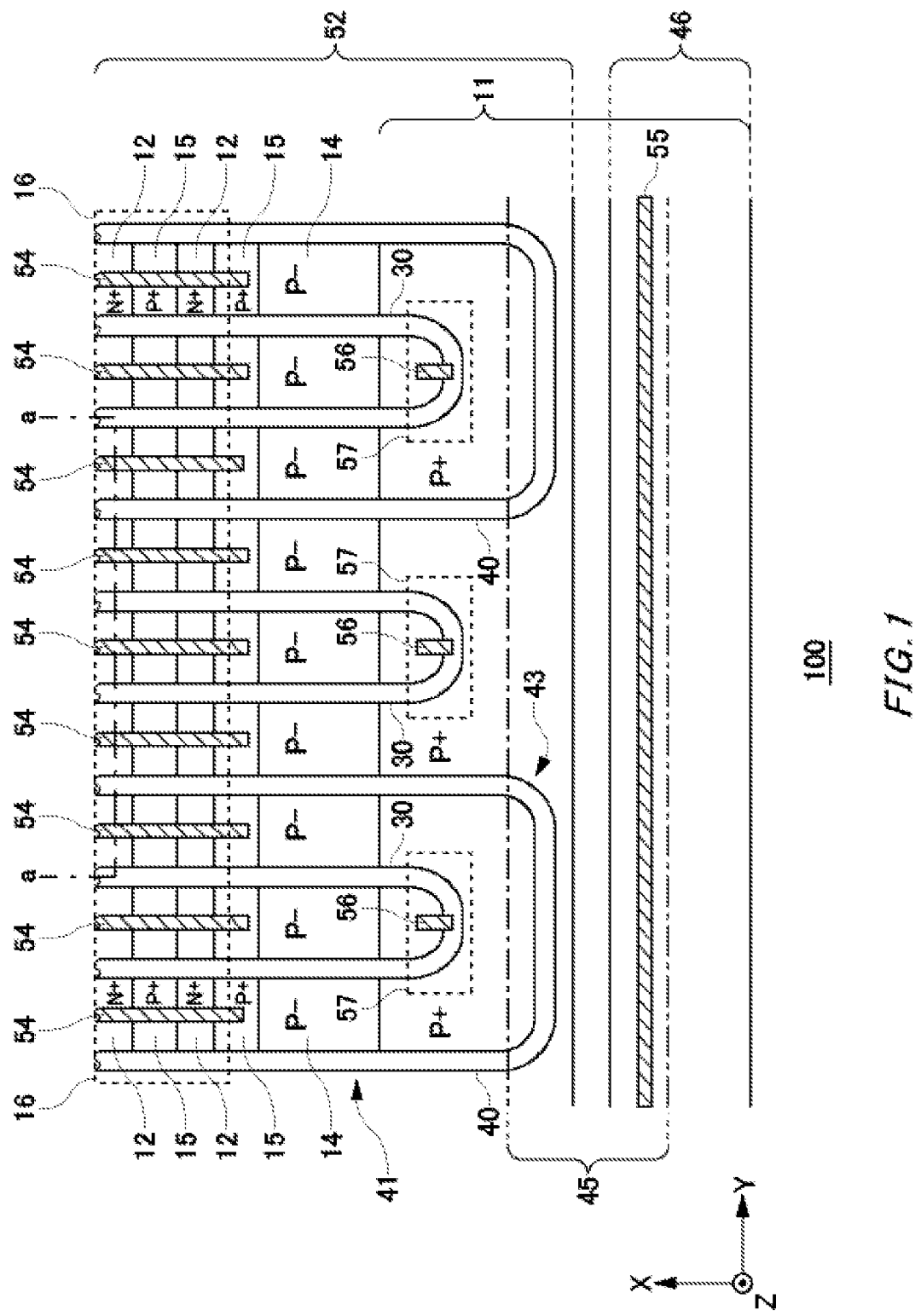
FIG. 1 shows a part of the upper surface of a semiconductor device 100 according to an embodiment of the present invention.

FIG. 1 shows a part of the upper surface of a semiconductor device 100 according to an embodiment of the present invention. The semiconductor device 100 of the present example is a semiconductor chip including a transistor such as an IGBT. In FIG. 1, a part of the upper surface of the chip around the chip end portion is shown, and other regions are omitted.

Although FIG. 1 shows an active region of the semiconductor substrate in the semiconductor device 100, the semiconductor device 100 may include an edge termination structure surrounding the active region. The active region refers to a region through which electric current flows when the semiconductor device 100 is controlled to be in an ON state. The edge termination structure mitigates electric field concentration at the upper surface side of the semiconductor substrate. The edge termination structure has a guard ring, a field plate, a RESURF or any combination thereof, for example.

The semiconductor device 100 of the present example includes gate trench portions 40, dummy trench portions 30, emitter regions 12, base regions 14, contact regions 15, accumulation regions 16 and a well region 11, formed inside the semiconductor substrate. The accumulation regions 16 are not exposed at the upper surface of the semiconductor substrate. In FIG. 1, a region in which the accumulation regions 16 are formed within an X-Y plane parallel to the upper surface of the semiconductor substrate is indicated by a dashed line. Also, the semiconductor device 100 of the present example includes an emitter electrode 52 and a gate metal layer 46 provided above the upper surface of the semiconductor substrate. The emitter electrode 52 and the gate metal layer 46 are provided to be separated from each other.

An interlayer insulating film is formed between each of the emitter electrode 52 and the gate metal layer 46 and the upper surface of the semiconductor substrate, but it is omitted in FIG. 1. In the interlayer insulating film of the present example, contact holes 54, a contact hole 55 and contact holes 56 are formed to penetrate the interlayer insulating film.

The emitter electrode 52 contacts the emitter regions 12, the contact regions 15 and the base regions 14 at the upper surface of the semiconductor substrate through the contact holes 54. Each contact hole 54 of the present example is formed between trench portions. Also, the emitter electrode 52 is connected to dummy conductive portions in the dummy trench portions 30 through the contact holes 56. Connecting portions 57 formed of a conductive material such as polysilicon doped with impurities may be provided between the emitter electrode 52 and the dummy conductive portions. The connecting portions 57 are formed on the upper surface of the semiconductor substrate. In the present example, the contact holes 56 are positioned at X-axis direction edges of the dummy trench portions 30. An insulating film is provided between the connecting portions 57 and the semiconductor substrate 10.

The gate metal layer 46 contacts a gate runner 45 through the contact hole 55. The gate runner 45 is formed of polysilicon doped with impurities, or the like. The gate runner 45 is connected to gate conductive portions in the gate trench portions 40 at the upper surface of the semiconductor substrate. The gate runner 45 is not connected to the dummy conductive portions in the dummy trench portions 30. The gate runner 45 of the present example is formed from a position below the contact hole 55 to edge portions 43 of the gate trench portions 40. At the edge portions 43 of the gate trench portions 40, the gate conductive portions are exposed at the upper surface of the semiconductor substrate and contact the gate runner 45. An insulating film is provided between the gate runner 45 and the semiconductor substrate 10.

The emitter electrode 52 and the gate metal layer 46 are formed of a metal-containing material. For example, at least a partial region of each electrode is formed of aluminum or an aluminum-silicon alloy. Each electrode may have a barrier metal formed of titanium, a titanium compound or the like at an underlying layer of a region formed of aluminum or the like, and may have a plug formed of tungsten or the like in the contact holes.

One or more gate trench portions 40 and one or more dummy trench portions 30 are arrayed at a predetermined interval along a predetermined array direction in the upper surface of the semiconductor substrate. In FIG. 1, the array direction is the Y-axis direction.

Each gate trench portion 40 of the present example may have two extending portions 41 extending in parallel along an extending direction (the X-axis direction in the present example) perpendicular to the array direction, and an edge portion 43 connecting the two extending portions 41 at edges of the extending portions 41. It is preferable that at least a part of the edge portion 43 is formed to have a curved shape in the upper surface of the semiconductor substrate. By connecting edges of two extending portions 41 of each gate trench portion 40, electric field concentration at end portions of the extending portions 41 can be mitigated.

One or more dummy trench portions 30 are provided between extending portions 41 of the gate trench portions 40. Similar to the gate trench portions 40, each dummy trench portion 30 may have an edge portion connecting edges of two extending portions. In the present example, a dummy trench portion 30 having two extending portions and an edge portion is formed between extending portions 41 of the gate trench portions 40. In another example, the dummy trench portions 30 may have a linear shape with no edge portion. The dummy trench portions 30 are provided at positions that do not overlap with the gate runner 45.

The emitter electrode 52 is formed above the gate trench portions 40, the dummy trench portions 30, the well region 11, the emitter regions 12, the base regions 14 and the contact regions 15. The well region 11 is formed within a predetermined area from the end portion of the active region at which the gate metal layer 46 is provided. The well region 11 of the present example is of $P^+$-type. The diffusion depth of the well region 11 may be greater than the depths of the gate trench portions 40 and the dummy trench portions 30. Partial regions of the gate trench portions 40 and the dummy trench portions 30 at the gate metal layer 46 side are formed in the well region 11. The bottom portions of extending direction ends of the dummy trench portions 30 may be covered by the well region 11.

Base regions 14 are formed in mesa portions, which are sandwiched between trench portions inside the semiconductor substrate. The base regions 14 are of $P^-$-type having a lower doping concentration than the well region 11.

P+-type contact regions 15 having a higher doping concentration than the base regions 14 are formed on the upper surfaces of the base regions 14 in the mesa portions. Also, N+-type emitter regions 12 having a higher doping concentration than the semiconductor substrate are selectively formed on the upper surfaces of the base regions 14.

Each of the contact regions 15 and the emitter regions 12 is formed from one of two adjacent trench portions to the other trench portion. The contact regions 15 and the emitter regions 12 are formed to be exposed at the upper surface of the semiconductor substrate alternately along the extending direction of the trench portions (the X-axis direction).

In the mesa portions of another example, the contact regions 15 and the emitter regions 12 may be formed in a stripe shape along the extending direction. For example, the emitter regions 12 are formed in regions adjacent to the trench portions, and the contact regions 15 are formed in regions sandwiched between the emitter regions 12.

The contact holes 54 are formed above each region of the contact regions 15 and the emitter regions 12. The contact holes 54 are not formed in regions corresponding to the base regions 14 and the well regions 11.

Figure 2:
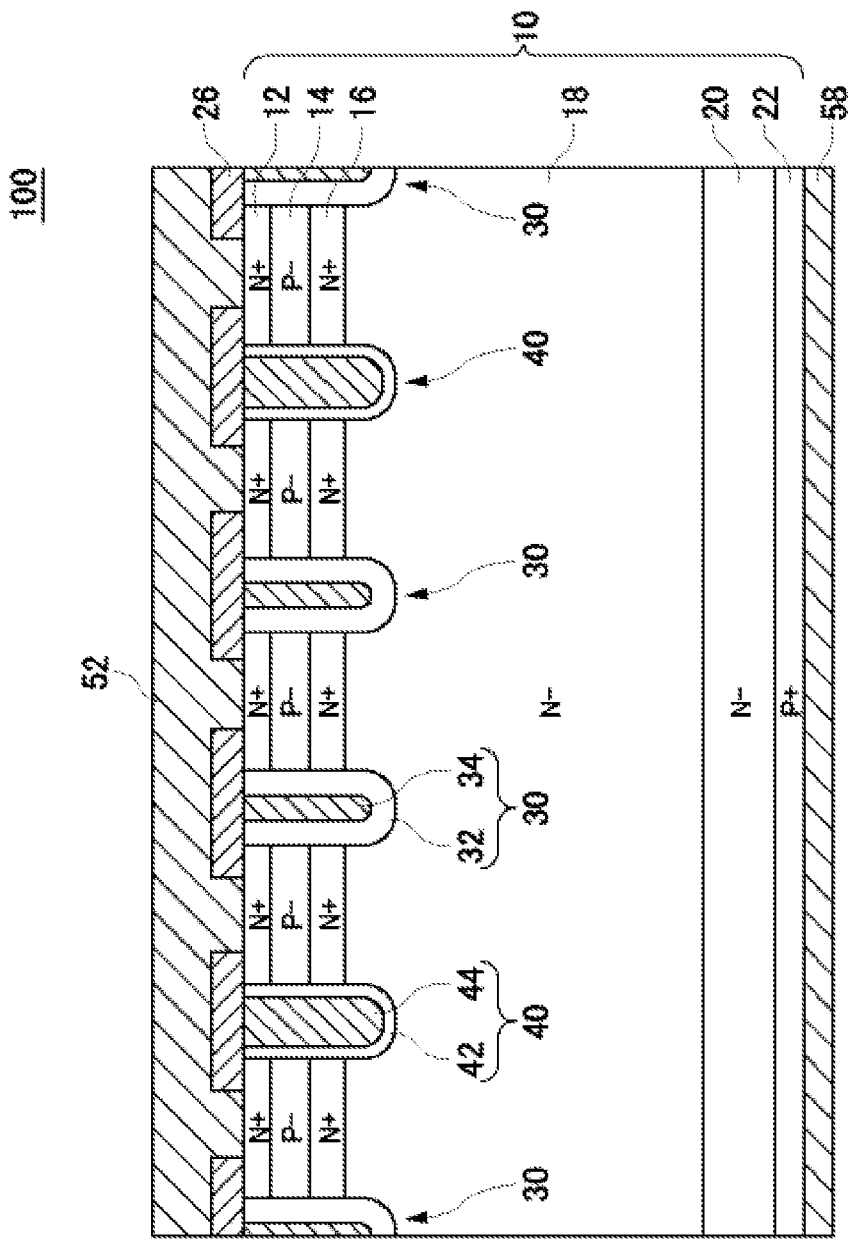
FIG. 2 shows one example of the cross section taken along a-a in FIG. 1.
Figure 2:

FIG. 2 shows one example of the cross section taken along a-a in FIG. 1. In the present example, the cross section taken along a-a is a Y-Z plane. The semiconductor device 100 of the present example includes, in the cross section, a semiconductor substrate 10, an interlayer insulating film 26, an emitter electrode 52 and a collector electrode 58. The interlayer insulating film 26 is, for example, a silicate glass doped with impurities such as boron and phosphorus. The interlayer insulating film 26 is selectively formed on the upper surface of the semiconductor substrate 10. The emitter electrode 52 is formed on the upper surfaces of the semiconductor substrate 10 and the interlayer insulating film 26. The collector electrode 58 is formed on the lower surface of the semiconductor substrate 10.

The semiconductor substrate 10 may be a silicon substrate, a silicon carbide substrate, a nitride semiconductor substrate such as gallium nitride, or the like. The semiconductor substrate 10 of the present example is a silicon substrate.

An N−-type drift region 18 is formed in the semiconductor substrate 10. The drift region 18 of the present example is a remaining region of the semiconductor substrate 10 in which an emitter region 12, a base region 14, an accumulation region 16, a buffer region 20 and a collector region 22 are not formed.

A P−-type base region 14 is formed between the upper surface of the semiconductor substrate 10 and the drift region 18. The base region 14 may be formed by implanting P-type impurities such as boron through the upper surface of the semiconductor substrate 10.

An N+-type emitter region 12 is formed on the upper surface of the base region 14. The emitter region 12 may be formed by implanting N-type impurities such as phosphorus through the upper surface of the semiconductor substrate 10.

An N+-type accumulation region 16 is formed between the drift region 18 and the base region 14. The accumulation region 16 may be formed by implanting N-type impurities such as phosphorus or proton through the upper surface of the semiconductor substrate 10.

In the present example, gate trench portions 40 and dummy trench portions 30 are formed to penetrate, from the upper surface of the semiconductor substrate 10, the emitter region 12, the base region 14 and the accumulation region 16. The bottom portions of the gate trench portions 40 and the dummy trench portions 30 of the present example are positioned in the drift region 18. Note that reference to a trench portion penetrating impurity regions does not necessarily mean that the impurity regions are formed and the trench portion is formed in this order. Reference to a trench portion penetrating impurity regions also includes the case of forming trench portions and thereafter forming the impurity regions between the trench portions.

A buffer region 20 is formed on the lower surface side of the drift region 18. The doping concentration of the buffer region 20 is higher than the doping concentration of the drift region 18. The buffer region 20 may serve as a field stop layer to prevent the depletion layer extending from the lower surface side of the base regions 14 from reaching a P+-type collector region 22. A P+-type collector region 22 is formed on the lower surface side of the buffer region 20.

Each gate trench portion 40 has a gate insulating film 42 and a gate conductive portion 44. The gate insulating film 42 is formed to cover the inner wall of the gate trench. The gate insulating film 42 may be formed by oxidizing or nitriding the semiconductor material of the inner wall of the gate trench. The gate conductive portion 44 is covered by the gate insulating film 42 inside the gate trench. That is, the gate insulating film 42 insulates the gate conductive portion 44 from the semiconductor substrate 10. The gate conductive portion 44 is formed of a conductive material such as polysilicon.

The gate conductive portion 44 at least includes a region that faces its adjacent base regions 14 in the depth direction. In the cross section, the gate trench portions 40 are covered by the interlayer insulating film 26 at the upper surface of the semiconductor substrate 10. When a predetermined voltage is applied to gate conductive portions 44, channels are formed in the interfacing surface layers of the base regions 14 in contact with the gate trench portions 40.

Each dummy trench portion 30 of the present example has a dummy trench insulating film 32 and a dummy conductive portion 34. The dummy trench insulating film 32 is formed to cover the inner wall of the dummy trench. The dummy conductive portion 34 is formed inside the dummy trench portion 30 and covered by the dummy trench insulating film 32. The dummy trench insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length in the depth direction as the gate conductive portion 44. In the cross section, the dummy trench portions 30 are covered by the interlayer insulating film 26 at the upper surface of the semiconductor substrate 10.

By providing the dummy trench portions 30, the carrier injection enhancing effect can be increased to facilitate the conductivity modulation, lowering the ON voltage. Also, the switching speed of the semiconductor device 100 can be adjusted by adjusting the ratio of the dummy trench portions 30 to the gate trench portions 40.

Note that, when a predetermined ON voltage is applied to gate conductive portions 44 to turn on the semiconductor device 100, then at the bottom portions of the dummy trench portions 30, a reverse bias is applied between dummy conductive portions 34 and the drift region 18. For example, when turning on, the width of the depletion layer in the drift region 18 decreases and the lower end of the depletion layer comes in the vicinity of the bottom portions of the dummy trench portions 30, and then the voltage of the dummy conductive portions 34 is at the ground potential and the voltage in the vicinity of the bottom portions of the dummy trench portions 30 is a predetermined positive voltage.

When a reverse bias is applied in the vicinity of the bottom portions of the dummy trench portions 30, holes may be concentrated in the vicinity of the bottom portions of the dummy trench portions 30 to form P-type inversion layers. If the P-type inversion layers are formed, holes implanted into the drift region 18 pass through the inversion layers and the base regions 14 to the emitter side, and the turn-on loss increases.

In contrast, in the semiconductor device 100, either or both of the accumulation regions 16 and the dummy trench portions 30 have a suppressing structure that suppresses formation of P-type inversion layers in N-type regions (the drift region 18 and the accumulation region 16 in the present example) adjacent to the dummy trench portions 30. In the example shown in FIG. 2, the dummy trench portions 30 have the suppressing structure.

In the dummy trench portions 30 of the present example, the film thickness of the dummy trench insulating film 32 is greater than the film thickness of the gate insulating film 42. The film thickness of the dummy trench insulating film 32 may adopt the average film thickness of the entire dummy trench insulating film 32. The film thickness of the dummy trench insulating film 32 may otherwise be the average film thickness, in the Y-axis direction, of the dummy trench insulating film 32 formed between the dummy conductive portion 34 and the sidewall of the dummy trench.

The film thickness of the gate insulating film 42 may adopt the average film thickness of the entire gate insulating film 42. The film thickness of the gate insulating film 42 may otherwise be the average film thickness, in the Y-axis direction, of the gate insulating film 42 formed between the gate conductive portion 44 and the sidewall of the gate trench.

By forming a thick dummy trench insulating film 32, capacitance between the dummy conductive portion 34 and the drift region 18 can be reduced, and the number of holes concentrating in the vicinity of the bottom portions of the dummy trench portions 30 can be decreased. Therefore, formation of P-type inversion layers in the vicinity of the bottom portions of the dummy trench portions 30 can be suppressed.

Figure 3:
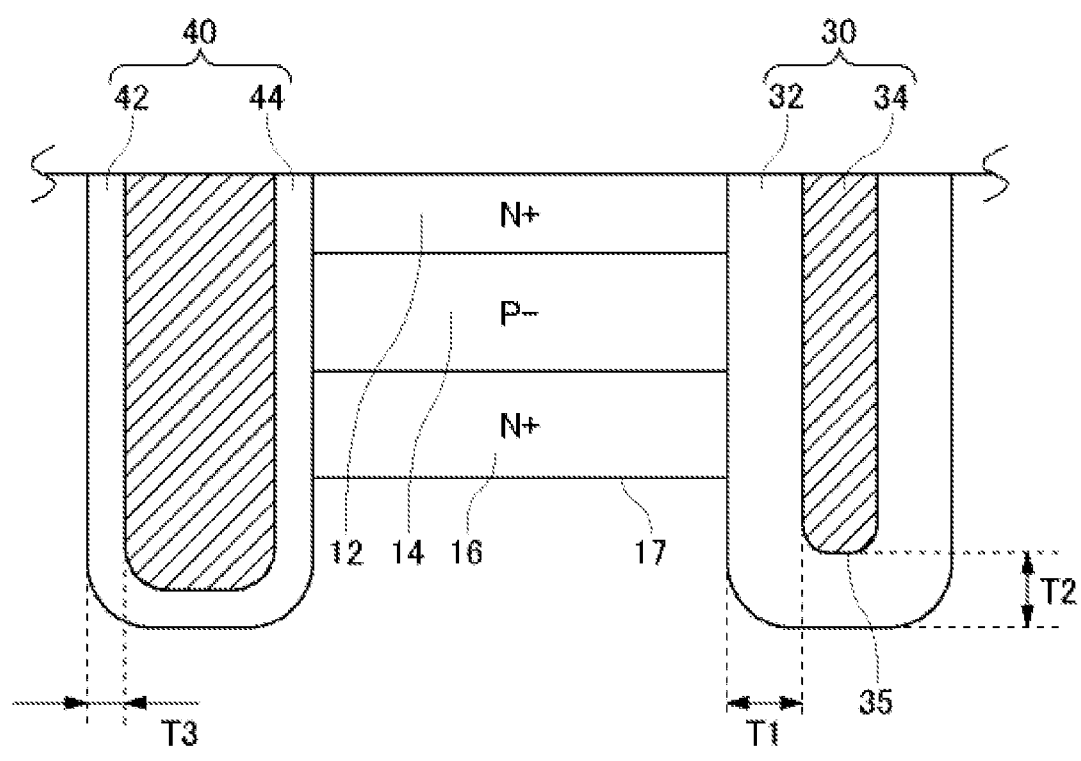
FIG. 3 is a cross-sectional view showing an enlarged view of the vicinity of a gate trench portion 40 and a dummy trench portion 30.
Figure 3:
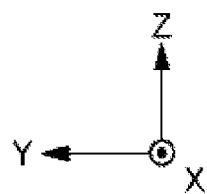

FIG. 3 is a cross-sectional view showing an enlarged view of the vicinity of a gate trench portion 40 and a dummy trench portion 30. The film thickness T1 of the dummy trench insulating film 32 may be two or more times greater than the film thickness T2 of the gate insulating film 42. The film thickness T1 of the dummy trench insulating film 32 may also be three or more times greater, or four or more times greater than the film thickness T2 of the gate insulating film 42.

Also, it is preferable that the dummy trench insulating film 32 has a uniform film thickness. The uniform film thickness means that, for example, errors in the film thickness of the dummy trench insulating film 32 at each position are within the range of ±20% for a single dummy trench portion 30. The error range may be the range of ±10%. For example, the film thickness T1 of the dummy trench insulating film 32 formed on the sidewall of a dummy trench portion 30 and the film thickness T2 of the dummy trench insulating film 32 formed at its bottom portion are uniform. However, in the vicinity of the upper end of a dummy trench portion 30, the diameter of the trench tends to vary and the boundary between the interlayer insulating film 26 and the dummy trench insulating film 32 is unclear, and therefore the dummy trench insulating film 32 only has to have such a uniform film thickness as described above in a region below the lower ends of emitter regions 12. Similarly, the gate insulating film 42 may have a uniform film thickness.

By making the film thickness of the dummy trench insulating film 32 uniform, it becomes easier to examine whether the thickness of the dummy trench insulating film 32 is formed as designed. That is, in a case that the examination is performed by applying a predetermined testing voltage between a dummy conductive portion 34 and the semiconductor substrate 10, if the thickness of the dummy trench insulating film 32 is not uniform, it becomes difficult to confirm whether the film thickness of a thicker region is at a specified value because insulation breakdown of a thinner region occurs prior thereto. In contrast, by forming the entire dummy trench insulating film 32 to be uniformly thick, the examination on the thickness of the dummy trench insulating film 32 becomes easy, and it is possible to easily confirm whether the dummy trench insulating film 32 is formed with such a thickness that can suppress formation of P-type inversion layers.

The dummy trench portions 30 may be formed to protrude downward below the lower ends 17 of the accumulation regions 16. The lower ends 35 of the dummy conductive portions 34 may be positioned below the lower ends 17 of the accumulation regions 16. In another example, the lower ends 35 of the dummy conductive portions 34 may be positioned above the lower ends of the accumulation regions 16.

Figure 4:
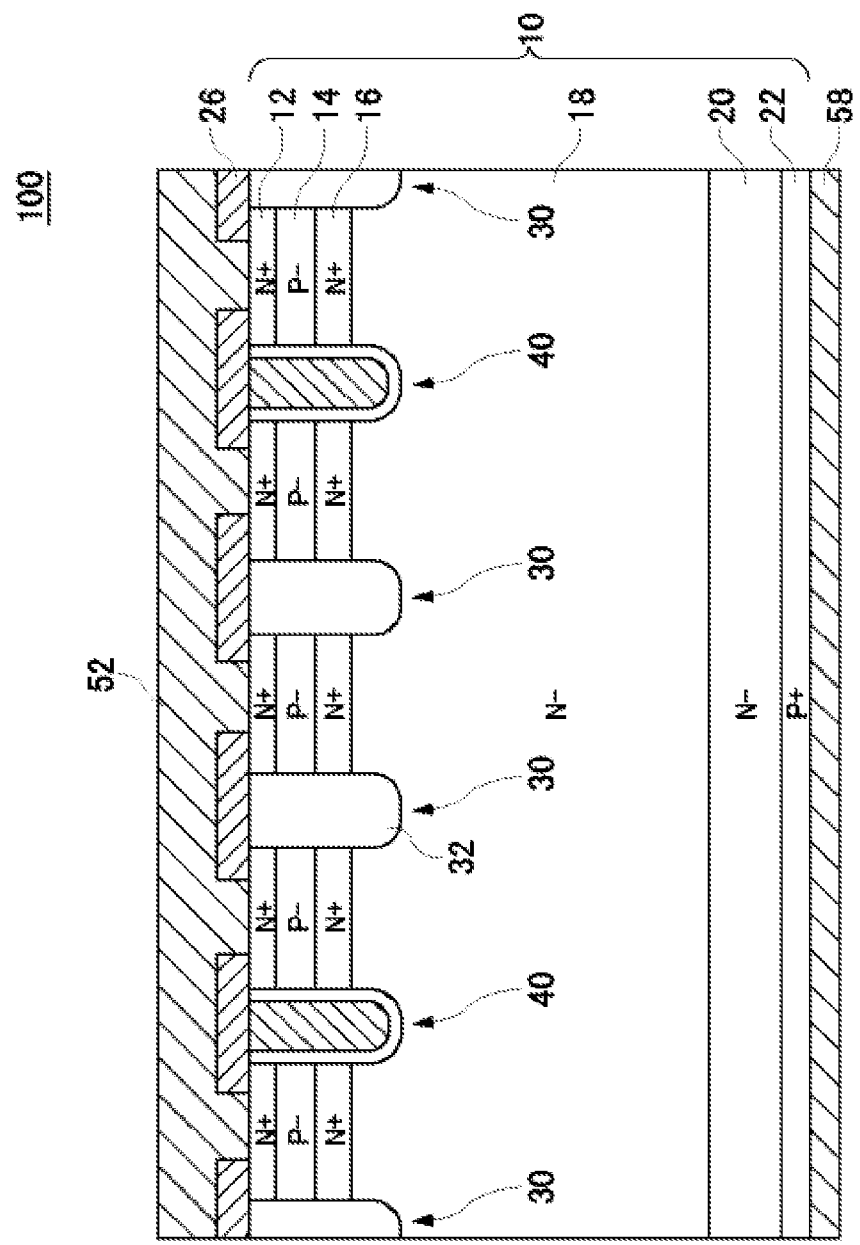
FIG. 4 shows another example of the cross section taken along a-a in FIG. 1.

FIG. 4 shows another example of the cross section taken along a-a in FIG. 1. In the present example, the semiconductor device 100 is different from the example shown in FIG. 2 in the structure of the dummy trench portions 30. Other structures may be the same as the example shown in FIG. 2.

In the present example, the trench of each dummy trench portion 30 is filled with an insulative material. The insulative material may be the dummy trench insulating film 32 formed by oxidizing or nitriding the inner wall of the trench, may be an insulating film formed by CVD method or the like, or may include these multiple types of insulating film. Also, no conductive material is provided inside the trench of each dummy trench portion 30. Note that a cavity surrounded by the insulative material may also be formed in the trench of each dummy trench portion 30. By filling the trench of each dummy trench portion 30 with an insulative material, concentration of holes in the vicinity of the bottom portions of dummy trench portions 30 can be suppressed.

Figure 5:
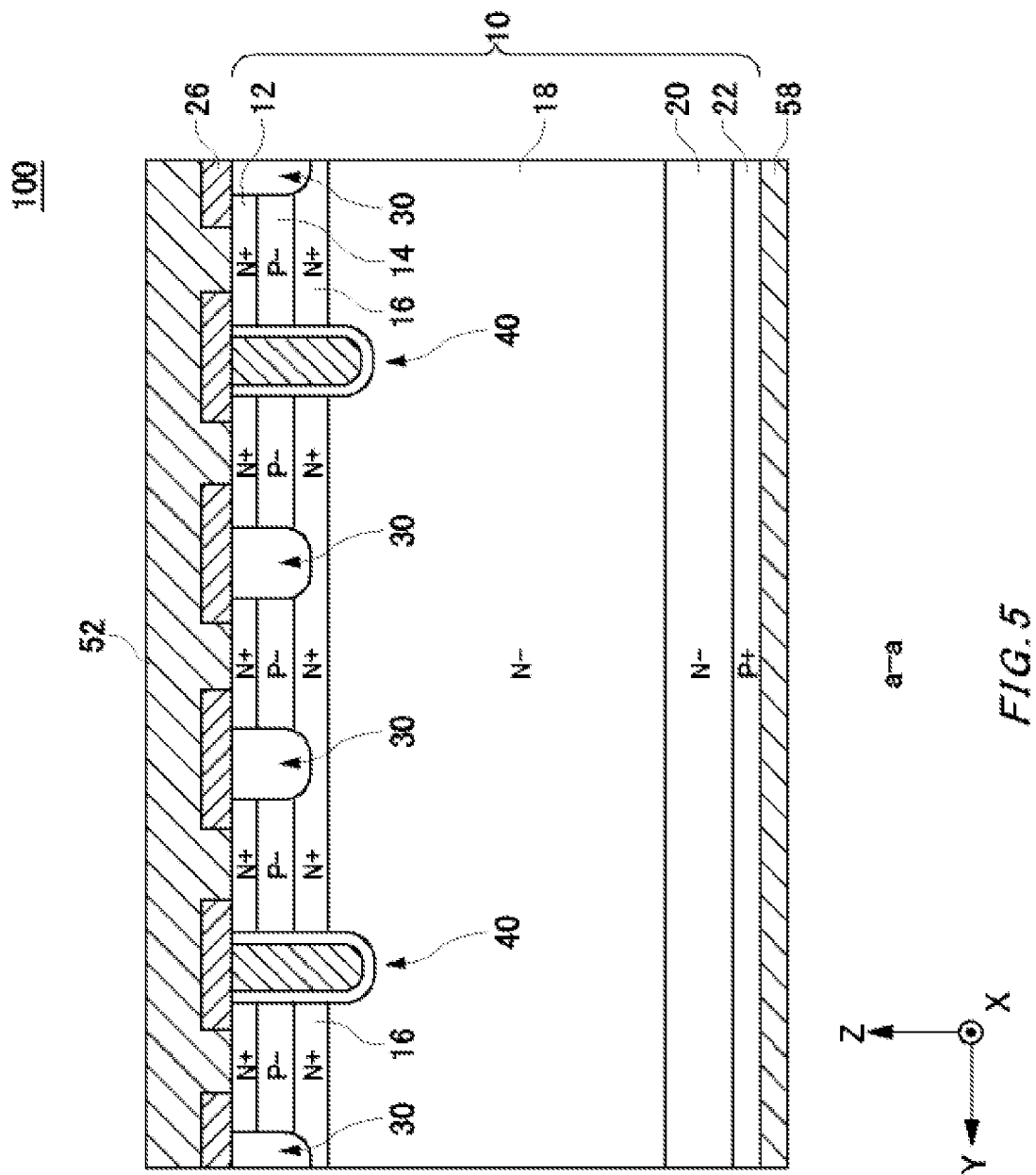
FIG. 5 shows another example of the cross section taken along a-a in FIG. 1.

FIG. 5 shows another example of the cross section taken along a-a in FIG. 1. In the present example, the semiconductor device 100 is different from the example shown in FIG. 4 in the length of the dummy trench portions 30 in the depth direction (the Z-axis direction). Other structures may be the same as the example shown in FIG. 4.

In the present example, similar to the example shown in FIG. 4, the trench of each dummy trench portion 30 is filled with an insulative material. The dummy trench portions 30 shown in FIG. 4 are formed to penetrate the accumulation regions 16. That is, the lower ends of the dummy trench portions 30 shown in FIG. 4 are positioned below the lower ends of the accumulation regions 16.

In contrast, the dummy trench portions 30 of the present example do not penetrate the accumulation regions 16. The lower ends of the dummy trench portions 30 are positioned above the lower ends of the accumulation regions 16. In the present example, the lower ends of the dummy trench portions 30 are positioned in the accumulation regions 16. By positioning the lower ends of the dummy trench portions 30 in the high-concentration N+-type accumulation regions 16, formation of P-type inversion layers in the vicinity of the lower ends of the dummy trench portions 30 can further be suppressed.

In yet another example, the length of the dummy trench portions 30 in the depth direction may be shorter than that of the gate trench portions 40 while the dummy trench portions 30 penetrate the accumulation regions 16. That is, the distance between the lower ends of the dummy trench portions 30 and the accumulation regions 16 is shorter than the distance between the lower ends of the gate trench portions 40 and the accumulation regions 16. Such a structure can also suppress formation of P-type inversion layers in the vicinity of the lower ends of the dummy trench portions 30.

Figure 6:
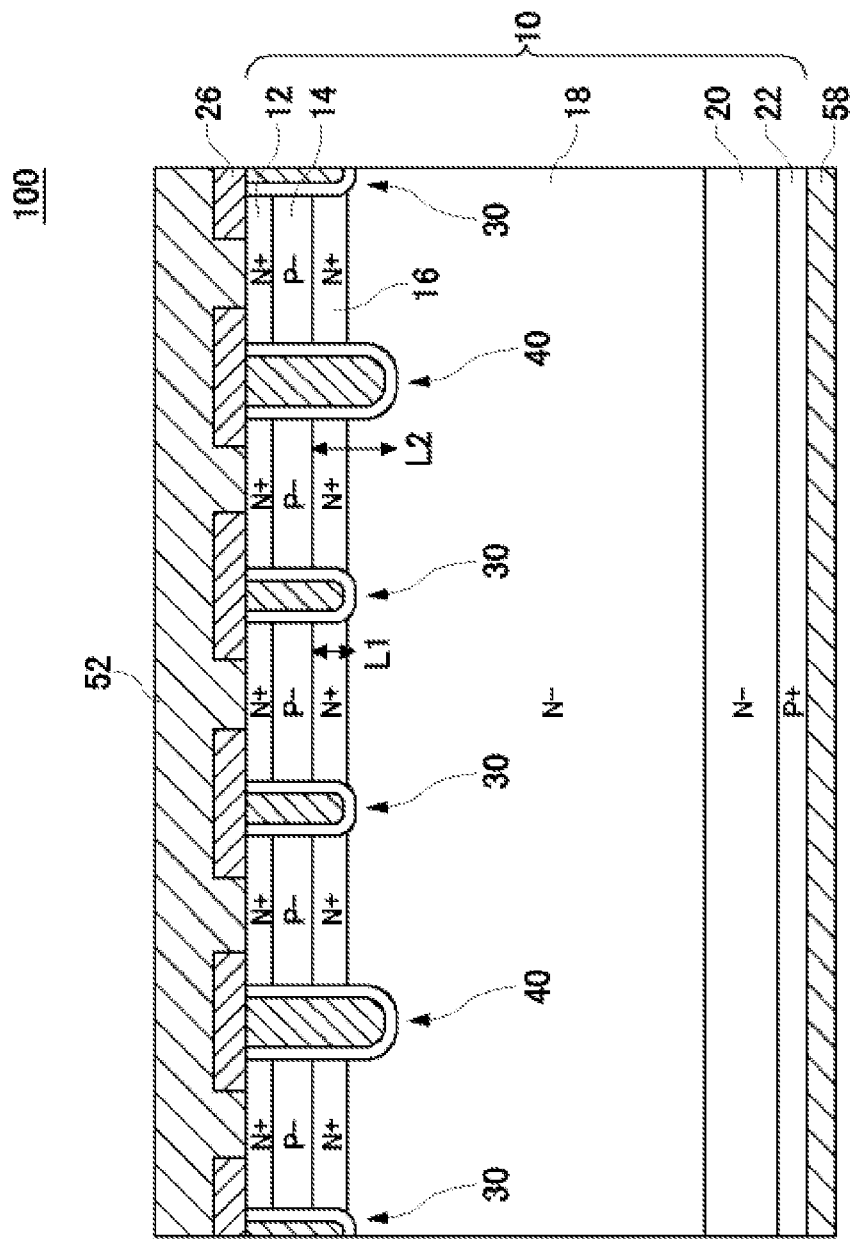
FIG. 6 shows another example of the cross section taken along a-a in FIG. 1.

FIG. 6 shows another example of the cross section taken along a-a in FIG. 1. In the present example, the semiconductor device 100 is different from the examples shown in FIG. 2 to FIG. 5 in the length of the dummy trench portions 30 in the depth direction. Other structures may be the same as any of the examples shown in FIG. 2 to FIG. 5.

The dummy trench portions 30 of the present example are formed to penetrate the emitter regions 12, the base regions 14 and the accumulation regions 16 to a shallower position than the gate trench portions 40. The gate trench portions 40 are formed to penetrate the emitter regions 12, the base regions 14 and the accumulation regions 16 to a deeper position than the dummy trench portions 30.

The structure in the trench of each dummy trench portion 30 may be the same structure as any of the examples in FIG. 2 to FIG. 5, or may be another structure. Each dummy trench portion 30 shown in FIG. 6 includes a dummy trench insulating film 32 and a dummy conductive portion 34. The film thickness of the dummy trench insulating film 32 may be the same as the film thickness of the gate insulating film 42, or may be different from it as shown in FIG. 2.

By forming shallow dummy trench portions 30, the bottom portions of the dummy trench portions 30 can be made closer to the accumulation regions 16. In this way, formation of P-type inversion layers in the vicinity of the bottom portions of the dummy trench portions 30 can be suppressed.

The distance, in the depth direction, between the lower ends of the base regions 14 and the lower ends of the dummy trench portions 30 is referred to as L1, and the distance, in the depth direction, between the lower ends of the base regions 14 and the lower ends of the gate trench portions 40 is referred to as L2. The distance L1 may be three fourths or less, two thirds or less, one half or less, one third or less, or one fourth or less of the distance L2.

The dummy trench portions 30 of the present example may have a smaller width in the Y-axis direction than the gate trench portions 40. In this way, it is possible to easily form the shallow dummy trench portions 30. Note that the polysilicon of the dummy conductive portion 34 and the polysilicon of the gate conductive portion 44 may be formed in the same process, or may be formed in different processes. By forming the polysilicons in different processes, it is possible to easily align the height positions of the polysilicons formed in the trenches at different depths. The upper end of the dummy conductive portion 34 and the upper end of the gate conductive portion 44 may both be positioned at the same height position as the upper surface of the semiconductor substrate 10.

If the dummy conductive portion 34 and the gate conductive portion 44 are formed in different processes, it is preferable to form one of the conductive portions and thereafter form the trench of the other trench portion. In this way, a resist or the like used for forming one of the conductive portions can be prevented from remaining in the other trench.

Figure 7:
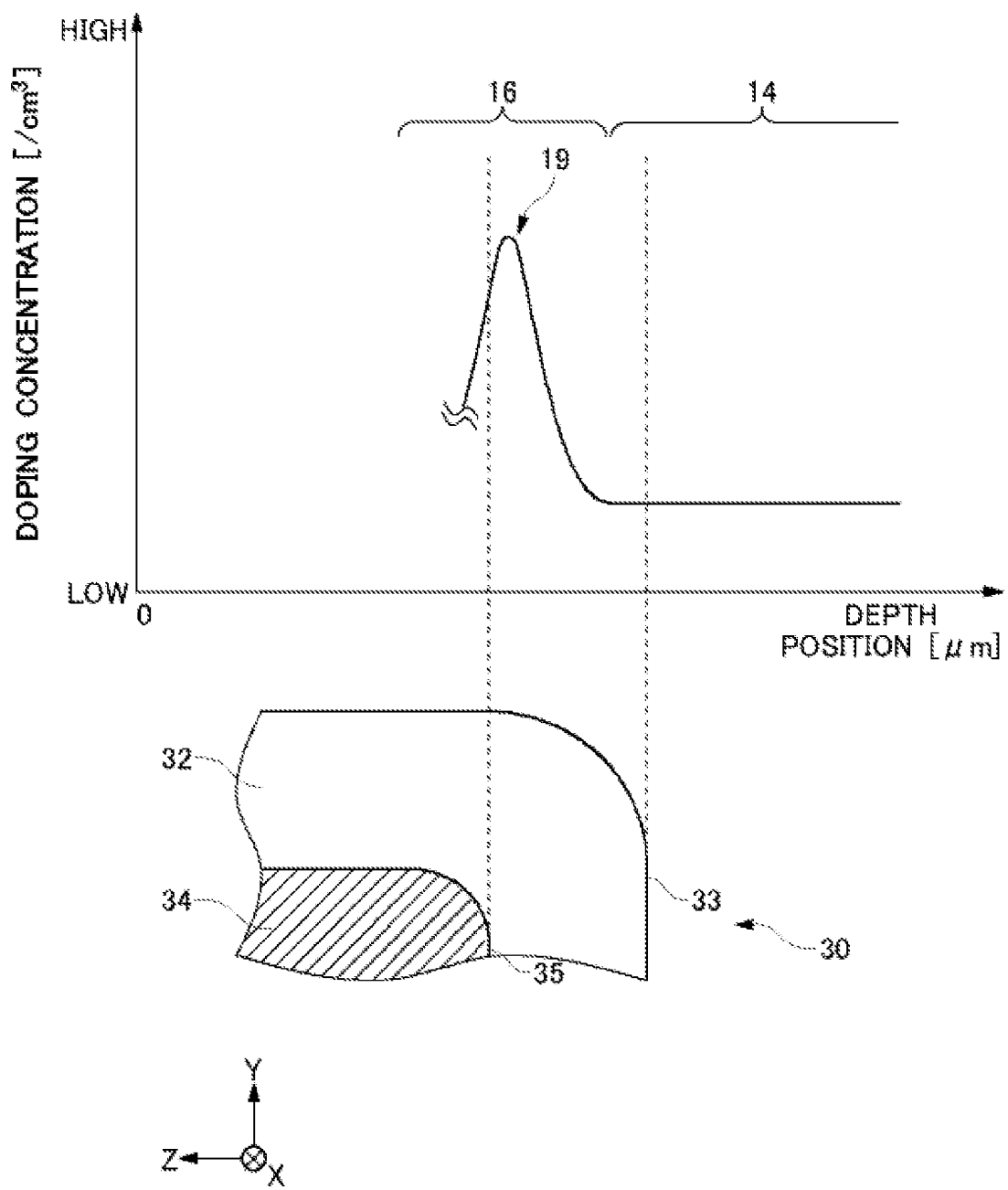
FIG. 7 shows one example of the doping concentration distribution, in the depth direction, of an accumulation region 16 shown in FIG. 6.

FIG. 7 shows one example of the doping concentration distribution, in the depth direction, of an accumulation region 16 shown in FIG. 6. In FIG. 7, the positions, in the depth direction, of the lower end 35 of a dummy conductive portion 34 and the lower end 33 of a dummy trench portion 30 are shown in alignment therewith. The horizontal axis of FIG. 7 indicates positions in the depth direction based on the position of the upper surface of the semiconductor substrate 10, and the longitudinal axis indicates doping concentrations on a logarithmic scale.

The doping concentration distribution of the accumulation region 16 has a peak 19 indicating a local maximum value. In the present example, the peak 19 is positioned between the lower end 33 of the dummy trench insulating film 32 and the lower end 35 of the dummy conductive portion 34 in the depth direction of the semiconductor substrate 10. The peak 19 may be positioned at the center between the lower end 33 of the dummy trench insulating film 32 and the lower end 35 of the dummy conductive portion 34, may be positioned above the center, or may be positioned below the center.

In this way, the peak of the N-type impurity concentration can be positioned in the vicinity of the bottom portions of the dummy trench portions 30. Therefore, formation of P-type inversion layers in the vicinity of the bottom portions of the dummy trench portions 30 can be suppressed.

Note that, in the depth direction of the semiconductor substrate 10, the lower end of the accumulation region 16 (that is, the boundary with the drift region 18) may be positioned between the lower end 35 of the dummy conductive portion 34 and the lower end 33 of the dummy trench insulating film 32. In this case, the dummy trench portion 30 penetrates the accumulation region 16. Note that, if each member in each example embodiment has a downward-convex shape, the lower end of each member refers to the edge of the convex shape.

Figure 8:
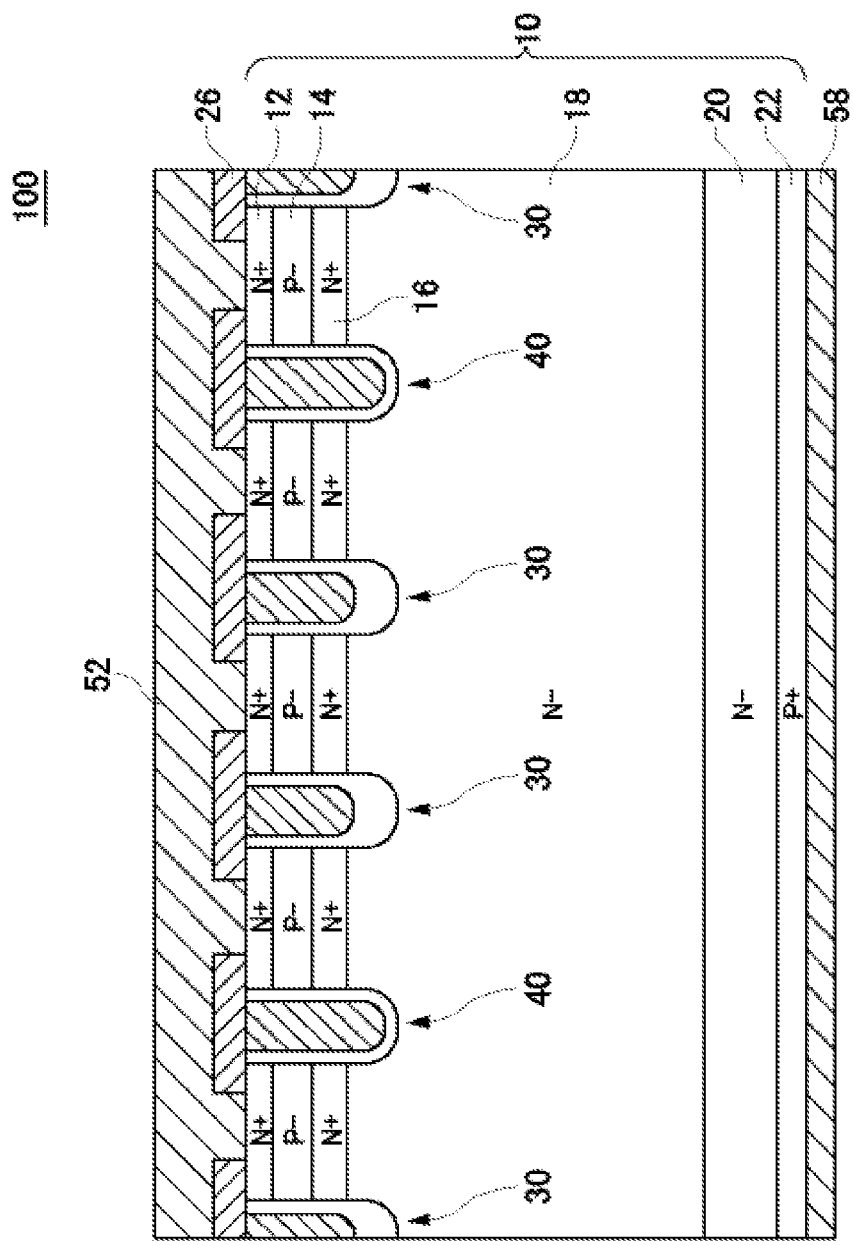
FIG. 8 shows another example of the cross section taken along a-a in FIG. 1.

FIG. 8 shows another example of the cross section taken along a-a in FIG. 1. In the present example, the semiconductor device 100 is different from the examples shown in FIG. 2 to FIG. 7 in the film thickness distribution of the dummy trench insulating film 32 in each dummy trench portion 30. Other structures may be the same as any of the examples shown in FIG. 2 to FIG. 7. In the present example, the dummy trench insulating film 32 at the bottom portion of each dummy trench portion 30 has a greater thickness than the dummy trench insulating film 32 at the sidewall of each dummy trench portion 30.

Figure 9:
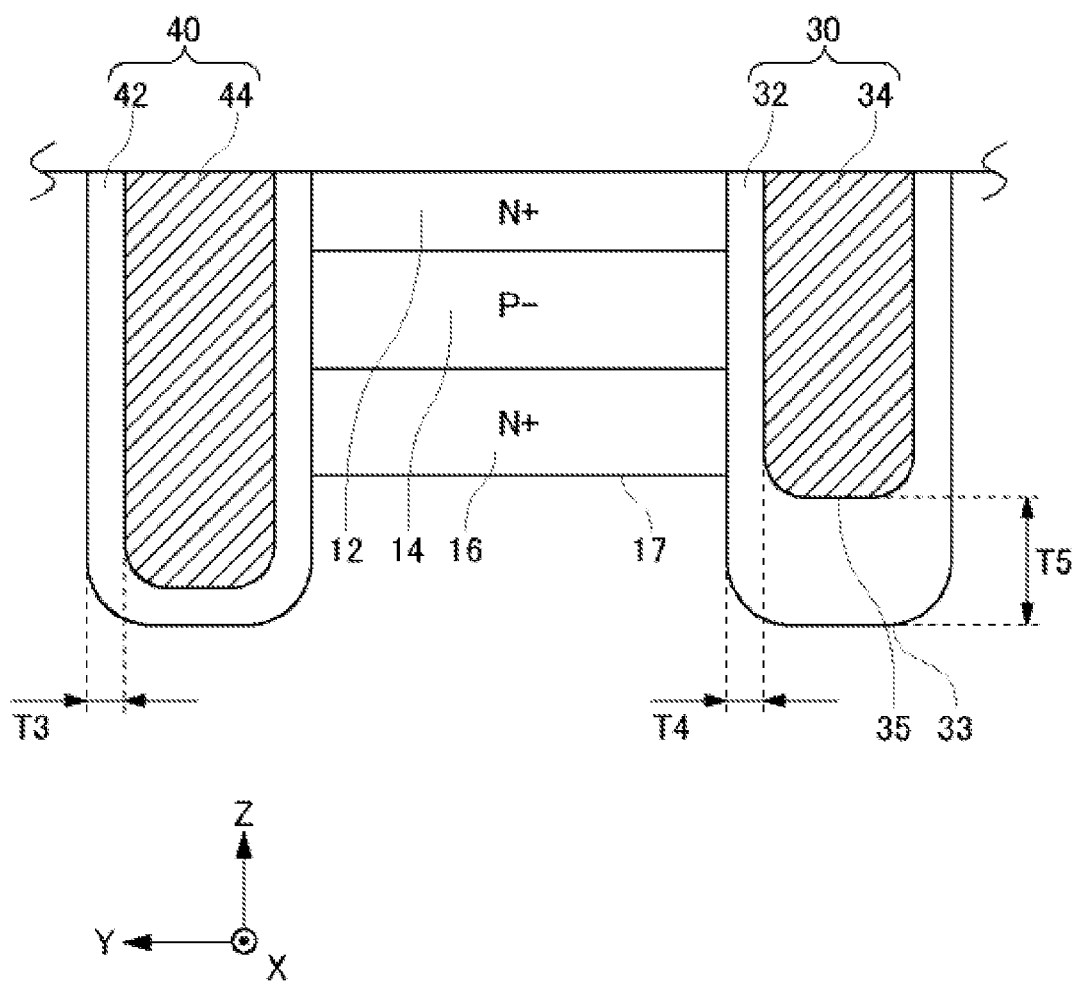
FIG. 9 is a cross-sectional view showing an enlarged view of the vicinity of a gate trench portion 40 and a dummy trench portion 30 shown in FIG. 8.

FIG. 9 is a cross-sectional view showing an enlarged view of the vicinity of a gate trench portion 40 and a dummy trench portion 30 shown in FIG. 8. In the present example, the gate insulating film 42 has a uniform film thickness T3. In contrast, the dummy trench insulating film 32 has a film thickness T4 at its sidewall and a film thickness T5 at its bottom portion that is greater than T4. The film thickness T5 may be two or more times greater, or three or more times greater than the film thickness T4. The film thickness T4 may be the same as the film thickness T3.

The bottom portion of the dummy trench portion 30 may have a curved-surface shape that is downwardly convex. In this case, the film thickness T5 at the bottom portion of the dummy trench insulating film 32 may adopt the film thickness at the lowest end of the convex shape. Also, the film thickness T4 at the sidewall of the dummy trench insulating film 32 may adopt the average film thickness in an area facing the base region 14.

By increasing the film thickness of the dummy trench insulating film 32 at the bottom portion of each dummy trench portion 30 in this manner, concentration of holes in the vicinity of the bottom portions of the dummy trench portions 30 can be suppressed. Therefore, formation of P-type inversion layers in the vicinity of the bottom portions of the dummy trench portions 30 can be suppressed.

As described above, a combination of the film thickness distribution of the dummy trench insulating film 32 shown in FIG. 9 and the dummy trench portion 30 formed to be shallow as shown in FIG. 6 may also be used. In this way, formation of P-type inversion layers can further be suppressed. Also, the configuration of the doping concentration distribution shown in FIG. 7 may further be combined. As shown in FIG. 9, by increasing the film thickness of the dummy trench insulating film 32 at the bottom portion of the dummy trench portion 30, it becomes easy to position the peak 19 of the doping concentration of the accumulation region 16 between the lower end 35 of the dummy conductive portion 34 and the lower end 33 of the dummy trench insulating film 32.

The lower end of the dummy trench insulating film 32 at the bottom portion of the dummy trench portion 30 of the present example is positioned below the lower end 17 of the accumulation region 16. Also, the lower end 35 of the dummy conductive portion 34 is positioned below the upper end of the accumulation region 16. The lower end 35 of the dummy conductive portion 34 may be positioned between the upper end and the lower end of the accumulation region 16. In another example, the lower end 35 of the dummy conductive portion 34 may be positioned between the upper end and the lower end of the base region 14, or may be positioned below the lower end 17 of the accumulation region 16.

Figure 10:
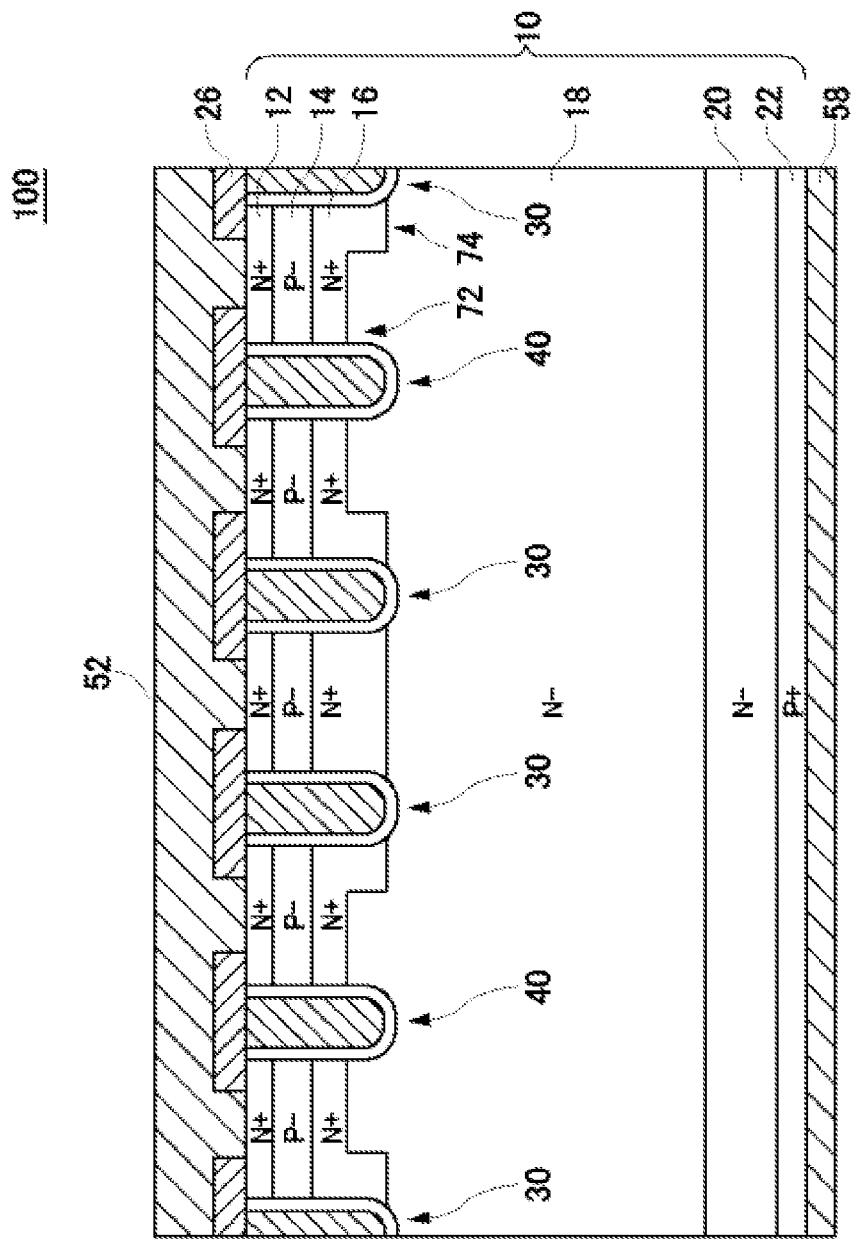
FIG. 10 shows another example of the cross section taken along a-a in FIG. 1.

FIG. 10 shows another example of the cross section taken along a-a in FIG. 1. In the present example, the semiconductor device 100 is different from the examples shown in FIG. 2 to FIG. 9 in the structure of the accumulation regions 16. Other structures may be the same as any of the examples shown in FIG. 2 to FIG. 9.

In the present example, a region of each accumulation region 16 that is adjacent to a dummy trench portion 30 is referred to as a dummy trench-adjacent region 74, and a region of each accumulation region 16 that is adjacent to a gate trench portion 40 is referred to as a gate trench-adjacent region 72. If the width of an accumulation region 16 in the Y-axis direction is referred to as W, the gate trench-adjacent region 72 and the dummy trench-adjacent region 74 may each refer to a region having a width of about W/4 from a position in contact with the corresponding trench portion.

In the present example, the integrated concentration obtained by integrating, in the depth direction of the semiconductor substrate 10, the doping concentration of the dummy trench-adjacent region 74 is higher than the integrated concentration obtained by integrating, in the depth direction, the doping concentration of the gate trench-adjacent region 72. The integrated concentration of the dummy trench-adjacent region 74 may be 1.5 or more times greater, or two or more times greater than the integrated concentration of the gate trench-adjacent region 72.

In the example shown in FIG. 10, the dummy trench-adjacent region 74 is formed to a deeper position than the gate trench-adjacent region 72. That is, the dummy trench-adjacent region 74 has a greater length in the depth direction than the gate trench-adjacent region 72. The length of the dummy trench-adjacent region 74 in the depth direction may be 1.5 or more times greater, or two or more times greater than the length of the gate trench-adjacent region 72 in the depth direction. The length of the dummy trench-adjacent region 74 in the depth direction may adopt the length of its part in contact with a dummy trench portion 30. The length of the gate trench-adjacent region 72 in the depth direction may adopt the length of its part in contact with a gate trench portion 40. In this way, the integrated concentration of the dummy trench-adjacent region 74 can be made higher than the integrated concentration of the gate trench-adjacent region 72.

By increasing the integrated concentration of a part of each accumulation region 16 adjacent to a dummy trench portion 30, concentration of holes in the vicinity of the bottom portions of the dummy trench portions 30 can be suppressed. In this way, formation of P-type inversion layers can be suppressed.

Note that, although the depth positions of the lower surfaces of the gate trench-adjacent region 72 and the dummy trench-adjacent region 74 are schematically shown as being step-wise in FIG. 10, the lower surfaces of the gate trench-adjacent region 72 and the dummy trench-adjacent region 74 may otherwise have a shape varying like a curved surface. Also, an accumulation region 16 sandwiched between dummy trench portions 30 may be formed at the same depth as the dummy trench-adjacent region 74 in its entirety.

Figure 11:
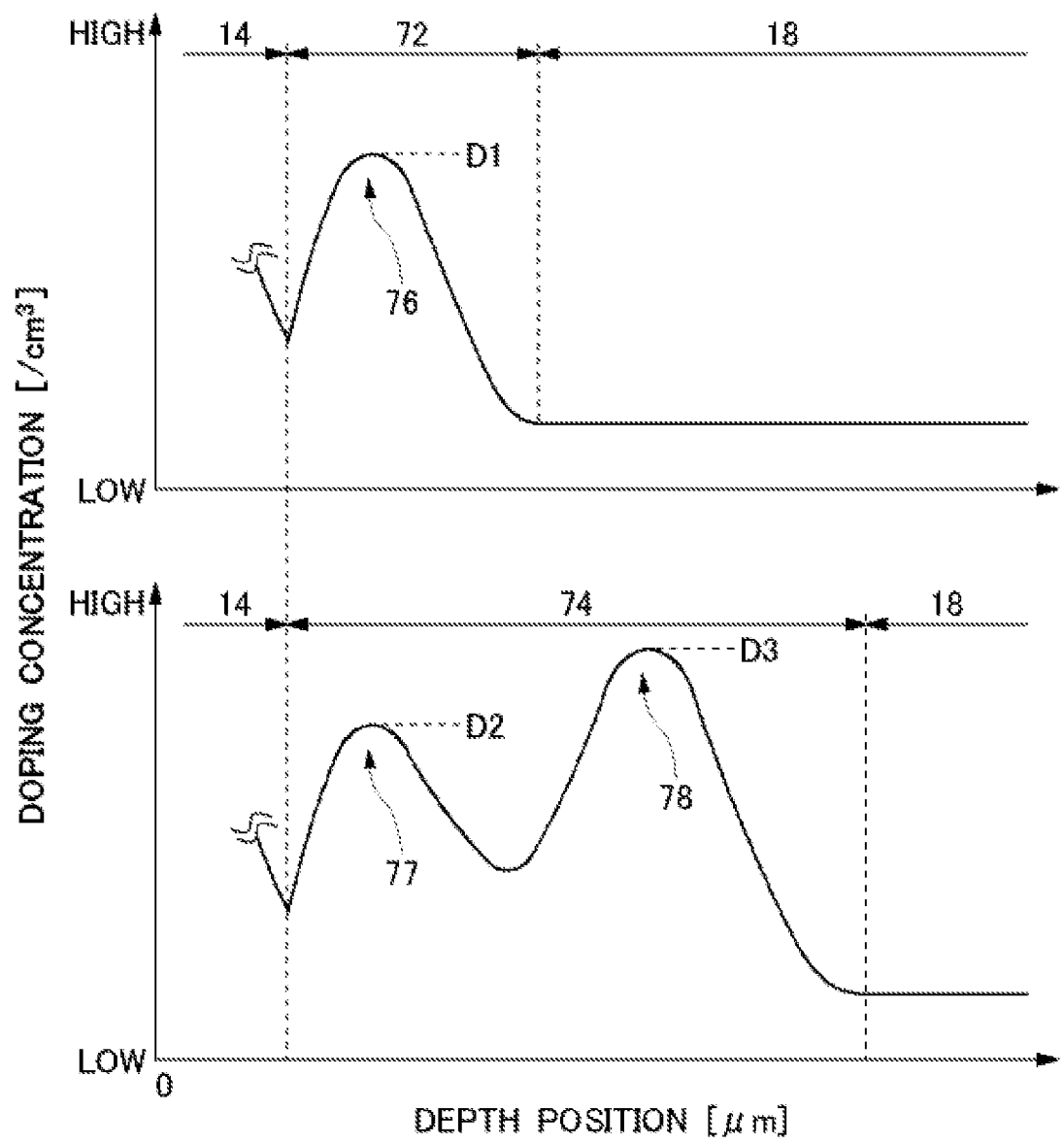
FIG. 11 shows one example of the doping concentration distributions in a gate trench-adjacent region 72 and a dummy trench-adjacent region 74 shown in FIG. 10.

FIG. 11 shows one example of the doping concentration distributions in the gate trench-adjacent region 72 and the dummy trench-adjacent region 74 shown in FIG. 10. The horizontal axis of FIG. 11 indicates positions in the depth direction based on the position of the upper surface of the semiconductor substrate 10, and the longitudinal axis indicates doping concentrations on a logarithmic scale. Note that each part in FIG. 11 shows the doping concentration distribution of a part in contact with a trench portion.

In the present example, the dummy trench-adjacent region 74 is formed to a deeper position than the gate trench-adjacent region 72. The dummy trench-adjacent region 74 of the present example has a larger number of peaks of doping concentration distribution than the gate trench-adjacent region 72 does. In the example of FIG. 11, the gate trench-adjacent region 72 has a single peak 76, and the dummy trench-adjacent region 74 has a first peak 77 and a second peak 78 positioned deeper than the first peak 77.

Each peak can be formed by implanting impurities such as proton into a plurality of depth positions while varying the stopping ranges. The peak 76 in the gate trench-adjacent region 72 and the first peak 77 in the dummy trench-adjacent region 74 may be at the same depth position. The doping concentration D1 of the peak 76 and the doping concentration D2 of the first peak 77 may also be the same.

The doping concentration D3 of the second peak 78 may be greater than either of the doping concentration D1 of the peak 76 and the doping concentration D2 of the first peak 77. By increasing the doping concentration of the second peak 78 positioned closer to the bottom portion of the dummy trench portion 30, formation of a P-type inversion layer in the vicinity of the bottom portion of the dummy trench portion 30 can be suppressed efficiently. The doping concentration D3 may be 1.5 or more times greater, or two or more times greater than the doping concentration D2.

Figure 12:
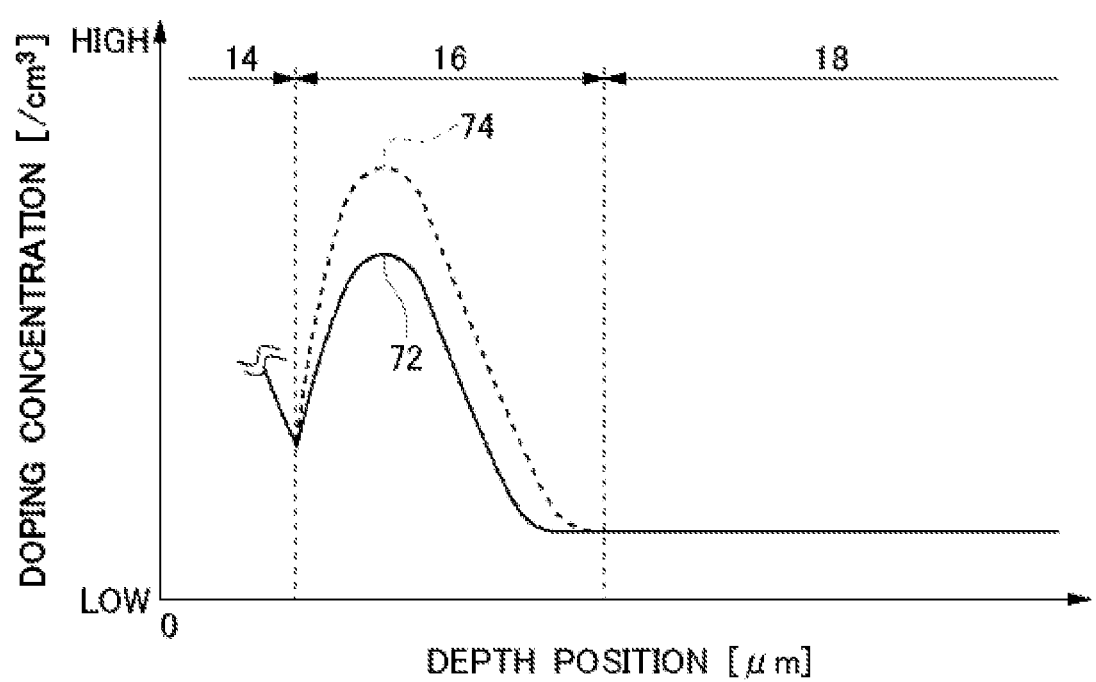
FIG. 12 shows another example of the doping concentration distributions in the gate trench-adjacent region 72 and the dummy trench-adjacent region 74.

FIG. 12 shows another example of the doping concentration distributions in the gate trench-adjacent region 72 and the dummy trench-adjacent region 74. In the present example, the dummy trench-adjacent region 74 and the gate trench-adjacent region 72 may have the same length in the depth direction. The dummy trench-adjacent region 74 of the present example has the same number of peaks of doping concentration distribution as the gate trench-adjacent region 72. In the example of FIG. 12, the gate trench-adjacent region 72 and the dummy trench-adjacent region 74 each have a single peak.

Note that the doping concentration of the peak in the dummy trench-adjacent region 74 is higher than the doping concentration of the peak in the gate trench-adjacent region 72. Such a structure can also increase the integrated concentration of the dummy trench-adjacent region 74, to suppress formation of P-type inversion layers in the vicinity of the bottom portion of the dummy trench portion 30.

The doping concentration of the peak in the dummy trench-adjacent region 74 may be 1.5 or more times greater or two or more times greater than the doping concentration of the peak in the gate trench-adjacent region 72. The peak in the dummy trench-adjacent region 74 and the peak in the gate trench-adjacent region 72 may be positioned at the same depth position.

Figure 13:
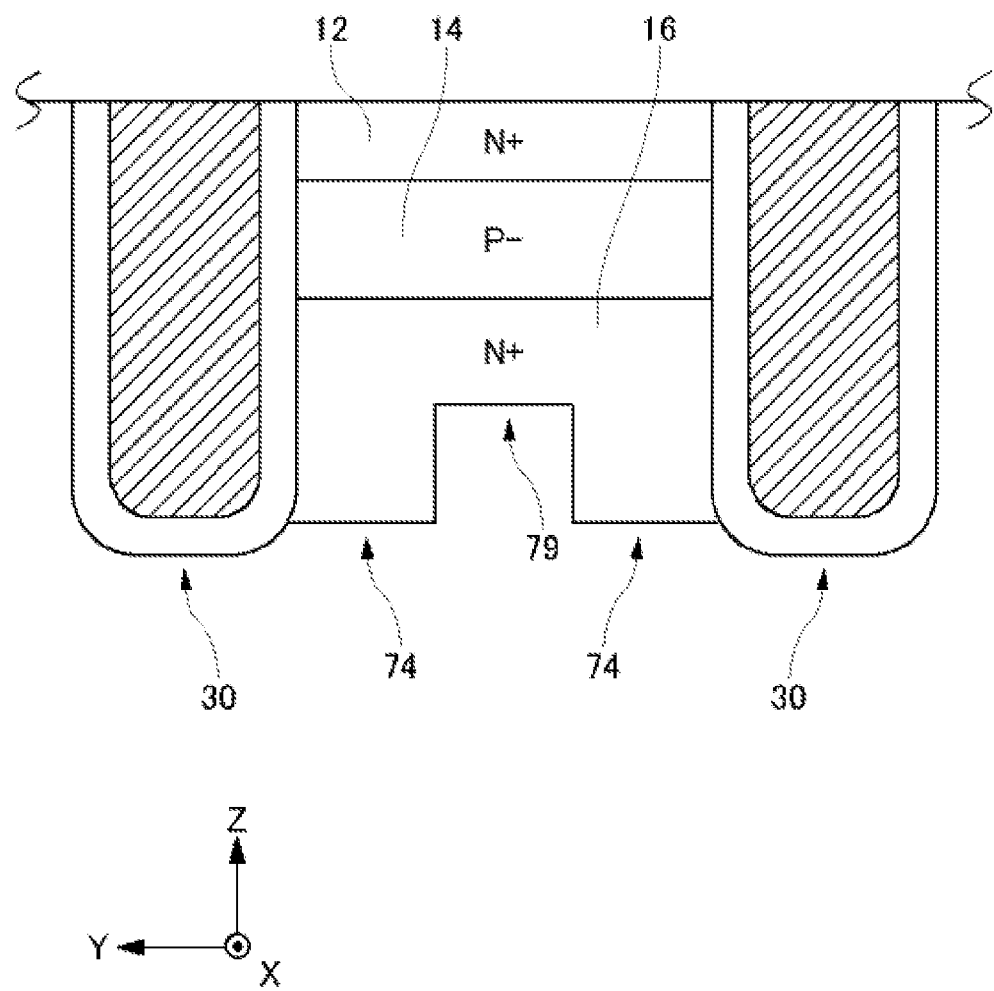
FIG. 13 shows an exemplary structure of an accumulation region 16 sandwiched between dummy trench portions 30.

FIG. 13 shows an exemplary structure of an accumulation region 16 sandwiched between dummy trench portions 30. The accumulation region 16 includes two dummy trench-adjacent regions 74 adjacent to the respective dummy trench portions 30 and a central region 79 sandwiched between the two dummy trench-adjacent regions 74. The central region 79 is positioned at the center between two dummy trench portions 30 in the Y-axis direction.

In the present example, the integrated concentration obtained by integrating, in the depth direction, the doping concentration of the central region 79 is lower than the integrated concentration of the dummy trench-adjacent region 74. The integrated concentration of the central region 79 may adopt the integrated concentration at the center between two dummy trench portions 30 in the Y-axis direction. The integrated concentration of the dummy trench-adjacent region 74 may adopt the integrated concentration of its part in contact with the dummy trench portion 30. Such a structure allows holes to be extracted to the emitter side via the central region 79 such as when turning off.

The integrated concentration of the central region 79 may be 1.5 or more times greater, or two or more times greater than the integrated concentration of the dummy trench-adjacent region 74. In the example of FIG. 13, the length of the central region 79 in the depth direction is shorter than the length of the dummy trench-adjacent region 74 in the depth direction. The length of the central region 79 may be two thirds or less, or one half or less of the length of the dummy trench-adjacent region 74. Also, the peak of the doping concentration in the central region 79 may be lower than the peak of the doping concentration in the dummy trench-adjacent region 74. The central region 79 may have the same doping concentration distribution in the depth direction as the gate trench-adjacent region 72.

Figure 14:
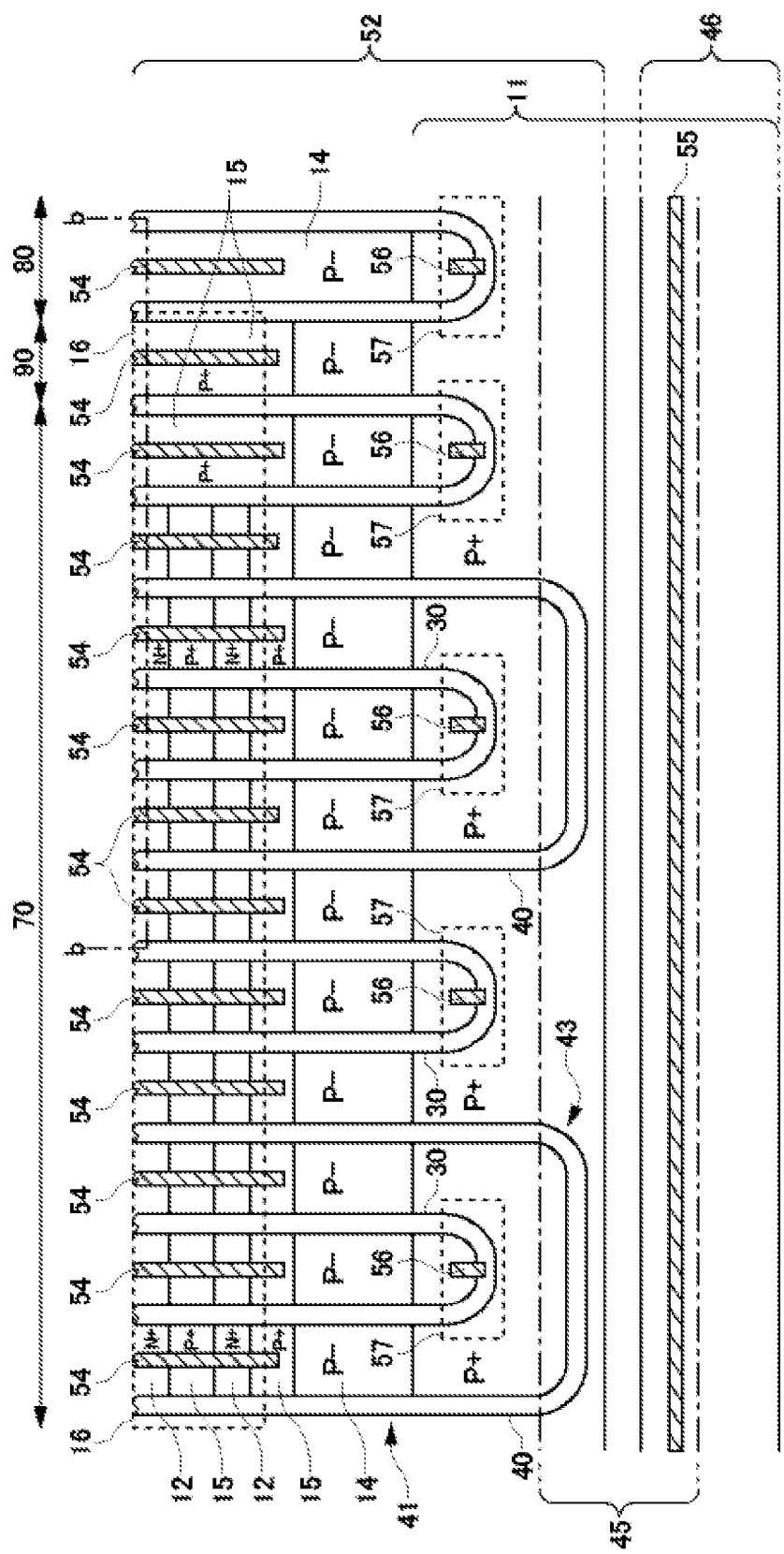
FIG. 14 shows a part of another example of the upper surface of the semiconductor device 100.

FIG. 14 shows a part of another example of the upper surface of the semiconductor device 100. The semiconductor device 100 of the present example includes a transistor section 70 including a transistor such as an IGBT and a diode section 80 including a diode such as an FWD (Free Wheel Diode), provided on a semiconductor substrate 10. A boundary section 90 is provided between the transistor section 70 and the diode section 80 in the upper surface of the semiconductor substrate 10. The structure of the transistor section 70 may be the same as that of any of the semiconductor devices 100 described in FIG. 1 to FIG. 13.

One or more dummy trench portions 30 are arrayed along the Y-axis direction in each of the diode section 80 and the boundary section 90. The dummy trench portions 30 in the diode section 80 and the boundary section 90 may have the same shape and structure as the dummy trench portions 30 in the transistor section 70.

A base region 14 is formed in each mesa portion of the diode section 80 and the boundary section 90. In a mesa portion of the boundary section 90, a contact region 15 is selectively formed in a partial region of the base region 14. The contact region 15 of the boundary section 90 is one example of a second conductivity-type high concentration region. In the boundary section 90, the contact region 15 may be formed in a region facing emitter regions 12 and contact regions 15 of the transistor section 70 that are adjacent thereto across a dummy trench portion 30. The contact region 15 in the boundary section 90 is electrically connected to the emitter electrode 52 via a contact hole 54.

Although an emitter region 12 and a contact region 15 are not formed in a mesa portion of the diode section 80 in the example of FIG. 14, at least one of an emitter region 12 and a contact region 15 may be formed in the mesa portion. The base region 14 of the diode section 80 is connected to the emitter electrode 52 via a contact hole 54.

In the diode section 80 and the boundary section 90, each contact hole 54 is formed above the contact region 15 and the base region 14. In the present example, contact holes 54 of the transistor section 70, the diode section 80 and the boundary section 90 have the same length in the longitudinal direction of each trench portion.

Note that the diode section 80 is a region overlapping with a cathode region 82 in the direction perpendicular to the lower surface of the semiconductor substrate 10. Also, the transistor section 70 is a region which is a part of a region overlapping with the collector region 22 in the direction perpendicular to the lower surface of the semiconductor substrate 10 and in which predetermined unit arrangements including emitter regions 12 and contact regions 15 are regularly arranged. Also, the boundary section 90 is a region which is a part of the region overlapping with the collector region 22 in the direction perpendicular to the lower surface of the semiconductor substrate 10 and in which the predetermined unit arrangements including emitter regions 12 and contact regions 15 are not regularly arranged.

Figure 15:
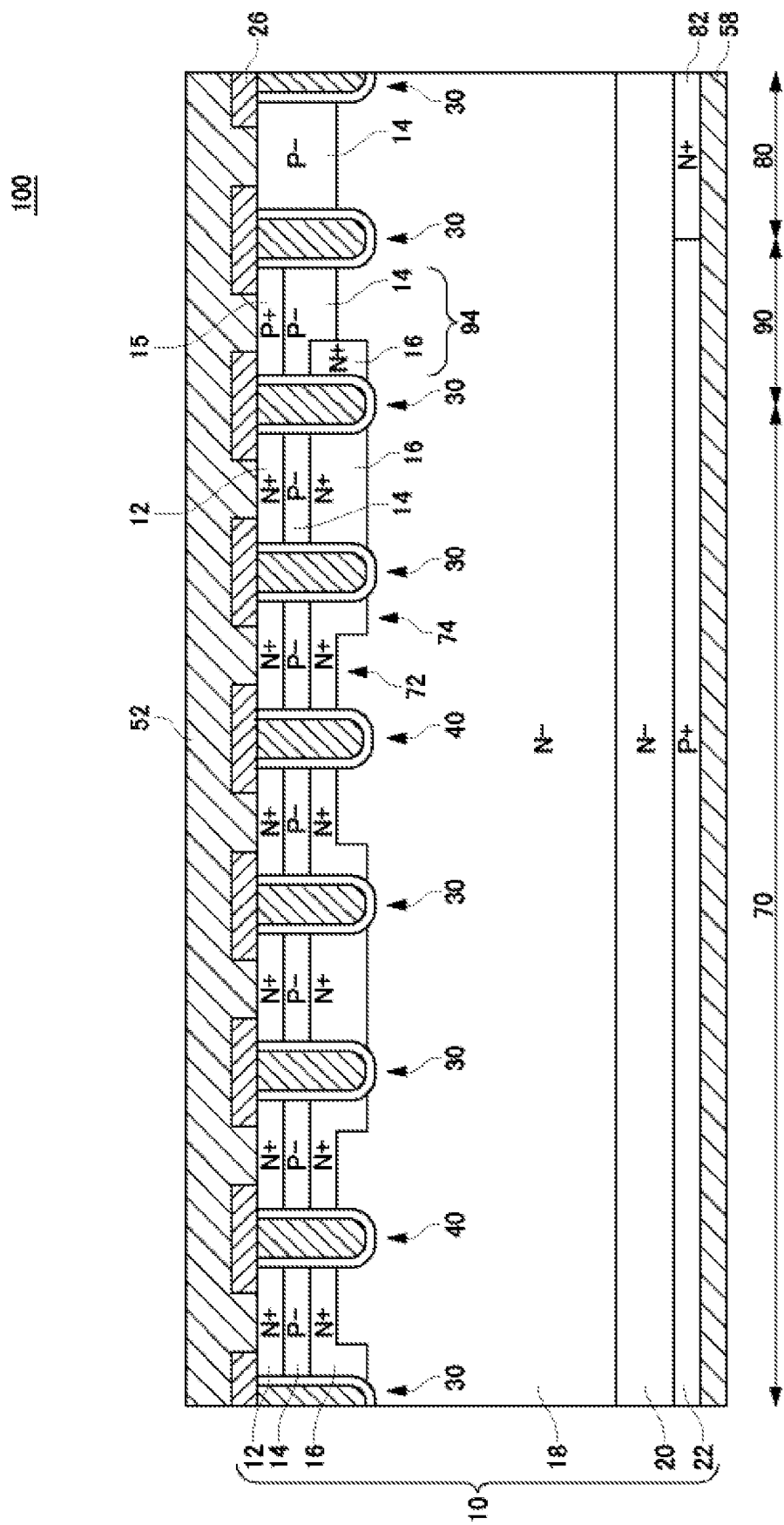
FIG. 15 shows one example of the cross section taken along b-b of the semiconductor device 100 shown in FIG. 14.

FIG. 15 shows one example of the cross section taken along b-b of the semiconductor device 100 shown in FIG. 14. The cross section taken along b-b is a cross section that is in parallel with the Y-Z plane and passes through the emitter region 12 of the transistor section 70, the contact region 15 of the boundary section 90 and the base region 14 of the diode section 80. The structure of the transistor section 70 may be the same as that of any of the semiconductor devices 100 described in FIG. 1 to FIG. 13. The transistor section 70 shown in FIG. 15 has the same structure as that of the semiconductor device 100 shown in FIG. 10.

A region sandwiched between trench portions is referred to as a mesa portion 94. Although only a mesa portion 94 of the boundary section 90 is numbered in FIG. 15, regions sandwiched between trench portions in the transistor section 70 and the diode section 80 is also referred to as mesa portions 94.

In the present example, the transistor section 70 refers to a region in which emitter regions 12 are provided in mesa portions 94 at the upper surface side of the semiconductor substrate 10 and a collector region 22 is provided at the lower surface side of the semiconductor substrate 10. Also, the boundary section 90 refers to a region in which an emitter region 12 is not provided in a mesa portion 94 at the upper surface side of the semiconductor substrate 10 and the collector region 22 is provided at the lower surface side of the semiconductor substrate 10. In the mesa portion 94 of the boundary section 90 of the present example, a contact region 15 and a base region 14 are provided in this order from the upper surface side of the semiconductor substrate 10.

The diode section 80 refers to a region in which a first conductivity-type cathode region 82 is provided at the lower surface side of the semiconductor substrate 10. The cathode region 82 of the present example is of $N^+$-type. In the example shown in FIG. 15, in the mesa portion 94 of the diode section 80, a base region 14 is formed and an emitter region 12 is not formed. The cathode region 82 in the diode section 80 of the present example is formed at the same depth position as the collector region 22. A buffer region 20 may be formed above the cathode region 82.

The transistor section 70 and the diode section 80 have different layer structures including p-n junction, and therefore the electric field distribution tends to be unbalanced. Therefore, if carriers are accumulated in the vicinity of the boundary between the transistor section 70 and the diode section 80, the avalanche capability of the semiconductor device 100 decreases. By providing the boundary section 90 in the semiconductor device 100, it becomes easy to extract carriers (holes for example) to the emitter electrode 52 between the transistor section 70 and the diode section 80. Therefore, the avalanche capability of the semiconductor device 100 can be improved. Also, since the distance between the transistor section 70 and the cathode region 82 can be increased, carrier implantation from the transistor section 70 into the diode section 80 such as when the semiconductor device 100 is in the ON state or is turned off can be suppressed.

The accumulation region 16 may not be formed in at least a partial region of the mesa portion 94 of the boundary section 90. That is, the accumulation region 16 may be selectively formed or may not be formed at all below the base region 14 in the mesa portion 94 of the boundary section 90. If the accumulation region 16 is selectively formed, it is preferable that the accumulation region 16 is formed adjacent to a dummy trench portion 30 that is one of dummy trench portions 30 sandwiching the mesa portion 94 and is closer to the transistor section 70. In this way, formation of a P-type inversion layer at the bottom portion of a dummy trench portion 30 close to the transistor section 70 can be suppressed, and the influence on the operation of the transistor section 70 can be reduced.

Figure 16A:
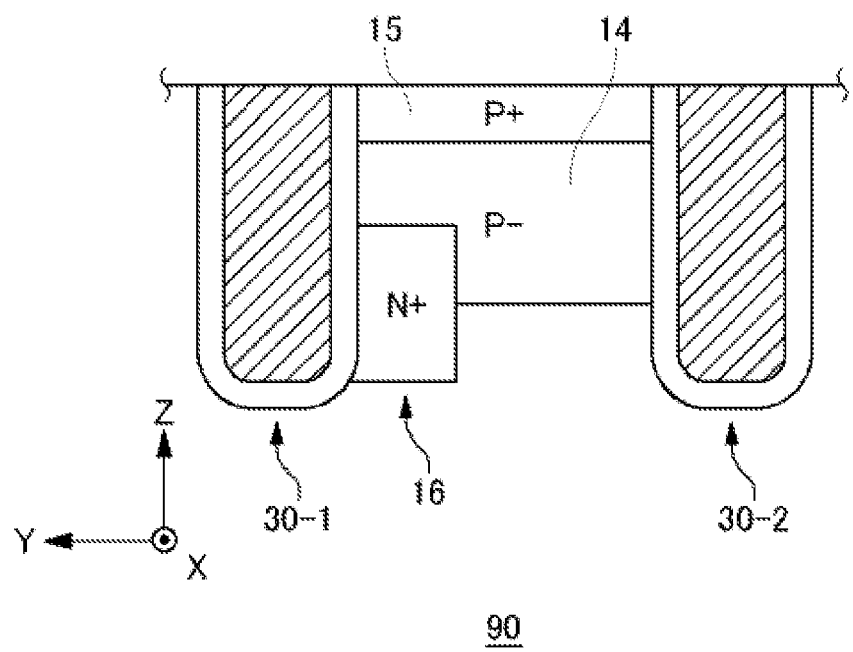
FIG. 16A shows one example of a mesa portion 94 of a boundary section 90.

FIG. 16A shows one example of the mesa portion 94 of the boundary section 90. In the present example, one of dummy trench portions 30 sandwiching the mesa portion 94 that is closer to the transistor section 70 is referred to as a dummy trench portion 30-1, and the other one closer to the diode section 80 is referred to as a dummy trench portion 30-2. In the mesa portion 94 of the present example, an accumulation region 16 is formed in a region adjacent to the dummy trench portion 30-1, and the accumulation region 16 is not formed in a region adjacent to the dummy trench portion 30-2.

Such a structure allows holes to be easily extracted via the mesa portion 94 while suppressing formation of an inversion layer of holes at the bottom portion of the dummy trench portion 30-1. Also, since the accumulation region 16 is not provided in a region adjacent to the dummy trench portion 30-2, even if the semiconductor device 100 is miniaturized and the width of the mesa portion 94 is made smaller, a region in which the accumulation region 16 is not provided can easily be left. The width, in the Y-axis direction, of the accumulation region 16 in the mesa portion 94 of the boundary section 90 may be one half or less, or one third or less of the width of the mesa portion 94.

Figure 16B:
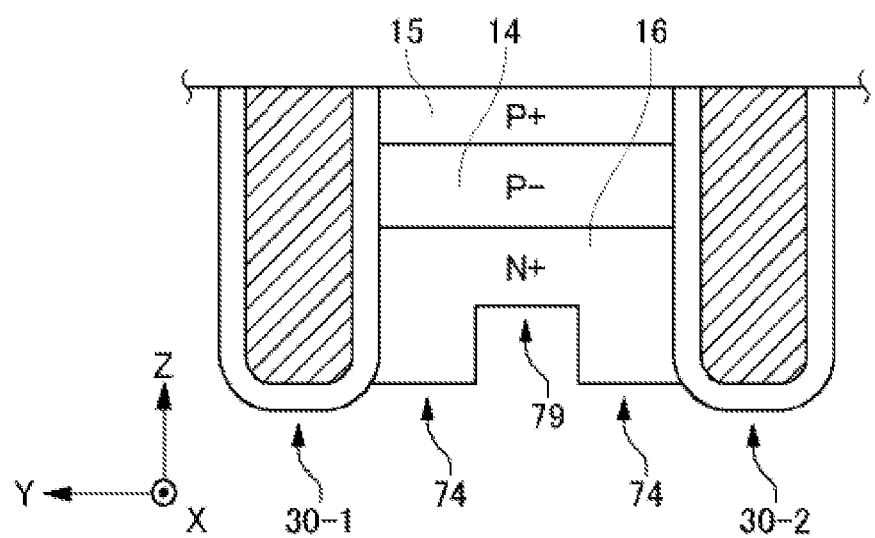
FIG. 16B shows another example of the mesa portion 94 of the boundary section 90.

FIG. 16B shows another example of the mesa portion 94 of the boundary section 90. The accumulation region 16 in the mesa portion 94 of the present example has a similar shape to the accumulation region 16 shown in FIG. 13. In the mesa portion 94 of the boundary section 90 of the present example, the accumulation region 16 is formed to cover the entire lower surface of the base region 14. Note that the accumulation region 16 has a dummy trench-adjacent region 74 for each of the dummy trench portion 30-1 and the dummy trench portion 30-2. Also, the accumulation region 16 has a central region 79 in a region which is at the center of the mesa portion 94 in the Y-axis direction.

The dummy trench-adjacent region 74 and the central region 79 are the same as the dummy trench-adjacent region 74 and the central region 79 shown in FIG. 13. That is, the integrated concentration of the dummy trench-adjacent region 74 is higher than the integrated concentration of the central region 79. The dummy trench-adjacent region 74 in the example of FIG. 16B is formed to a lower position than the central region 79. The accumulation region 16 has two dummy trench-adjacent regions 74 and may not have the central region 79. In this case, at least one of the base region 14 and the drift region 18 is formed in the region in which the central region 79 is provided in FIG. 16B.

Such a structure can also suppress formation of an inversion layer in the dummy trench portion 30 of the boundary section 90. Also, by reducing the integrated concentration of impurities in the vicinity of the center of the mesa portion 94, it becomes easy to extract carriers in the boundary section 90.

Figure 16C:
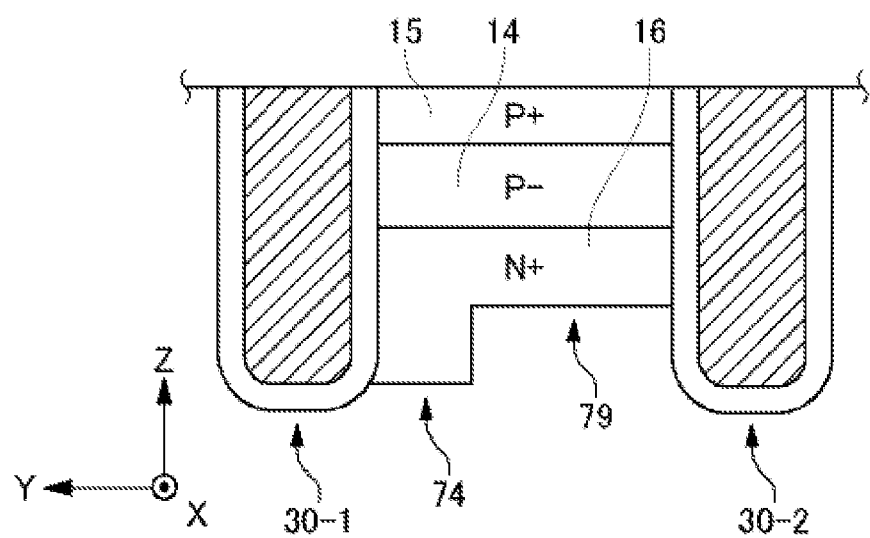
FIG. 16C shows another example of the mesa portion 94 of the boundary section 90.

FIG. 16C shows another example of the mesa portion 94 of the boundary section 90. The accumulation region 16 in the mesa portion 94 of the present example has a dummy trench-adjacent region 74 adjacent to the dummy trench portion 30-1, and does not have a dummy trench-adjacent region 74 in a region adjacent to the dummy trench portion 30-2. The central region 79 extends to a region adjacent to the dummy trench portion 30-2. Such a structure allows holes to be easily extracted via the mesa portion 94 while suppressing formation of an inversion layer at the bottom portion of the dummy trench portion 30-1.

Figure 16D:
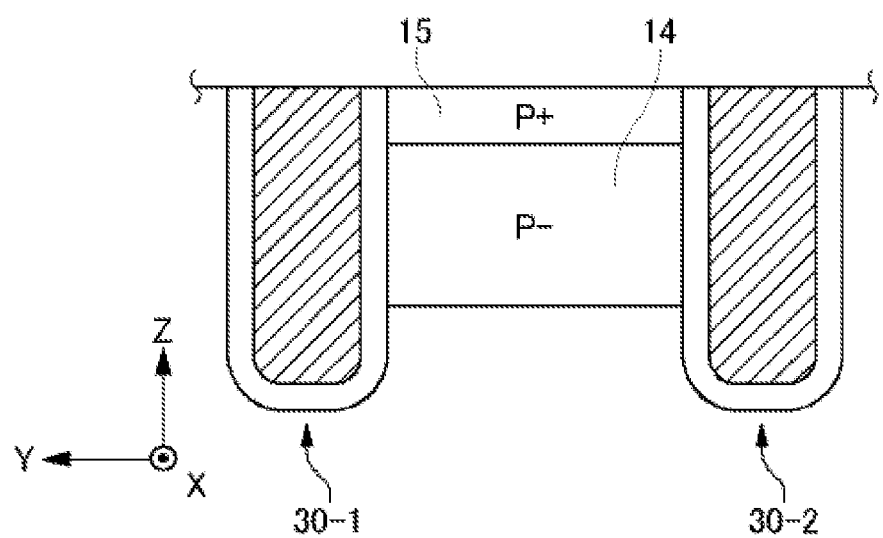
FIG. 16D shows another example of the mesa portion 94 of the boundary section 90.

FIG. 16D shows another example of the mesa portion 94 of the boundary section 90. In the present example, the accumulation region 16 is not provided in the mesa portion 94 of the boundary section 90. Such a structure allows holes to be easily extracted in the boundary section 90.

Figure 17:
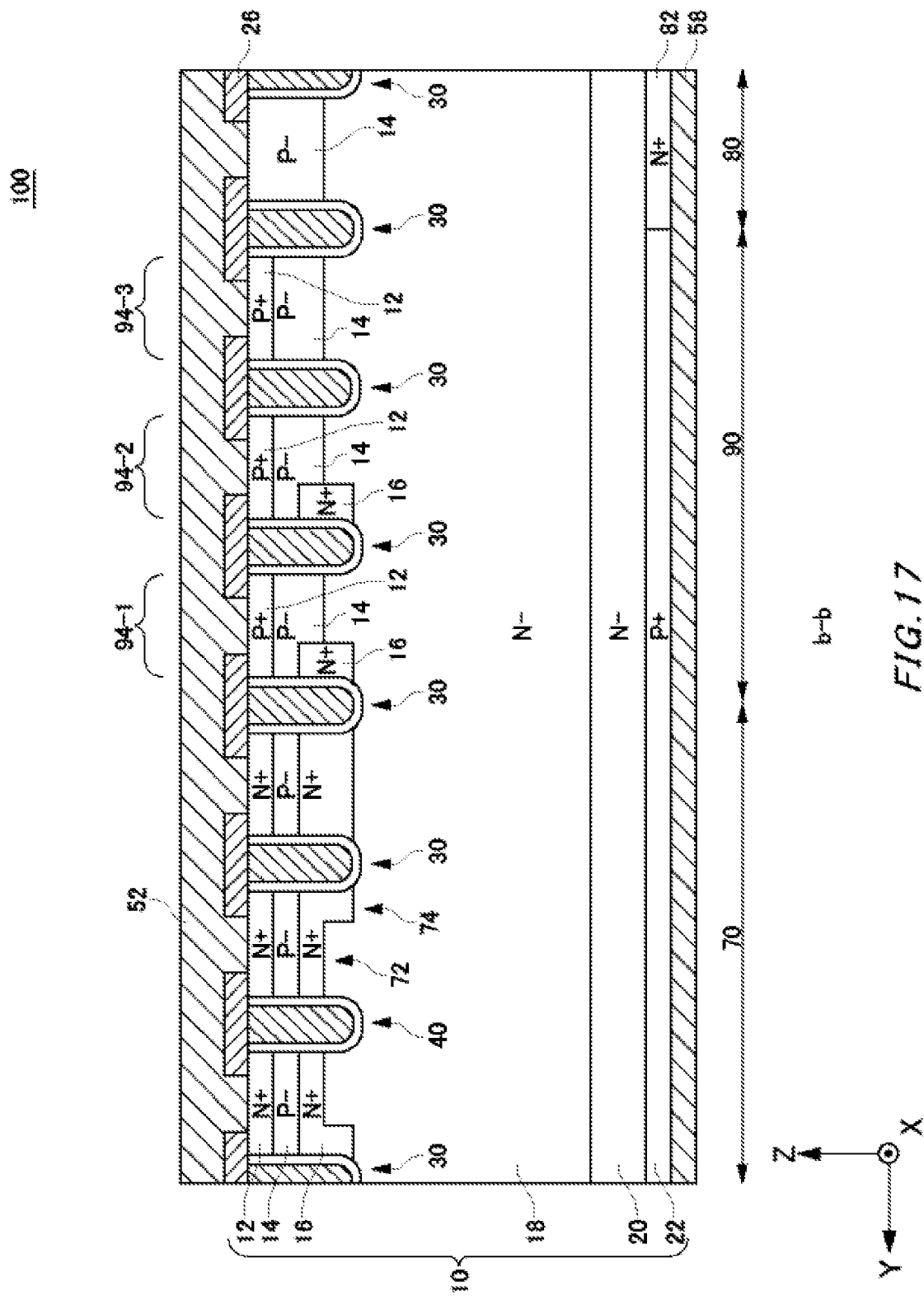
FIG. 17 shows another example of the cross section taken along b-b of the semiconductor device 100.

FIG. 17 shows another example of the cross section taken along b-b of the semiconductor device 100. The boundary section 90 of the present example has a plurality of mesa portions 94. Each mesa portion 94 may have any of the structures described in FIG. 16A to FIG. 16D. An accumulation region 16 provided in any of the mesa portions 94 may have a smaller width in the Y-axis direction than that of a mesa portion 94 closer to the transistor section 70. As one example, the width of the accumulation region 16 in the mesa portion 94-3 adjacent to the diode section 80 (which is zero in the example of FIG. 17) is smaller than the width of the accumulation region 16 in the mesa portion 94-1 adjacent to the transistor section 70.

Such a structure can suppress formation of an inversion layer at the bottom portion of the dummy trench portion 30 in a mesa portion 94 in the vicinity of the transistor section 70. Also, carriers can be efficiently extracted in a mesa portion 94 away from the transistor section 70.

Note that, in each example shown in FIG. 15 to FIG. 17, the doping concentration of an accumulation region 16 in the boundary section 90 may be higher than the doping concentration of the accumulation region 16 at the Y-axis direction center of the transistor section 70. The doping concentration of an accumulation region 16 may be a peak concentration. In this way, the carrier accumulation in regions of the transistor section 70 away from the boundary section 90 is reduced, making it easy to extract carriers via the boundary section 90.

Figure 18:
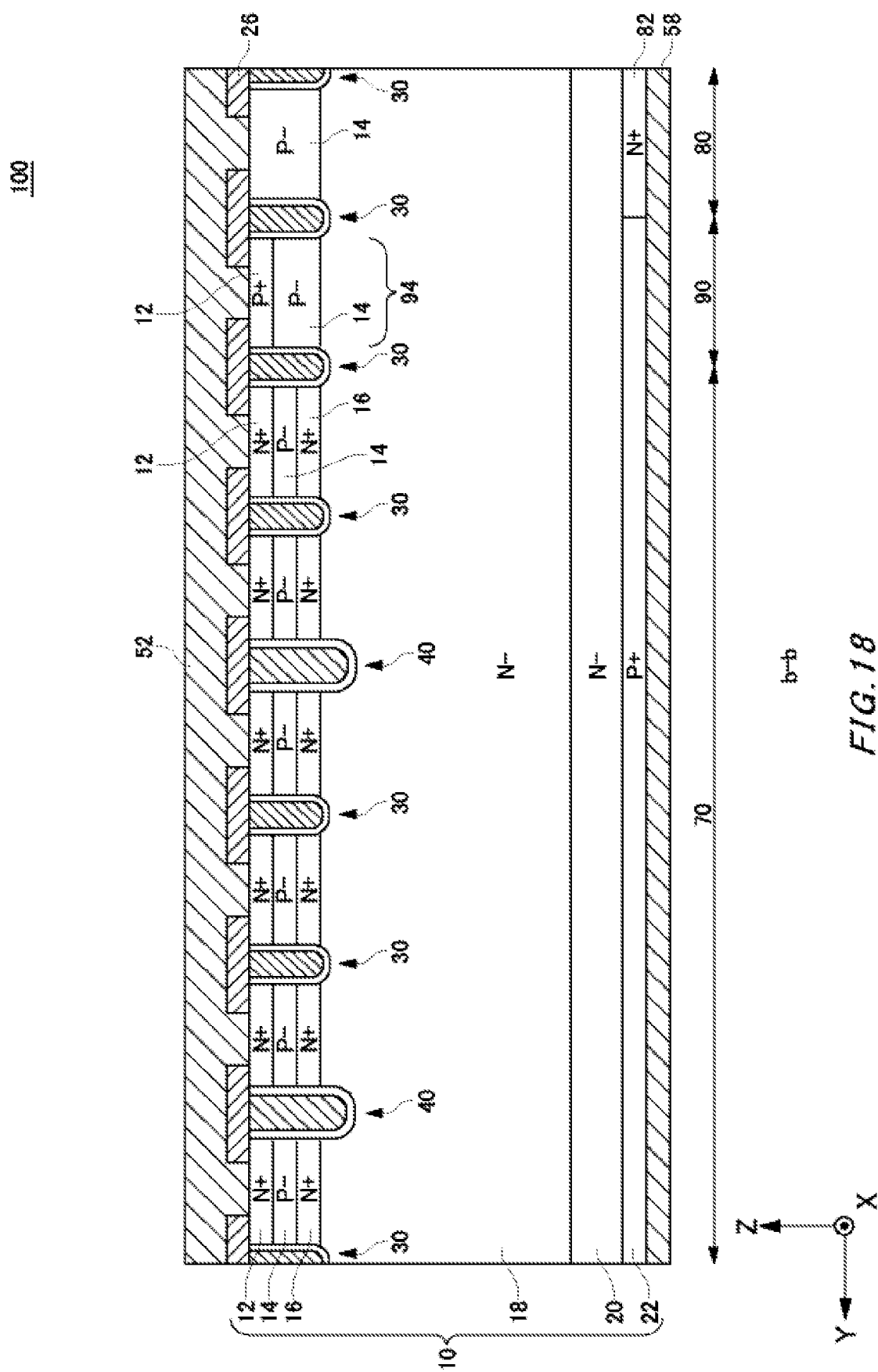
FIG. 18 shows another example of the cross section taken along b-b of the semiconductor device 100.

FIG. 18 shows another example of the cross section taken along b-b of the semiconductor device 100. The transistor section 70 of the present example has the same structure as that of the semiconductor device 100 shown in FIG. 6. That is, the dummy trench portions 30 in the transistor section 70 are formed to be shallower than the gate trench portions 40.

In the present example, at least some of the dummy trench portions 30 in the boundary section 90 and the diode section 80 are also formed to be shallower than the gate trench portions 40. In the example of FIG. 18, all of the dummy trench portions 30 in the boundary section 90 and the diode section 80 are formed to be shallower than the gate trench portions 40. The dummy trench portions 30 in the boundary section 90 and the diode section 80 may be formed to the same depth as the dummy trench portions 30 of the transistor section 70.

Figure 19A:
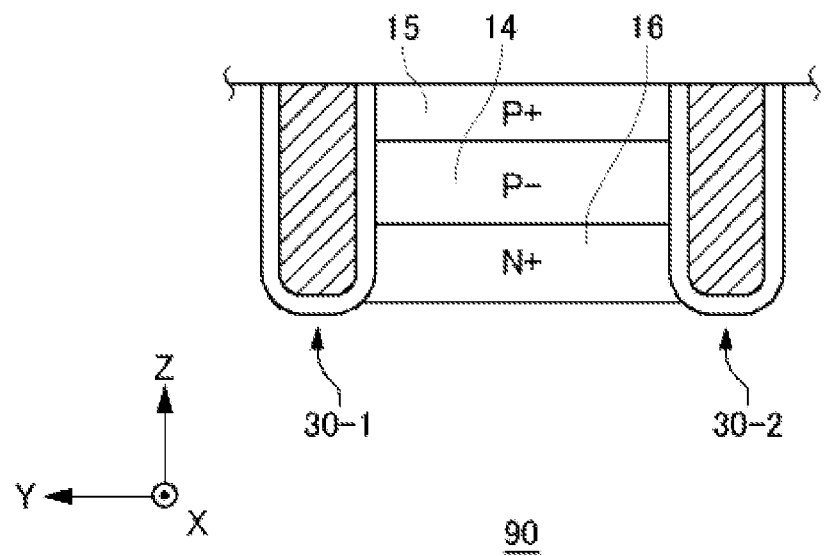
FIG. 19A shows one example of a mesa portion 94 of a boundary section 90.

FIG. 19A shows one example of the mesa portion 94 of the boundary section 90. The dummy trench portion 30-1 and the dummy trench portion 30-2 of the present example are formed to be shallower than the gate trench portions 40. In the mesa portion 94 of the present example, the accumulation region 16 is formed to cover the entire lower surface of the base region 14. Such a structure can suppress formation of inversion layers at the bottom portions of dummy trench portion 30-1 and dummy trench portion 30-2.

Figure 19B:
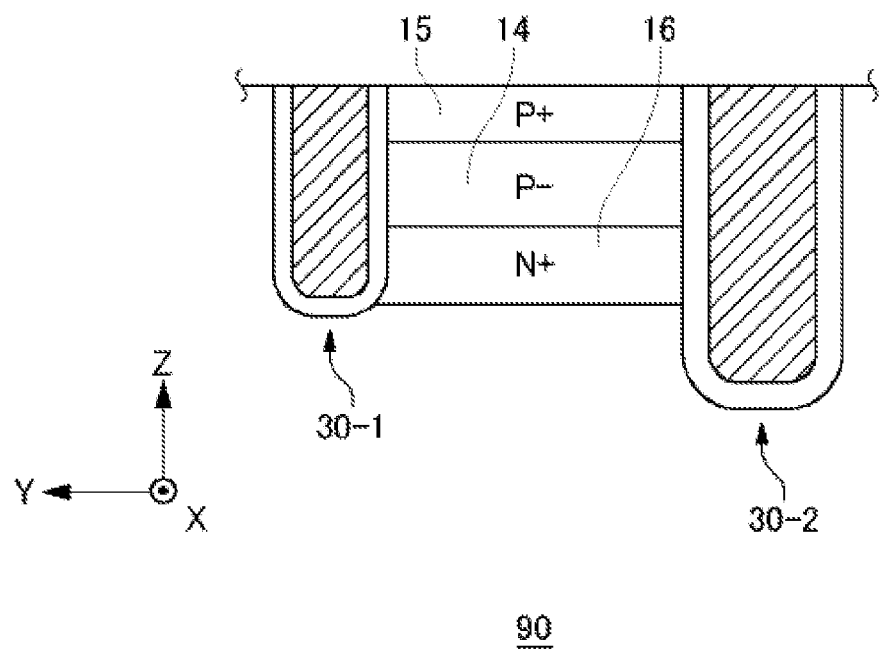
FIG. 19B shows another example of the mesa portion 94 of the boundary section 90.

FIG. 19B shows another example of the mesa portion 94 of the boundary section 90. The boundary section 90 of the present example is the same as the boundary section 90 shown in FIG. 19A, except that the dummy trench portion 30-2 is formed to be deeper than the dummy trench portion 30-1. The dummy trench portion 30-2 may be formed to the same depth as the gate trench portions 40. Note that, the deeper each trench portion is formed to be, the greater its width in the Y-axis direction is. Such a structure can also suppress formation of inversion layers at the bottom portions of dummy trench portion 30-1 and dummy trench portion 30-2.

Figure 19C:
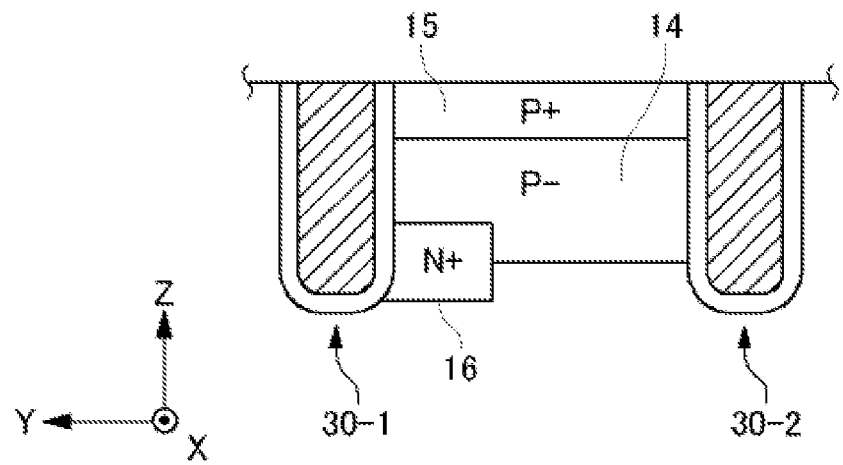
FIG. 19C shows another example of the mesa portion 94 of the boundary section 90.

FIG. 19C shows another example of the mesa portion 94 of the boundary section 90. The boundary section 90 of the present example is the same as the boundary section 90 shown in FIG. 19A, except that the accumulation region 16 is selectively formed. The accumulation region 16 of the present example is formed in a region adjacent to the dummy trench portion 30-1, and not formed in a region adjacent to the dummy trench portion 30-2. Such a structure can suppress formation of an inversion layer at the bottom portion of the dummy trench portion 30-1 and make it easy to extract carriers in the boundary section 90.

Figure 19D:
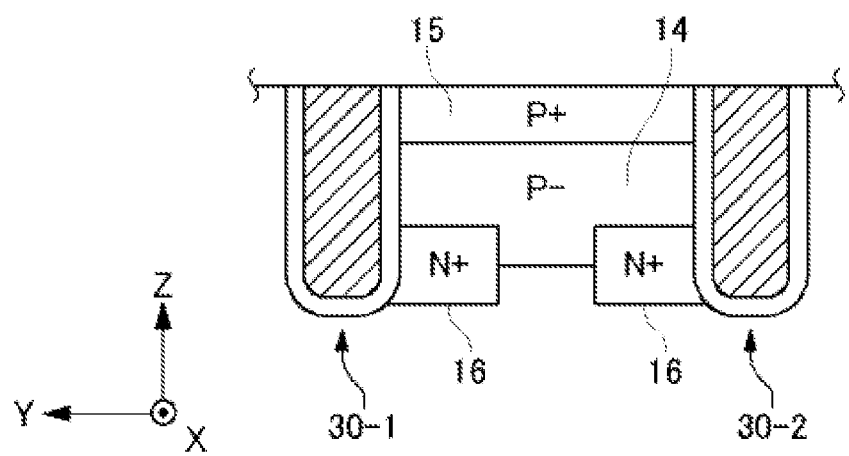
FIG. 19D shows another example of the mesa portion 94 of the boundary section 90.

FIG. 19D shows another example of the mesa portion 94 of the boundary section 90. The boundary section 90 of the present example is the same as the boundary section 90 shown in FIG. 19C, except that the accumulation region 16 is also formed in a region adjacent to the dummy trench portion 30-2. The accumulation region 16 is not formed in a region in the vicinity of the center of the mesa portion 94 in the Y-axis direction. Such a structure can suppress formation of an inversion layer at the bottom portion of each dummy trench portion 30 and make it easy to extract carriers in the boundary section 90.

Figure 19E:
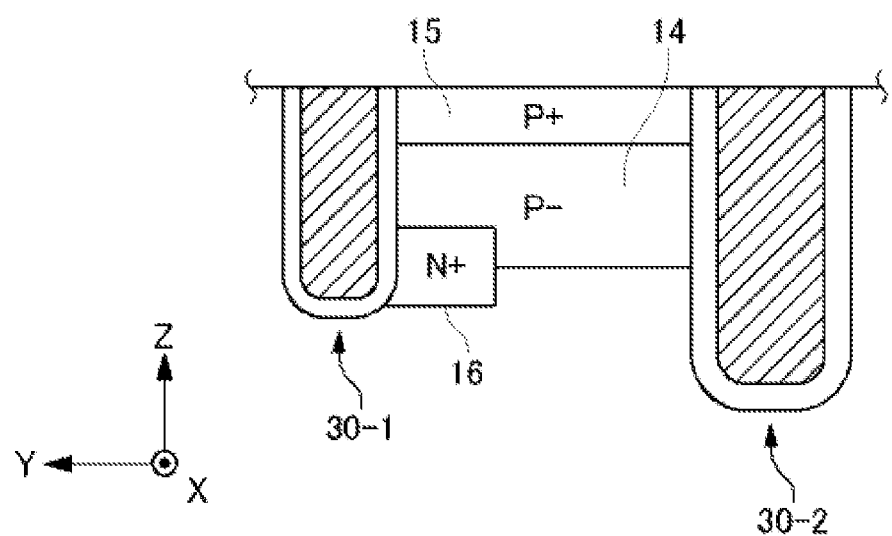
FIG. 19E shows another example of the mesa portion 94 of the boundary section 90.

FIG. 19E shows another example of the mesa portion 94 of the boundary section 90. The boundary section 90 of the present example is the same as the boundary section 90 shown in FIG. 19C, except that the dummy trench portion 30-2 is formed to be deeper than the dummy trench portion 30-1. Such a structure can also suppress formation of an inversion layer at the bottom portion of the dummy trench portion 30-1 and make it easy to extract carriers in the boundary section 90.

Figure 19F:
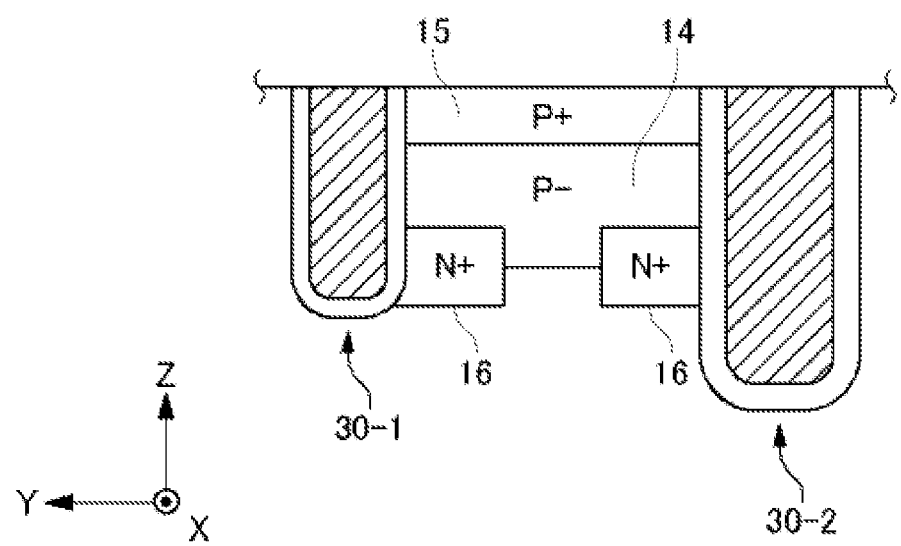
FIG. 19F shows another example of the mesa portion 94 of the boundary section 90.

FIG. 19F shows another example of the mesa portion 94 of the boundary section 90. The boundary section 90 of the present example is the same as the boundary section 90 shown in FIG. 19D, except that the dummy trench portion 30-2 is formed to be deeper than the dummy trench portion 30-1. Such a structure can also suppress formation of an inversion layer at the bottom portion of each dummy trench portion 30 and make it easy to extract carriers in the boundary section 90. Note that the mesa portion 94 of the boundary section 90 may have the same structure as any of the examples shown in FIG. 16A to FIG. 16D. Also, each of the examples shown in FIG. 19A to FIG. 19F may also be applied to the semiconductor device 100 shown in FIG. 14.

Figure 20:
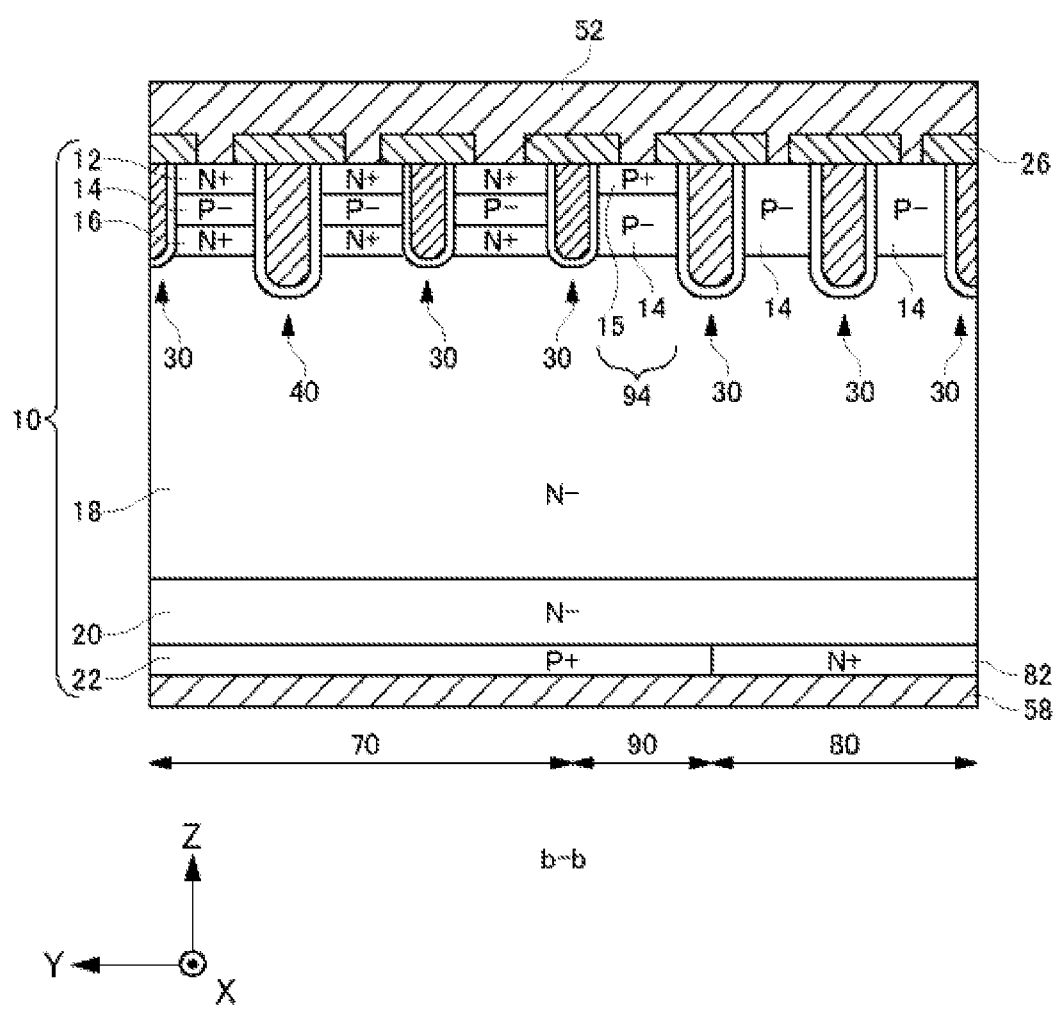
FIG. 20 shows another example of the cross section taken along b-b of the semiconductor device 100.

FIG. 20 shows another example of the cross section taken along b-b of the semiconductor device 100. In the semiconductor device 100 of the present example, dummy trench portions 30 provided in the diode section 80 have a greater width in the Y-axis direction and a deeper depth in the Z-axis direction than dummy trench portions 30 provided in the transistor section 70. Other structures are the same as those in any of the semiconductor devices 100 described in FIG. 14 to FIG. 19F. Note that pitches at which the trench portions are arrayed are uniform.

Such a structure allows for a smaller width of the mesa portion 94 in the diode section 80. Therefore, the carrier implantation into the mesa portion 94 can be suppressed. The dummy trench portions 30 in the diode section 80 may have the same width as the gate trench portions 40. Note that, even if the dummy trench portions 30 in the diode section 80 is formed to be deep and formation of inversion layers of holes at their bottom portions is facilitated, they are away from the transistor section 70 and therefore the influence on the operation of the semiconductor device 100 is little.

Figure 21A:
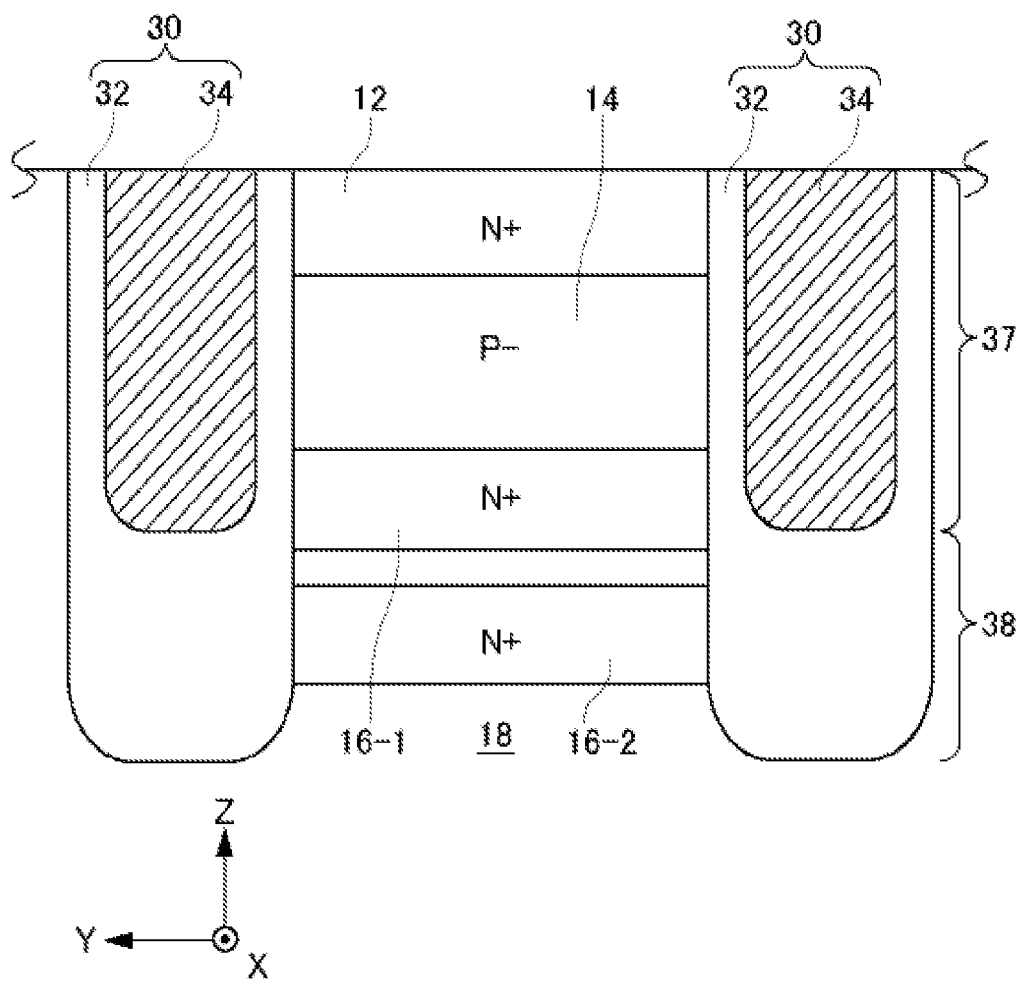
FIG. 21A shows one example of a trench portion.

FIG. 21A shows one example of a trench portion. In the present example, a dummy trench portion 30 includes a trench thin-film portion 37 and a trench thick-film portion 38. Two accumulation regions, that is, an accumulation region 16-1 and an accumulation region 16-2 are formed below the base region 14. The accumulation region 16-1 is one example of a first accumulation region provided below the base region 14, and the accumulation region 16-2 is one example of a second accumulation region provided between the accumulation region 16-1 and the drift region 18.

The trench thin-film portion 37 has a dummy trench insulating film 32 having a predetermined film thickness on the inner wall of the trench portion. Also, the trench thin-film portion 37 has a dummy conductive portion 34 covered by the dummy trench insulating film 32 in the dummy trench portion 30. The lower end of the trench thin-film portion 37 is formed deeper than the lower end of the base region 14. In the present example, the lower end of the trench thin-film portion 37 is positioned at the same depth as at least a part of a region in which the accumulation region 16-1 is formed.

In the trench thin-film portion 37, the dummy conductive portion 34 has a uniform width in the Y-axis direction. That is, the lower end of the trench thin-film portion 37 corresponds to the lower end of the dummy conductive portion 34.

The trench thick-film portion 38 has a dummy trench insulating film 32 having a greater film thickness than the trench thin-film portion 37 on the inner wall of the trench portion. The dummy conductive portion 34 is provided in the trench thin-film portion 37, but not provided in the trench thick-film portion 38. The trench thick-film portion 38 is formed at a deeper position than the base region 14. By providing the trench thick-film portion 38, capacitance between the dummy conductive portion 34 and the drift region 18 can be reduced, and the number of holes concentrating in the vicinity of the bottom portion of the dummy trench portion 30 can be decreased. In this manner, formation of a P-type inversion layer in the vicinity of the bottom portion of the dummy trench portion 30 can be suppressed. Thus, the turn-on loss is reduced.

In the present example, a plurality of accumulation regions 16 are formed in a mesa portion 94 between dummy trench portions 30, and therefore extraction of carriers via P-type inversion layers at the bottom portions of the dummy trench portions 30 when turned on can be suppressed. Also, increase in the turn-on loss can be reduced while maintaining reduction of the Von voltage due to miniaturization.

Figure 21B:
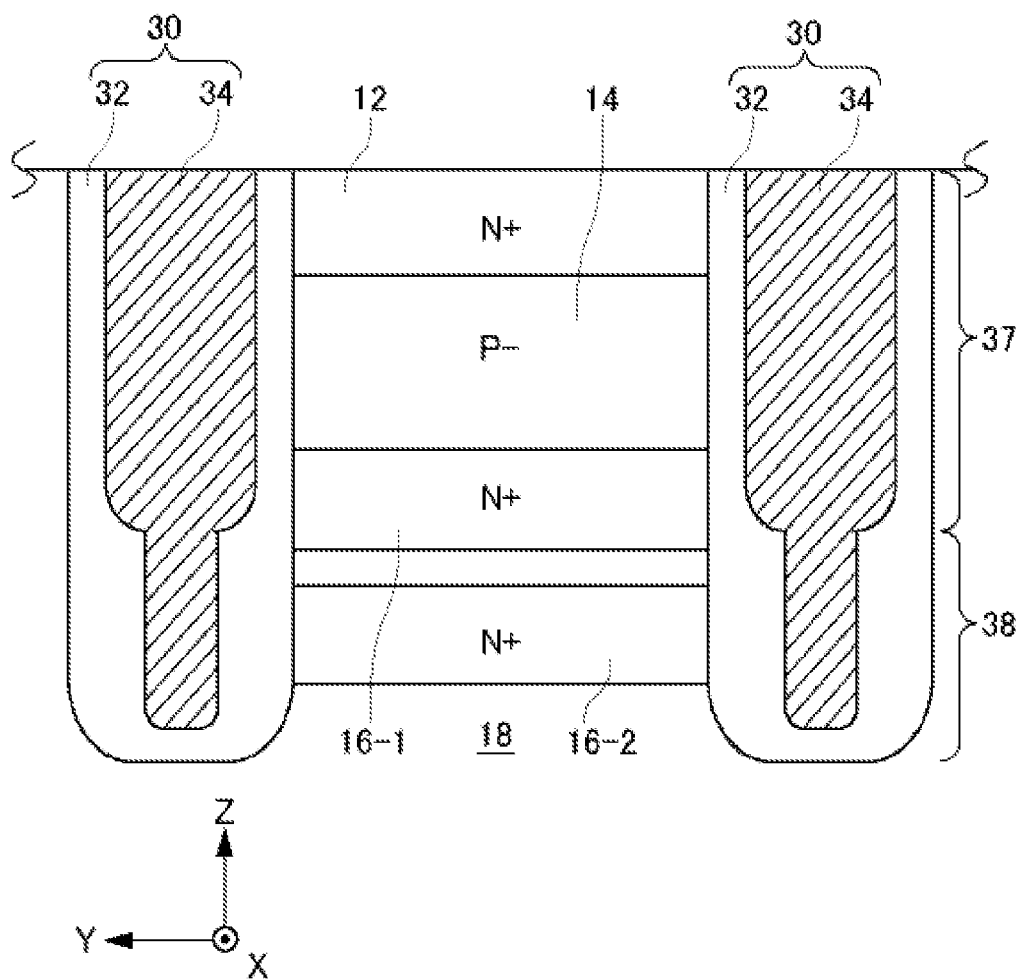
FIG. 21B shows another example of a trench portion.

FIG. 21B shows another example of a trench portion. The present example is different from the case of FIG. 21A in that the dummy conductive portion 34 is provided in both of the trench thin-film portion 37 and the trench thick-film portion 38.

The width, in the Y-axis direction, of the dummy conductive portion 34 in the trench thin-film portion 37 is different from that of the dummy conductive portion 34 in the trench thick-film portion 38. The dummy conductive portion 34 of the present example has a width in the Y-axis direction which is greater in the trench thin-film portion 37 than in the trench thick-film portion 38. In this manner, the dummy trench insulating film 32 of the trench thin-film portion 37 is thinner than the dummy trench insulating film 32 of the trench thick-film portion 38. The trench thick-film portion 38 is formed at a deeper position than the base region 14. Also, the lower end of the dummy conductive portion 34 is formed deeper than the lower end of the accumulation region 16-2. Thus, formation of a P-type inversion layer in the vicinity of the bottom portion of the dummy trench portion 30 is suppressed, and the effect of reducing the turn-on loss is high.

Figure 21C:
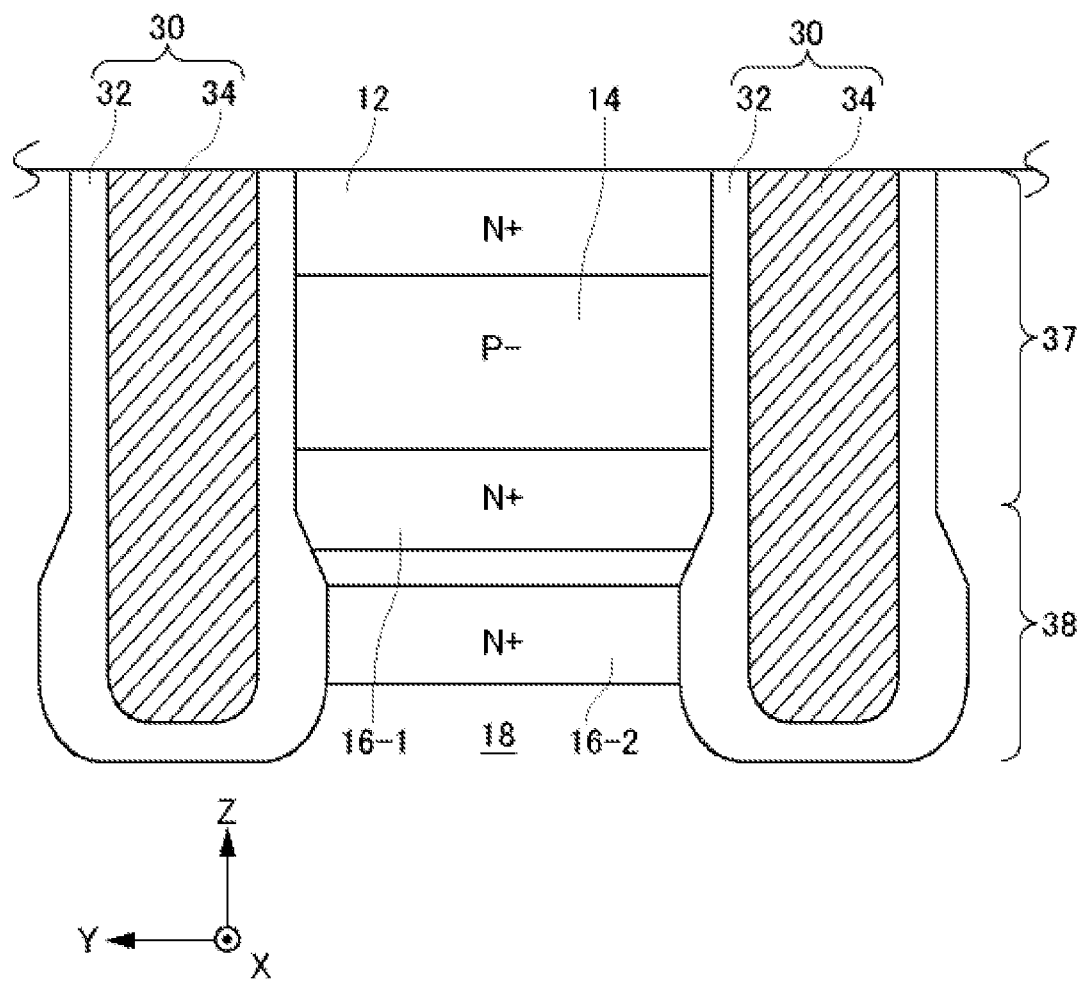
FIG. 21C shows another example of a trench portion.

FIG. 21C shows another example of a trench portion. In the present example, the width, in the Y-axis direction, of the dummy trench portion 30 in the trench thin-film portion 37 is different from that in the trench thick-film portion 38. The dummy conductive portion 34 is provided in both of the trench thin-film portion 37 and the trench thick-film portion 38.

The dummy trench portion 30 has a width in the Y-axis direction which is smaller in the trench thin-film portion 37 than in the trench thick-film portion 38. In contrast, the dummy conductive portion 34 has a width in the Y-axis direction which is uniform in both of the trench thin-film portion 37 and trench thick-film portion 38. That is, the dummy trench insulating film 32 of the trench thick-film portion 38 has a greater thickness than the dummy trench insulating film 32 of the trench thin-film portion 37. In this manner, formation of a P-type inversion layer in the vicinity of the bottom portion of the dummy trench portion 30 is suppressed, and the turn-on loss is reduced. Note that the trench thick-film portion 38 is formed at a deeper position than the base region 14.

Figure 21D:
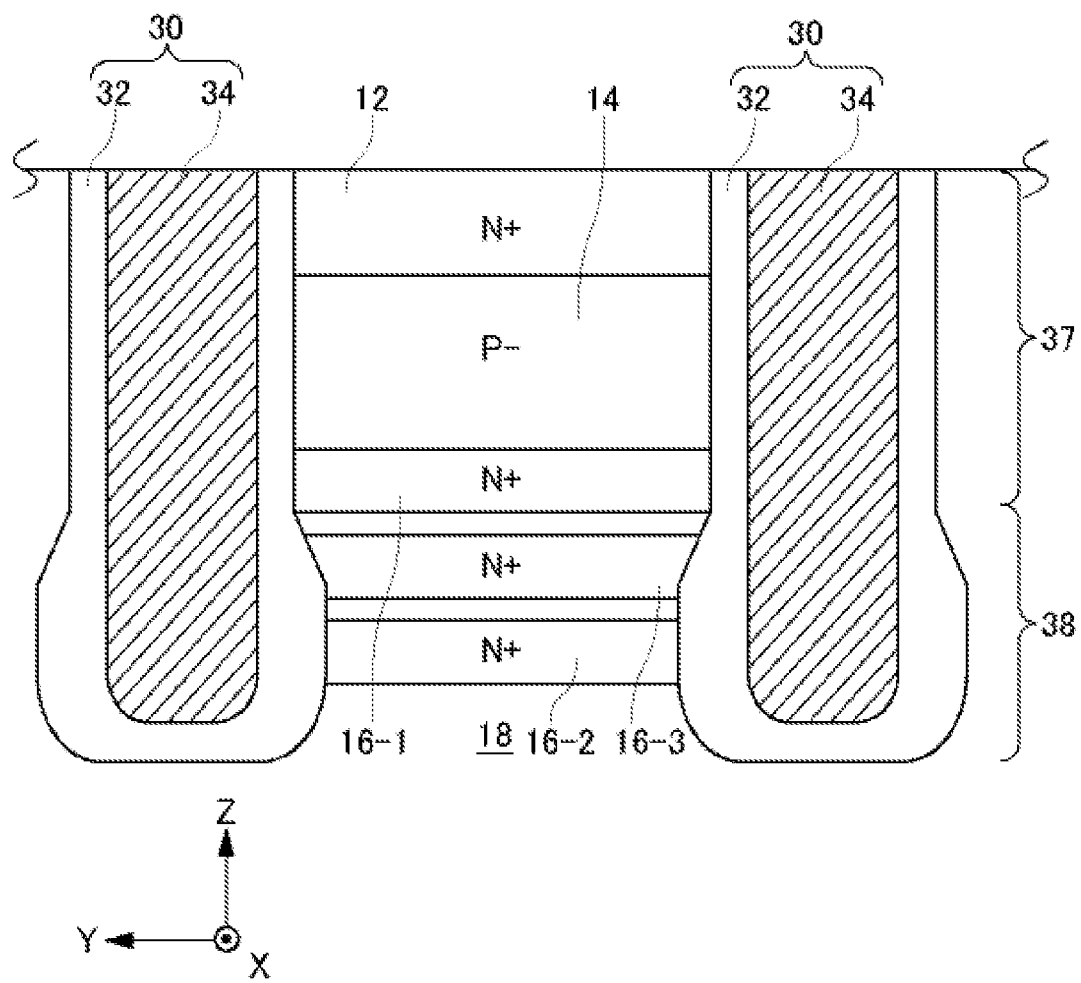
FIG. 21D shows another example of a trench portion.

FIG. 21D shows another example of a trench portion. The present example is different from the case of FIG. 21C in that a mesa portion 94 sandwiched between dummy trench portions 30 has three accumulation regions, that is, an accumulation region 16-1, an accumulation region 16-2 and an accumulation region 16-3. The accumulation region 16-3 is one example of a third accumulation region provided between the accumulation region 16-1 and the accumulation region 16-2.

Note that a dummy trench portion 30 is described in FIG. 21A to FIG. 21D. However, a gate trench portion 40 may have a similar structure to the dummy trench portion 30 disclosed in FIG. 21A to FIG. 21D.

Also, a mesa portion 94 sandwiched between adjacent dummy trench portions 30 is described in FIG. 21A to FIG. 21D. However, a mesa portion 94 sandwiched between a dummy trench portion 30 and a gate trench portion 40 may have a similar structure to the mesa portion 94 disclosed in FIG. 21A to FIG. 21D. The same applies to a mesa portion 94 sandwiched between adjacent gate trench portions 40.

Figure 22:
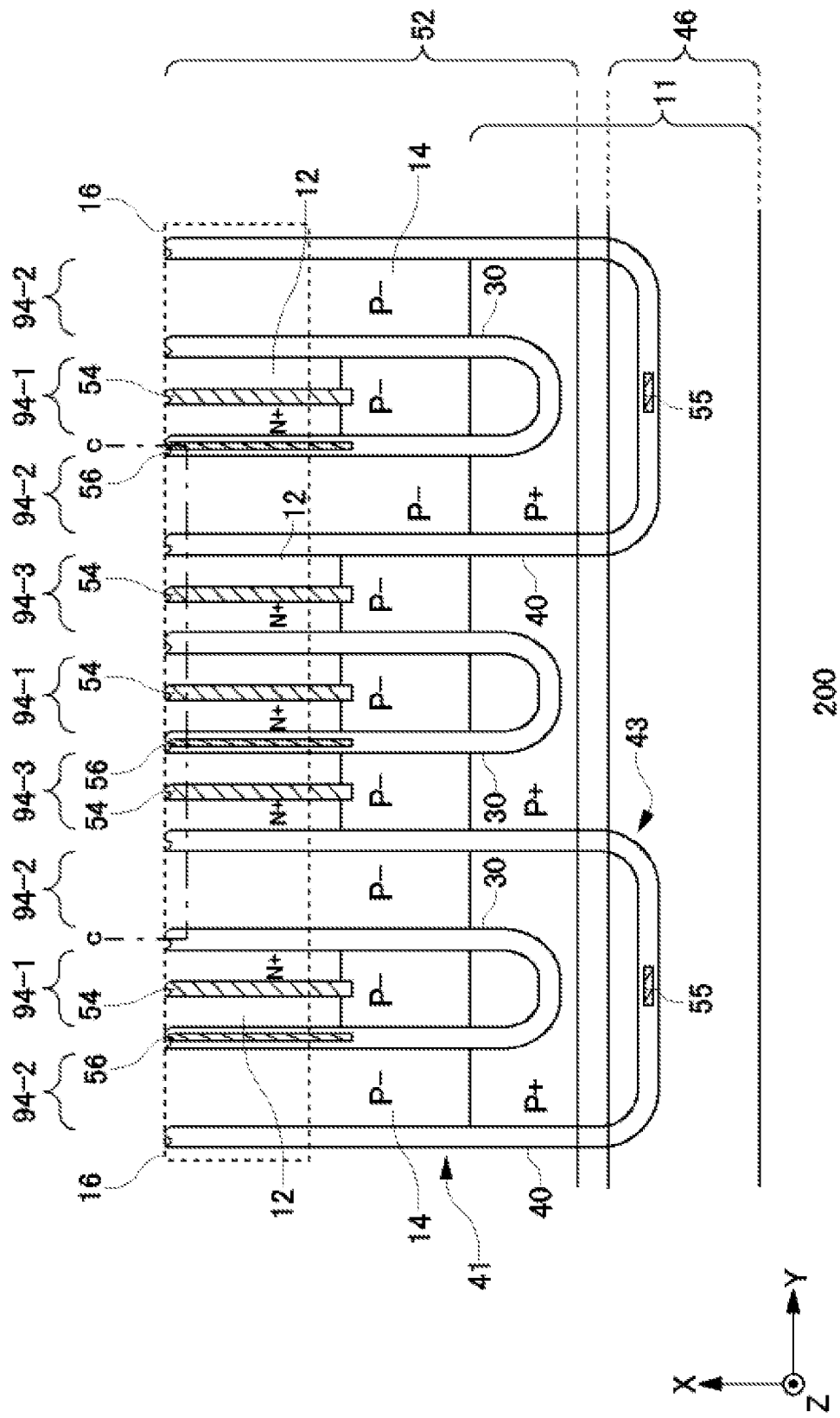
FIG. 22 is a top view showing one example of a semiconductor device 200 according to an embodiment of the present invention.

FIG. 22 is a top view showing one example of a semiconductor device 200 according to an embodiment of the present invention. The semiconductor device 200 may include gate trench portions 40 and dummy trench portions 30, positioned similarly to those in the semiconductor device 100.

In the semiconductor device 200, base regions 14 positioned in at least some mesa portions 94 of mesa portions 94 sandwiched between the gate trench portions 40 and the dummy trench portions 30 are not directly connected to an emitter electrode 52. In the example of FIG. 22, base regions 14 in some mesa portions 94-2 of the mesa portions 94 sandwiched between the gate trench portions 40 and the dummy trench portions 30 are not connected to the emitter electrode 52 at the upper surface of the semiconductor substrate 10. In the present example, in the mesa portions 94-2, contact holes 54 are not positioned in an interlayer insulating film 26 between the emitter electrode 52 and base regions 14. As one example, the mesa portions 94-2 are mesa portions 94 positioned on both sides, in the Y-axis direction, of any mesa portion 94-1 sandwiched between two dummy trench portions 30.

Emitter regions 12 may not be formed in the mesa portions 94-2. In the mesa portions 94-2 of the present example, the base regions 14 are provided in the entire regions at an inner side relative to a well region 11 in the upper surface of the semiconductor substrate 10.

Contact holes 54 are positioned in the mesa portions 94-1 and mesa portions 94-3. Structures of the mesa portions 94-1 and the mesa portions 94-3 in the upper surface of the semiconductor substrate 10 may be the same as or different from those in the semiconductor device 100 shown in FIG. 1 to FIG. 21D. In the present example, in the mesa portions 94-1 and the mesa portions 94-3, emitter regions 12 are positioned extending in the X-axis direction between the contact holes 54 and the trench portions in the upper surface of the semiconductor substrate 10. Contact regions 15 are positioned extending in the X-axis direction below the contact holes 54, but it is omitted in FIG. 22.

The base regions 14 positioned in some mesa portions 94-2 of the mesa portions 94 sandwiched between the gate trench portions 40 and the dummy trench portions 30 are not in direct contact with the emitter electrode 52, and thereby extraction of holes in the mesa portions 94-2 can be suppressed, facilitating the carrier accumulation. Therefore, the ON voltage of the semiconductor device 200 can be reduced.

Also, it is preferable that two or less dummy trench portions 30 are positioned between two gate trench portions 40. Note that one trench portion refers to each extending portion of each trench portion that extends linearly in the X-axis direction in the upper surface of the semiconductor substrate 10. In the example of FIG. 22, two dummy trench portions 30 are positioned between two gate trench portions 40.

In the present example, the gate trench portions 40 are directly connected to a gate metal layer 46 via contact holes 55. Also, the dummy trench portions 30 are directly connected to the emitter electrode 52 via contact holes 56. That is, the semiconductor device 200 of the present example does not include connecting portions 57 and a gate runner 45. Such a structure eliminates level differences due to the presence of the connecting portion 57 or the like, making it easy to miniaturize the semiconductor device 200.

Figure 23:
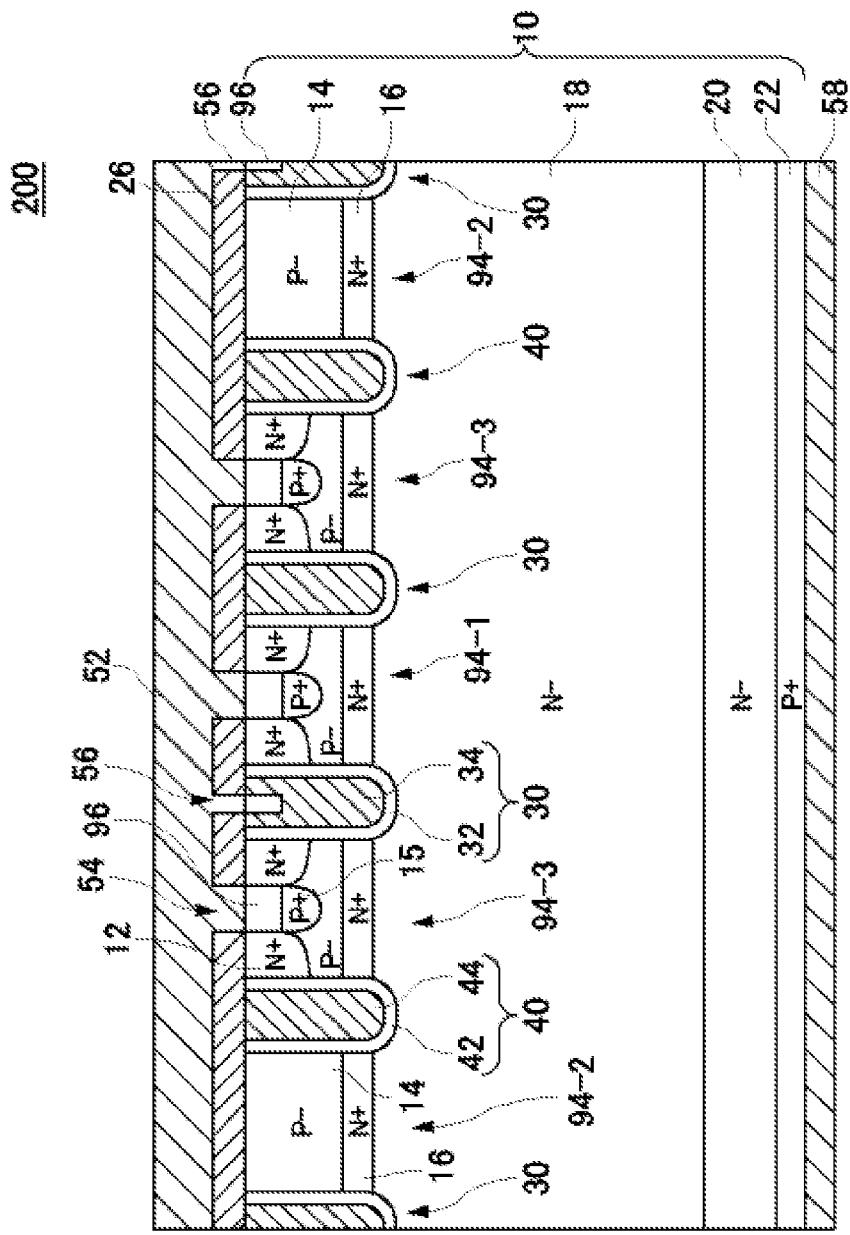
FIG. 23 shows one example of the cross section taken along c-c of the semiconductor device 200.
Figure 23:

FIG. 23 shows one example of the cross section taken along c-c of the semiconductor device 200. The dummy trench portions 30 and the gate trench portions 40 of the present example have similar structures to the gate trench portions 40 shown in FIG. 2. In another example, the dummy trench portions 30 may have the same structure as any of the dummy trench portions 30 shown in FIG. 1 to FIG. 21D. Also, each doping region in the mesa portions 94-1 and the mesa portions 94-3 may have a similar structure to each doping region in the mesa portions 94 shown in FIG. 1 to FIG. 20.

In the present example, each of the mesa portions 94-1 and the mesa portions 94-3 has a contact region 15 below a contact hole 54. Emitter regions 12 are provided on both sides of the contact region 15.

The contact region 15 and the emitter regions 12 are electrically connected to the emitter electrode 52. In the present example, each of the mesa portions 94-1 and the mesa portions 94-3 has a connecting portion 96 provided from the upper surface of the semiconductor substrate 10 to the inside thereof. The connecting portion 96 contacts each of the contact region 15, the emitter regions 12 and the emitter electrode 52. The connecting portion 96 has a lower electric resistance than the contact region 15. As one example, the connecting portion 96 is formed of metal such as tungsten. The connecting portion 96 contacts the emitter regions 12 at its side surfaces and contacts the contact region 15 at its bottom surface. Such a structure makes it easy to electrically connect the emitter electrode 52 to the contact region 15 and the emitter regions 12 even if the semiconductor device 200 is miniaturized.

Also, connecting portions 96 may be provided in dummy conductive portions 34 of the dummy trench portions 30. The connecting portions 96 are provided below the contact holes 56. The connecting portions 96 are connected to the emitter electrode 52 via the contact holes 56.

Figure 24:
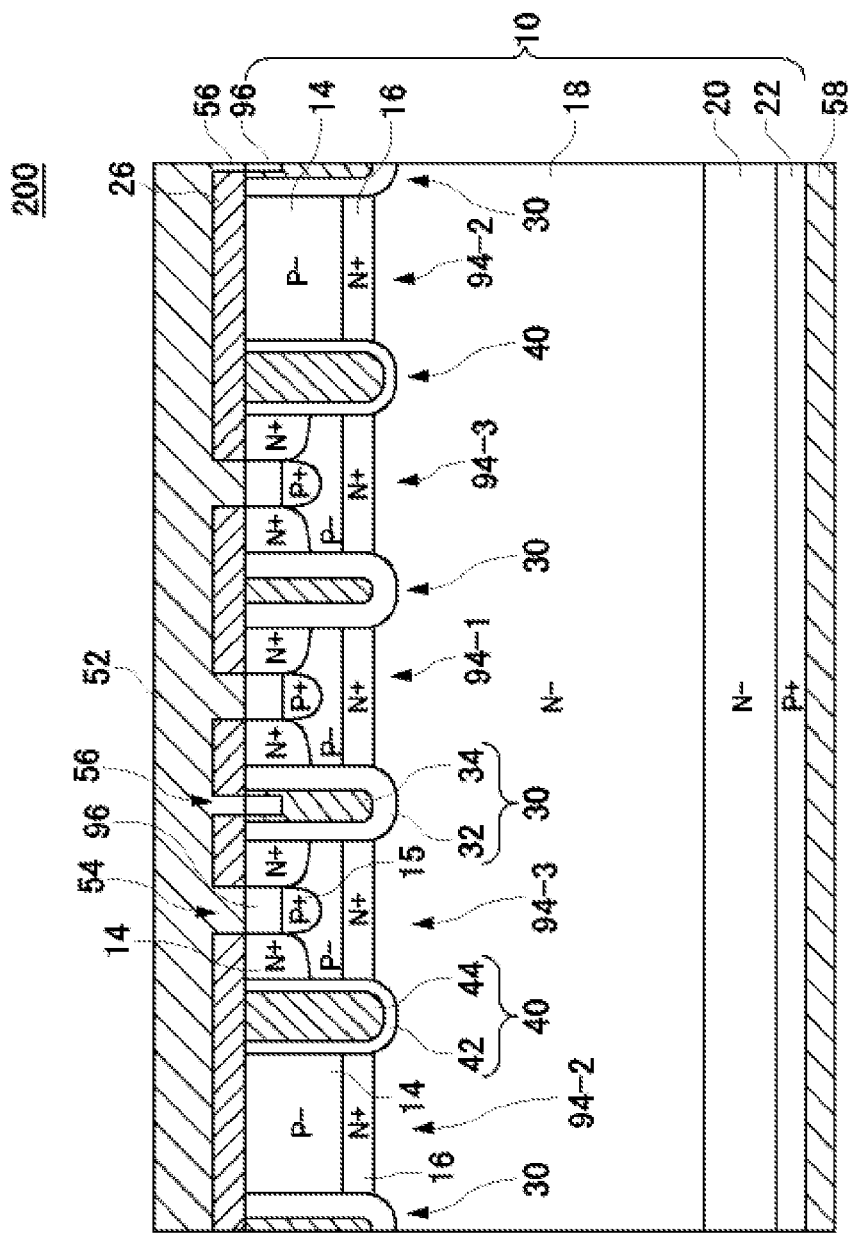
FIG. 24 shows another example of the cross section taken along c-c of the semiconductor device 200.

FIG. 24 shows another example of the cross section taken along c-c of the semiconductor device 200. In the present example, the dummy trench portions 30 have the same structures as the dummy trench portions 30 shown in FIG. 2. Other structures are the same as those in the semiconductor device 200 shown in FIG. 23.

The semiconductor device 200 may include the dummy trench portions 30 as shown in FIG. 1 to FIG. 21D. That is, the structure shown in FIG. 22 to FIG. 24 in which the base region 14 is not connected to the emitter electrode 52 in any of the mesa portions 94 may be applied to the semiconductor device 100 in each of FIG. 1 to FIG. 21D.

Figure 25:
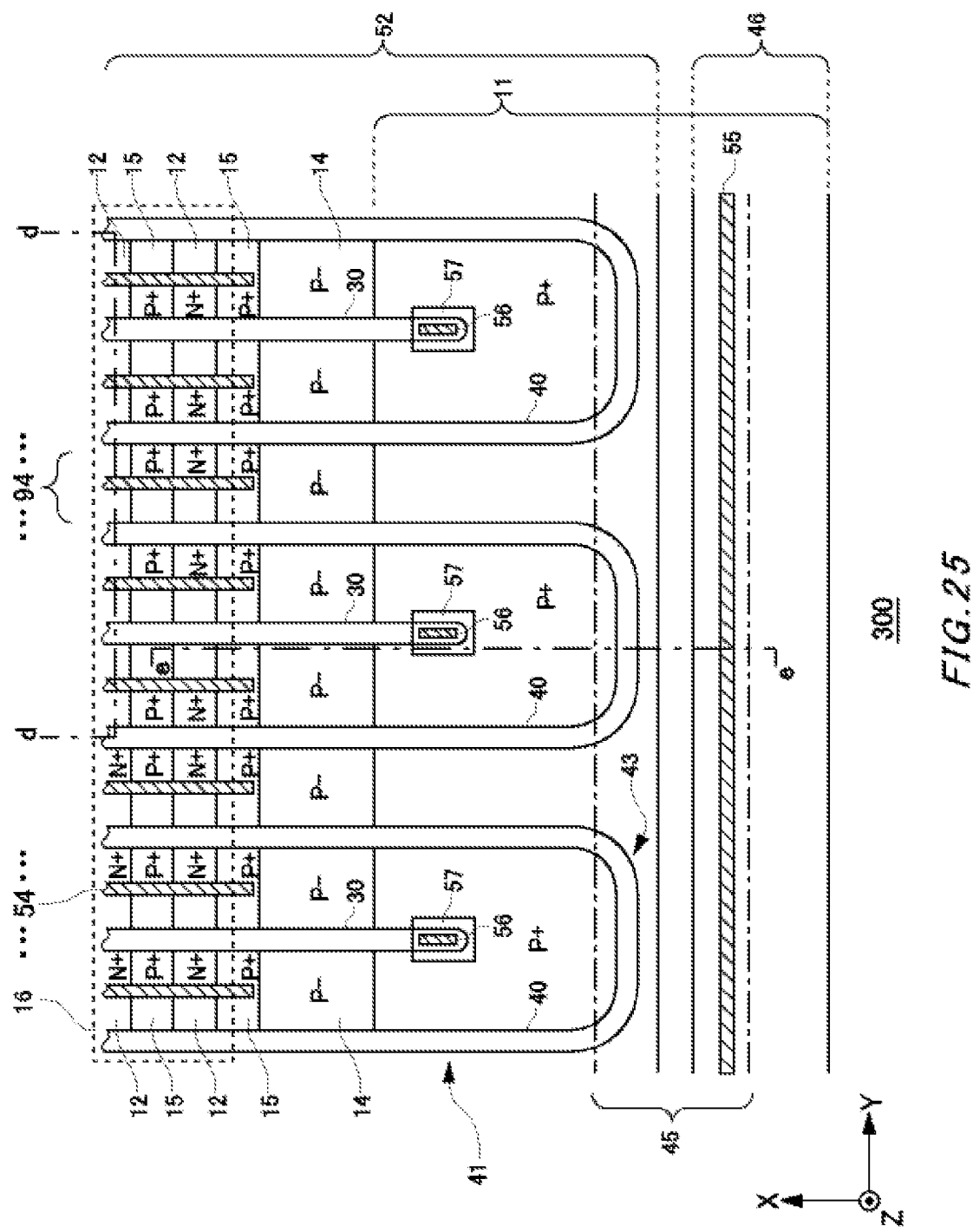
FIG. 25 is a top view showing one example of a semiconductor device 300 according to an embodiment of the present invention.

FIG. 25 is a top view showing one example of a semiconductor device 300 according to an embodiment of the present invention. The semiconductor device 300 of the present example is different from each of the semiconductor devices shown in FIG. 1 to FIG. 24 in the shape and arrangement of the dummy trench portions 30 in the upper surface of the semiconductor substrate 10. Other structures may be similar to those in any of the semiconductor devices shown in FIG. 1 to FIG. 24.

In the semiconductor device 300, one or less dummy trench portion 30 is positioned between gate trench portions 40. Each dummy trench portion 30 of the present example extends linearly in the X-axis direction in the upper surface of the semiconductor substrate 10. In the present example, for each gate trench portion 40, one linear dummy trench portion 30 is positioned between two extending portions 41 connected by an edge portion 43.

Each dummy trench portion 30 is sandwiched between gate trench portions 40, and thereby, when turning on, disappearance of the depletion layer in the vicinity of the dummy trench portions 30 can be facilitated. Therefore, efficient conductivity modulation can be achieved when turning on, reducing the turn-on loss.

Figure 26:
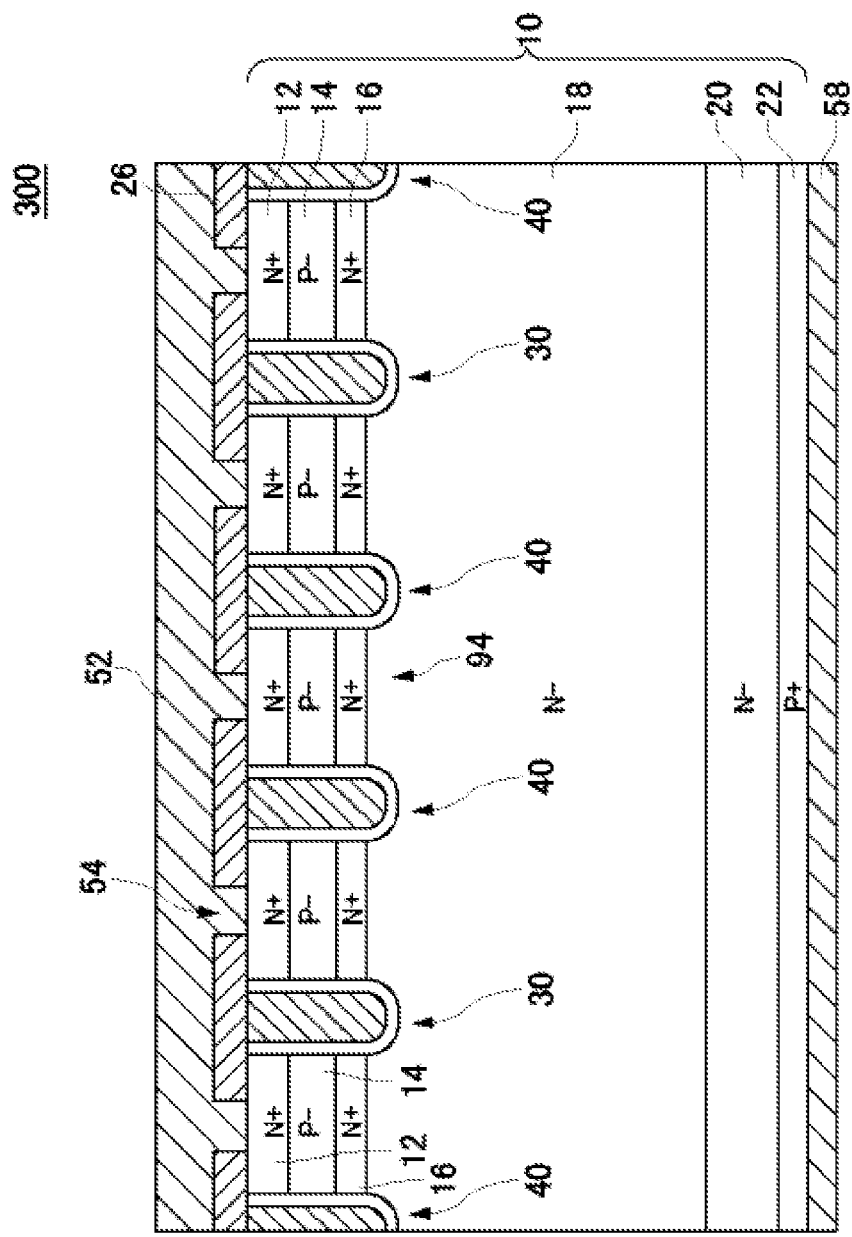
FIG. 26 shows one example of the cross section taken along d-d of the semiconductor device 300.

FIG. 26 shows one example of the cross section taken along d-d of the semiconductor device 300. The dummy trench portions 30 and the gate trench portions 40 of the present example have similar structures to the gate trench portions 40 shown in FIG. 2. In another example, the dummy trench portions 30 may have the same structure as any of the dummy trench portions 30 shown in FIG. 1 to FIG. 21D. Also, each doping region in the mesa portions 94 may have a similar structure to each doping region in the mesa portions 94 shown in FIG. 1 to FIG. 20.

Figure 27:
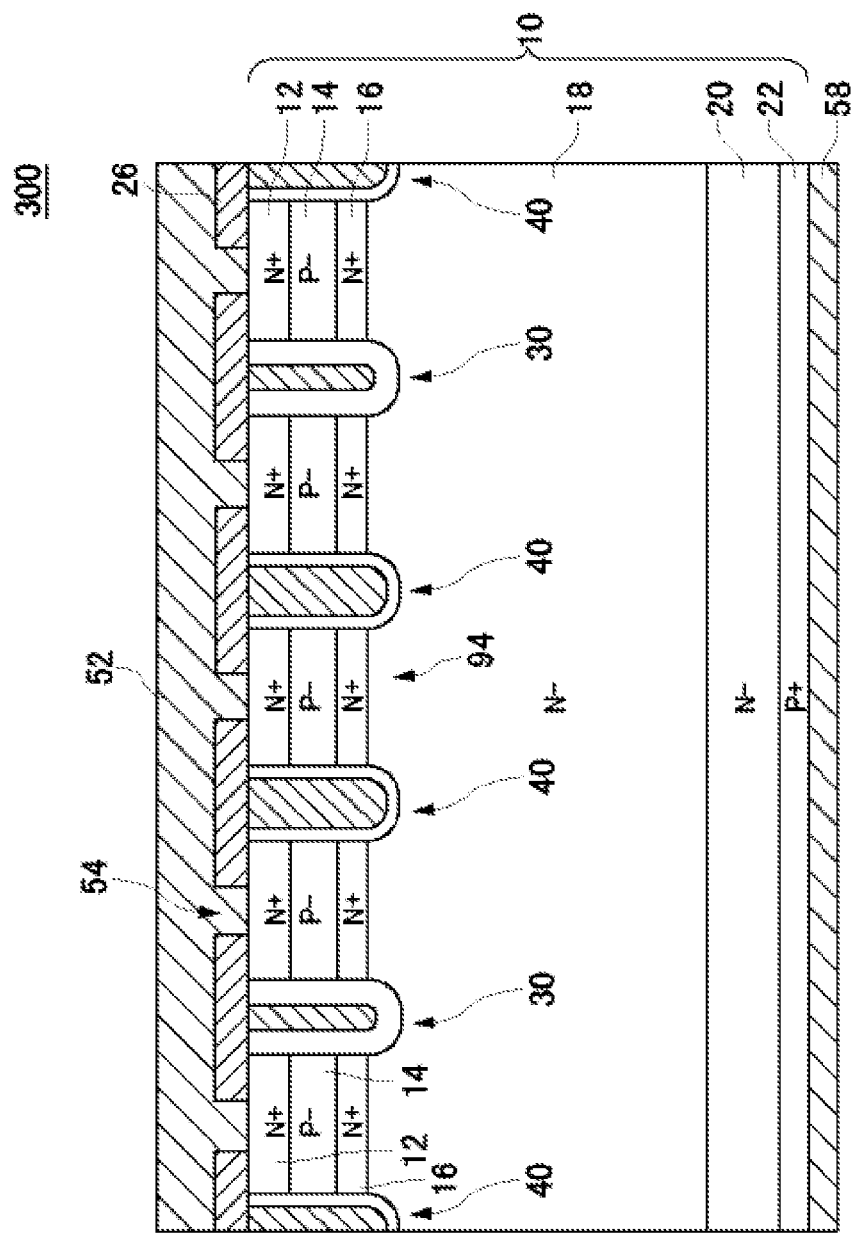
FIG. 27 shows another example of the cross section taken along d-d of the semiconductor device 300.

FIG. 27 shows another example of the cross section taken along d-d of the semiconductor device 300. In the present example, the dummy trench portions 30 have the same structures as the dummy trench portions 30 shown in FIG. 2. Other structures are the same as those in the semiconductor device 200 shown in FIG. 26. The structure shown in FIG. 25 to FIG. 27 in which one or less dummy trench portion 30 is provided between gate trench portions 40 may be applied to each of the semiconductor devices in FIG. 1 to FIG. 24.

Figure 28:
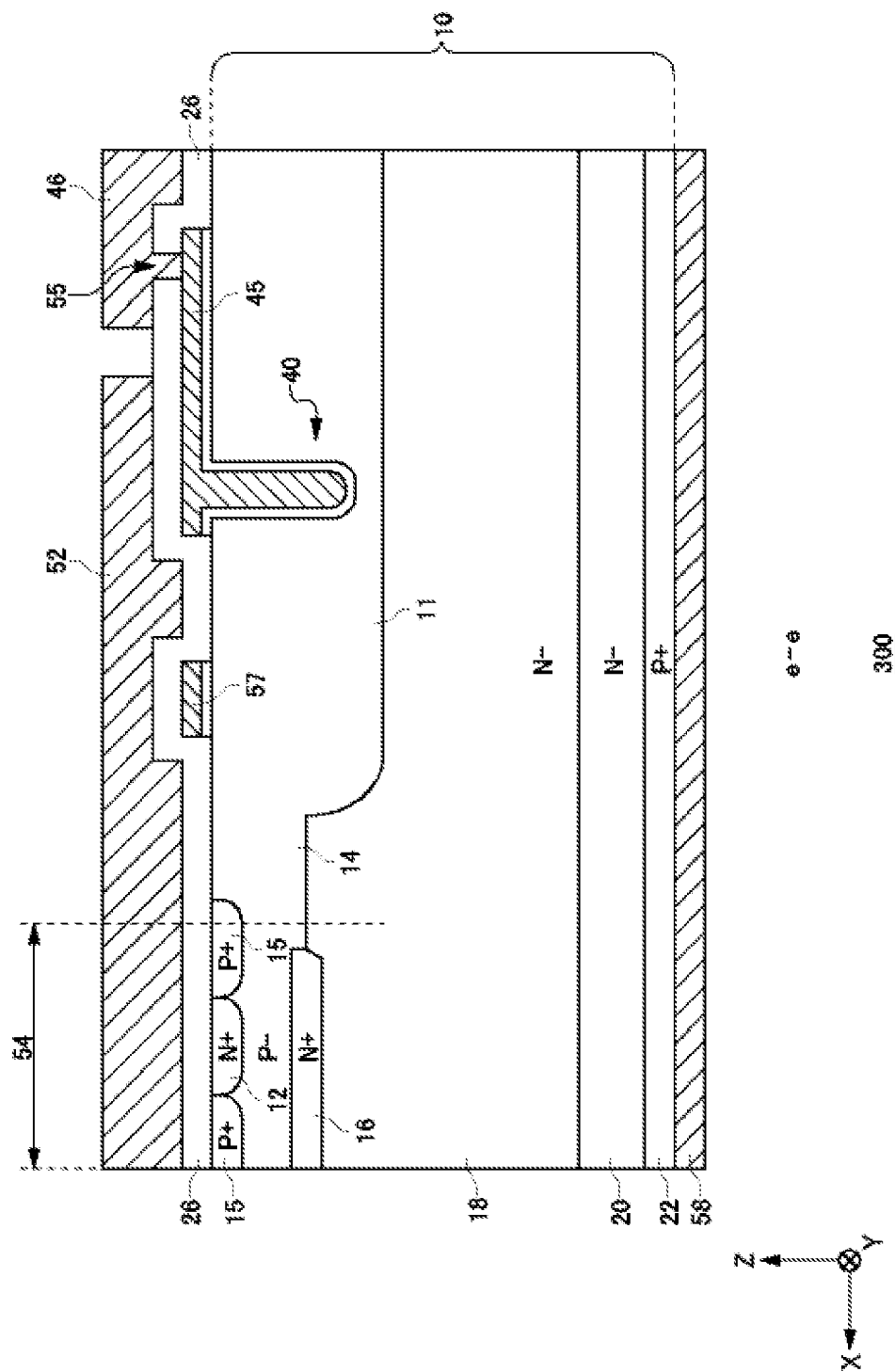
FIG. 28 shows one example of the cross section taken along e-e of the semiconductor device 300.

FIG. 28 shows one example of the cross section taken along e-e of the semiconductor device 300. The cross section taken along e-e is an X-Z plane that passes through the vicinity of a dummy trench portion 30. In a part of the upper surface of the semiconductor substrate 10 which is aligned in the X-axis direction with an area in which contact holes 54 are provided, contact regions 15 and emitter regions 12 are alternately positioned. In a part of the upper surface of the semiconductor substrate 10 which is aligned with an area in which the contact holes 54 are not provided, a base region 14 and a well region 11 are positioned.

A gate trench portion 40 is positioned to be surrounded by the well region 11. The gate trench portion 40 is connected to the gate metal layer 46 via the gate runner 45 positioned above the upper surface of the semiconductor substrate 10. An insulating film is formed between the gate runner 45 and the upper surface of the semiconductor substrate 10.

Figure 29:
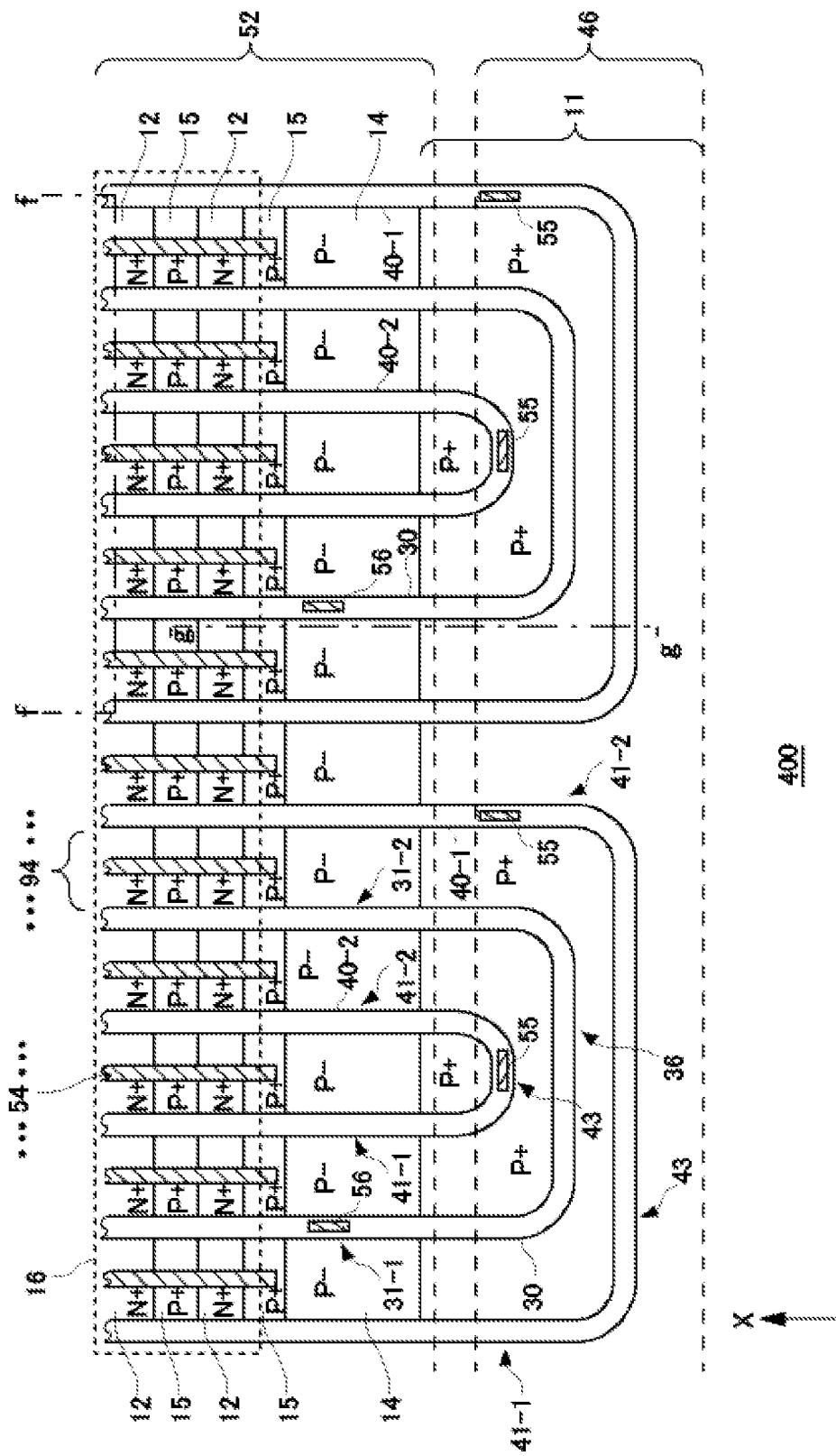
FIG. 29 is a top view showing one example of a semiconductor device 400 according to an embodiment of the present invention.

FIG. 29 is a top view showing one example of a semiconductor device 400 according to an embodiment of the present invention. The semiconductor device 400 of the present example is different from each of the semiconductor devices shown in FIG. 1 to FIG. 24 in the shape and arrangement of the dummy trench portions 30 and the gate trench portions 40 in the upper surface of the semiconductor substrate 10. Other structures may be similar to those of each of the semiconductor devices shown in FIG. 1 to FIG. 24.

The semiconductor device 400 includes a first gate trench portion 40-1, a second gate trench portion 40-2 and a dummy trench portion 30. The semiconductor device 400 may include a plurality of trench sets, each including the first gate trench portion 40-1, the second gate trench portion 40-2 and the dummy trench portion 30, along the Y-axis direction in the upper surface of the semiconductor substrate 10.

Each of the first gate trench portion 40-1 and the second gate trench portion 40-2 has an extending portion 41-1, an extending portion 41-2 and an edge portion 43. The extending portion 41-1 and the extending portion 41-2 are provided to extend in parallel with the X-axis direction in the upper surface of the semiconductor substrate 10. The edge portion 43 connects edges of the two extending portions 41.

The dummy trench portion 30 has an extending portion 31-1, an extending portion 31-2 and an edge portion 36. The extending portion 31-1 and the extending portion 31-2 are provided to extend in parallel with the X-axis direction in the upper surface of the semiconductor substrate 10. The edge portion 36 connects edges of the two extending portions 31.

The dummy trench portion 30 is positioned inside the first gate trench portion 40-1 in the upper surface of the semiconductor substrate 10. That is, the two extending portions 31 of the dummy trench portion 30 are positioned in a region sandwiched between the two extending portions 41 of the first gate trench portion 40-1 in the upper surface of the semiconductor substrate 10.

The second gate trench portion 40-2 is positioned inside the dummy trench portion 30 in the upper surface of the semiconductor substrate 10. That is, the two extending portions 41 of the second gate trench portion 40-2 are positioned in a region sandwiched between the two extending portions 31 of the dummy trench portion 30 in the upper surface of the semiconductor substrate 10. Also, the edge portion 36 of the dummy trench portion 30 is positioned between the edge portion 43 of the first gate trench portion 40-1 and the edge portion 43 of the second gate trench portion 40-2 in the upper surface of the semiconductor substrate 10.

Such a structure allows the X-axis direction edges of the extending portions (31, 41) to be connected at the edge portions (36, 43) while only one extending portion 31 of the dummy trench portion 30 is sandwiched between two extending portions 41 of the gate trench portions 40. Therefore, electric field concentration at the edge of each extending portion (31, 41) can be mitigated while facilitating the conductivity modulation.

Other structures than the gate trench portions 40 and the dummy trench portion 30 may be similar to those in the semiconductor device of any of the aspects shown in FIG. 1 to FIG. 28. The semiconductor device 400 of the present example does not include a connecting portion 57 and a gate runner 45, similarly to the semiconductor device 200 shown in FIG. 22.

Each of the first gate trench portion 40-1, the second gate trench portion 40-2 and the dummy trench portion 30 has a part overlapping with the gate metal layer 46 in the upper surface of the semiconductor substrate 10. For each of the first gate trench portion 40-1 and the second gate trench portion 40-2, a contact hole 55 is provided in a part overlapping with the gate metal layer 46.

Each of the first gate trench portion 40-1, the second gate trench portion 40-2 and the dummy trench portion 30 has a part overlapping with the emitter electrode 52 in the upper surface of the semiconductor substrate 10. For the dummy trench portion 30, a contact hole 56 is provided in a part overlapping with the emitter electrode 52.

Figure 30:
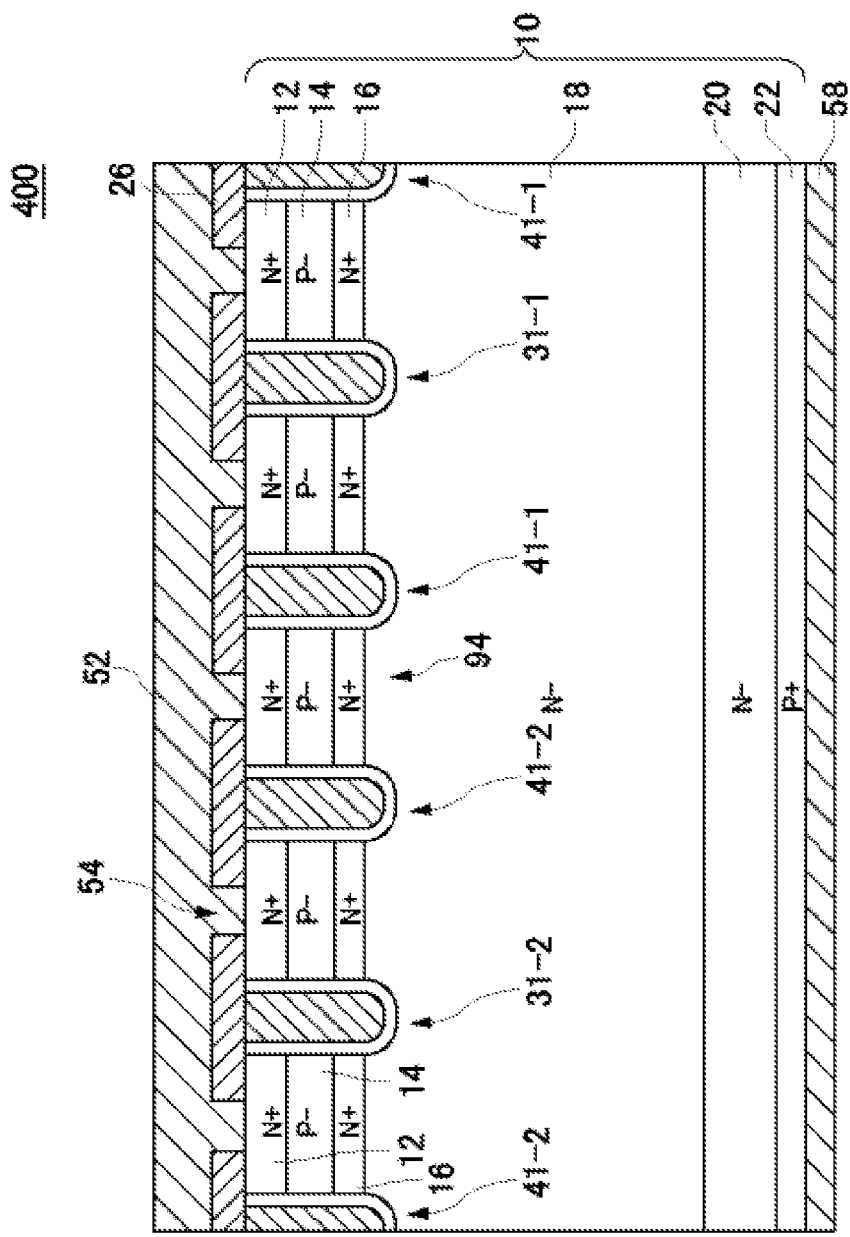
FIG. 30 shows one example of the cross section taken along f-f of the semiconductor device 400.

FIG. 30 shows one example of the cross section taken along f-f of the semiconductor device 400. The dummy trench portions 30 and the gate trench portions 40 of the present example have similar structures to the gate trench portions 40 shown in FIG. 2. In another example, the dummy trench portions 30 may have the same structure as any of the dummy trench portions 30 shown in FIG. 1 to FIG. 21D. Also, each doping region in the mesa portions 94 may have a similar structure to each doping region in the mesa portions 94 shown in FIG. 1 to FIG. 20.

Figure 31:
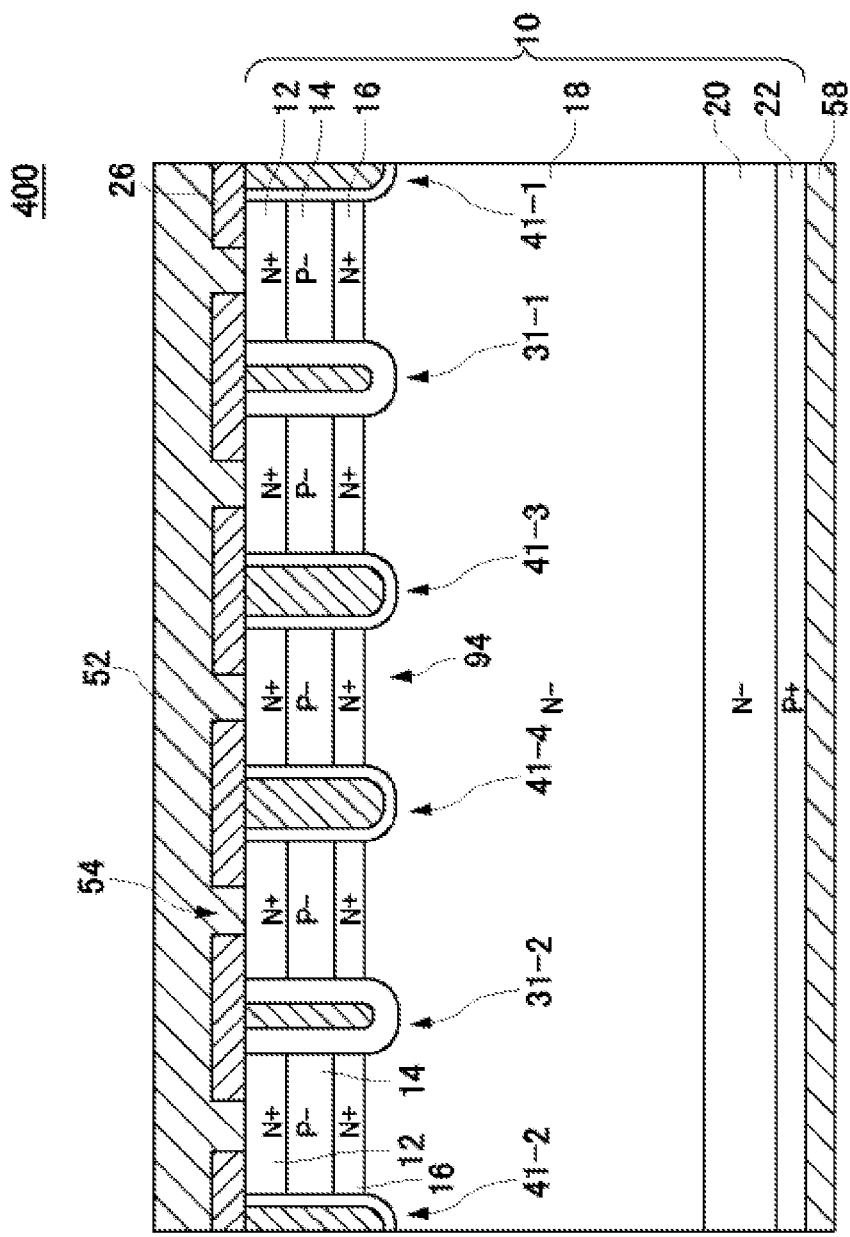
FIG. 31 shows another example of the cross section taken along f-f of the semiconductor device 400.

FIG. 31 shows another example of the cross section taken along f-f of the semiconductor device 400. In the present example, the dummy trench portions 30 have the same structures as the dummy trench portions 30 shown in FIG. 2. Other structures are the same as those in the semiconductor device 400 shown in FIG. 30. The shapes and arrangements of the dummy trench portions 30 and the gate trench portions 40 shown in FIG. 29 may be applied to each of the semiconductor devices in FIG. 1 to FIG. 24.

Figure 32:
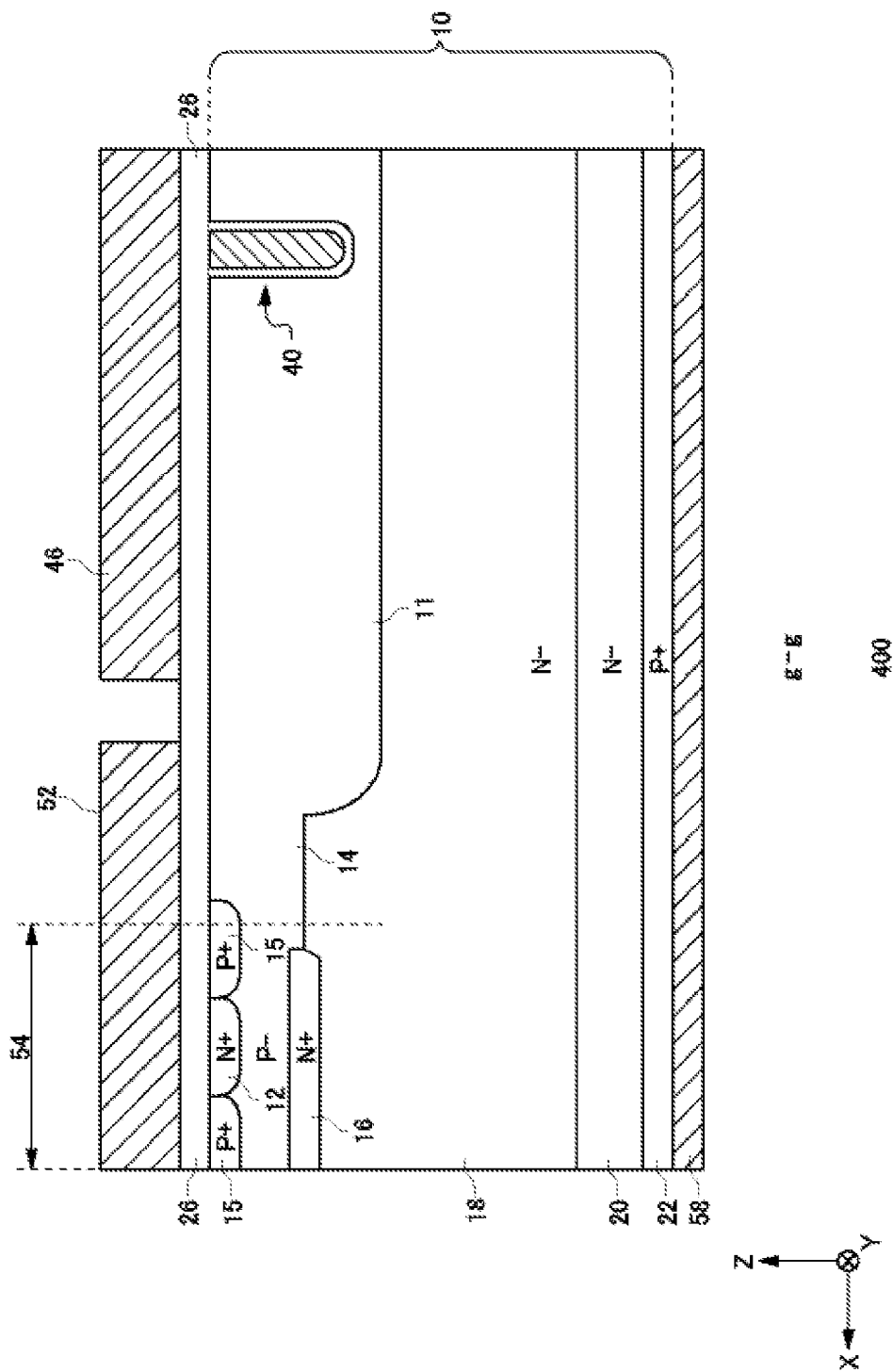
FIG. 32 shows one example of the cross section taken along g-g of the semiconductor device 400.

FIG. 32 shows one example of the cross section taken along g-g of the semiconductor device 400. In the semiconductor device 400, each trench portion is directly connected to each electrode. Therefore, the semiconductor device 400 does not include a connecting portion 57 and a gate runner 45.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
a semiconductor substrate;
a first conductivity-type drift region formed in the semiconductor substrate;
a second conductivity-type base region formed between an upper surface of the semiconductor substrate and the drift region in the semiconductor substrate; and
a dummy trench portion formed to penetrate the base region from the upper surface of the semiconductor substrate in the semiconductor substrate;
wherein the dummy trench portion includes a dummy conductive portion and an insulating film between an inner wall of the dummy trench portion and the dummy conductive portion, the insulating film including:
a trench thin-film portion of a predetermined film thickness, and
a trench thick-film portion of a greater thickness than the predetermined film thickness.

2. The semiconductor device according to claim 1, wherein the dummy conductive portion has a uniform width in an array direction of the dummy trench portion, in both of the trench thin-film portion and the trench thick-film portion.

3. The semiconductor device according to claim 1, further comprising
a first conductivity-type accumulation region formed between the drift region and the base region in the semiconductor substrate and in a mesa portion sandwiched between two dummy trench portions and having a higher doping concentration than the drift region.

4. The semiconductor device according to claim 3, wherein
the accumulation region comprises:
a first accumulation region provided below the base region; and
a second accumulation region provided between the first accumulation region and the drift region, and
a third accumulation region provided between the first accumulation region and the second accumulation region.

5. A semiconductor device comprising:
a semiconductor substrate;
a first conductivity-type drift region formed in the semiconductor substrate;
a second conductivity-type base region formed between an upper surface of the semiconductor substrate and the drift region in the semiconductor substrate; and
a dummy trench portion formed to penetrate the base region from the upper surface of the semiconductor substrate in the semiconductor substrate;
a second conductivity-type contact region having a higher doping concentration than the base region and formed below a contact hole in a mesa portion sandwiched between two dummy trench portions or between the dummy trench portion and a gate trench portion; and
first conductivity-type emitter regions provided on both sides of the contact region.

6. The semiconductor device according to claim 5, wherein
the dummy trench portion comprises
a trench film portion having, inside an inner wall of a trench, an insulating film having a predetermined film thickness and a dummy conductive portion covered by the insulating film, and
the semiconductor device comprises a connecting portion provided in the dummy conductive portion of the dummy trench portion, and below the contact hole, and being connected to an emitter electrode.

7. The semiconductor device according to claim 5, further comprising
a first conductivity-type accumulation region formed between the drift region and the base region in the semiconductor substrate and having a higher doping concentration than the drift region, wherein
at least one of the accumulation region and the dummy trench portion has a suppressing structure that suppresses formation of a second conductivity-type inversion layer in a first conductivity-type region adjacent to the dummy trench portion.

8. The semiconductor device according to claim 7, wherein
the gate trench portion is formed to penetrate the base region and the accumulation region from the upper surface of the semiconductor substrate to the drift region in the semiconductor substrate, wherein
the gate trench portion comprises:
a gate insulating film formed on an inner wall of a trench; and
a gate conductive portion covered by the gate insulating film, and
the dummy trench portion comprises;
a dummy trench insulating film formed on the inner wall of a trench and having a greater thickness than the gate insulating film; and
a dummy conductive portion covered by the dummy trench insulating film.

9. The semiconductor device according to claim 8, wherein a film thickness of the dummy trench insulating film is two or more times greater than a film thickness of the gate insulating film.

10. The semiconductor device according to claim 8, wherein the dummy trench insulating film of the dummy trench portion has a uniform film thickness.

11. The semiconductor device according to claim 10, wherein the dummy conductive portion of the dummy trench portion has a uniform thickness.

12. The semiconductor device according to claim 8, wherein the gate insulating film of the gate trench portion has a uniform film thickness.

13. The semiconductor device according to claim 12, wherein the gate conductive portion of the gate trench portion has a uniform thickness.

14. The semiconductor device according to claim 5, further comprising
a first conductivity-type accumulation region having a higher doping concentration than the drift region and formed between the drift region and the base region and in the mesa portion sandwiched between two dummy trench portions or between the dummy trench portion and the gate trench portion.

* * * * *